(12) United States Patent  
Sugimoto et al.

(10) Patent No.: US 7,796,663 B2
(45) Date of Patent: Sep. 14, 2010

(54) SEMICONDUCTOR LASER DEVICE

(75) Inventors: Yasunobu Sugimoto, Anan (JP);
Masanao Ochiai, Anan (JP); Akinori Yoneda, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 11/494,447

(22) Filed: Jul. 28, 2006

(65) Prior Publication Data

US 2006/0262823 A1 Nov. 23, 2006

Related U.S. Application Data

(62) Division of application No. 10/479,231, filed on Dec. 1, 2003, now Pat. No. 7,103,082.

(51) Int. Cl.
*H01S 5/00* (2006.01)
(52) U.S. Cl. ............... 372/49.01; 372/45.01; 372/50.1
(58) Field of Classification Search .............. 372/43.01, 372/46.013, 50.1
See application file for complete search history.

(56) References Cited

U.S. PATENT DOCUMENTS

| 4,321,300 | A | | 3/1982 | Farrauto et al. | |
|---|---|---|---|---|---|
| 4,840,922 | A | | 6/1989 | Kobayashi et al. | |
| 5,171,706 | A | * | 12/1992 | Matsumoto et al. | 438/29 |
| 5,621,746 | A | | 4/1997 | Futatsugi et al. | |
| 5,883,462 | A | * | 3/1999 | Ushifusa et al. | 313/292 |
| 6,200,826 | B1 | | 3/2001 | Kim | |
| 2001/0017870 | A1 | * | 8/2001 | Hayakawa | 372/40 |
| 2001/0019568 | A1 | * | 9/2001 | Sakata | 372/50 |
| 2001/0021213 | A1 | * | 9/2001 | Lee et al. | 372/46 |
| 2002/0051615 | A1 | * | 5/2002 | Walpole et al. | 385/131 |
| 2002/0061046 | A1 | * | 5/2002 | Takiguchi et al. | 372/96 |
| 2002/0064201 | A1 | * | 5/2002 | Matsumoto | 372/50 |
| 2003/0210720 | A1 | * | 11/2003 | Reid | 372/46 |
| 2004/0101986 | A1 | | 5/2004 | Kozaki et al. | |
| 2004/0159836 | A1 | | 8/2004 | Sugimoto et al. | |

(Continued)

FOREIGN PATENT DOCUMENTS

DE 1298216 B 6/1969

(Continued)

OTHER PUBLICATIONS

Stryckman, D. et al. (1996). "Improvement of the Lateral-mode Discrimination of Broad-area Diode Lasers with a Profiled Reflectivity Output Facet," *Applied Optics, OSA*, pp. 5955-5959.

*Primary Examiner*—Minsun Harvey
*Assistant Examiner*—Delma R Forde
(74) *Attorney, Agent, or Firm*—Morrison & Foerster LLP

(57) ABSTRACT

To provide a semiconductor laser device which has no ripple and can afford better FFP having a pattern near a Gaussian distribution upon operation at the high output, the semiconductor laser comprising a laminate structure in which a first conductive type semiconductor layer, an active layer and a second conductive type semiconductor layer different from the first conductive type are laminated in this order, the laminate structure having a waveguide region to guide a light and resonator planes for laser oscillation on both ends, characterized in that the laminate structure has a non-resonator plane on one end side and the non-resonator plane is covered with a shading layer.

9 Claims, 12 Drawing Sheets

U.S. PATENT DOCUMENTS

| | | |
|---|---|---|
| 2005/0042788 A1 | 2/2005 | Ueda |
| 2005/0190416 A1 | 9/2005 | Yoneda |

FOREIGN PATENT DOCUMENTS

| | | | |
|---|---|---|---|
| EP | 0744799 A2 | | 11/1996 |
| EP | 0762566 A | | 3/1997 |
| EP | 1052747 | | 11/2000 |
| JP | 54-014183 | | 2/1979 |
| JP | 64-000785 | | 1/1989 |
| JP | 64-025494 | * | 1/1989 |
| JP | 02-199889 | | 8/1990 |
| JP | 10-335705 | | 12/1998 |
| JP | 2000-004063 A | | 1/2000 |
| JP | 2000-323781 | | 11/2000 |
| JP | 2001-068784 | | 3/2001 |
| JP | 2001-189519 | | 7/2001 |
| JP | 2001-250251 | | 9/2001 |

* cited by examiner

SEMICONDUCTOR LASER DEVICE

CROSS-REFERENCE TO RELATED APPLICATION

This application is a divisional of U.S. application Ser. No. 10/479,231 filed Dec. 1, 2003, which is a national stage of PCT/JP02/05326 filed May 31, 2002, the contents of which are incorporated herein by reference.

TECHNICAL FIELD

The present invention relates to a semiconductor laser device having the better far field pattern (FFP), more particularly, it relates to a semiconductor laser device using a III-V Group nitride semiconductor comprising GaN, AlN or InN, or a mixed crystal thereof ($In_xAl_yGa_{1-x-y}N$, $0 \leq x$, $0 \leq y$, $x+y \leq 1$).

BACKGROUND ART

Recently, a semiconductor laser device has progressed in miniaturization, lightening, high reliance and high output and, thus, is utilized as a light source for personal computers, electronic equipment such as DVD, processing equipment and optical fiber communication. Inter alia, a nitride semiconductor ($In_xAl_yGa_{1-x-y}N$, $0 \leq x$, $0 \leq y$, $x+y \leq 1$) attracts attention as a semiconductor laser device which can emit from a relatively short wavelength ultraviolet region to a red color.

In such the semiconductor laser device, a buffer layer, an n-type contact layer, a crack-preventing layer, an n-type cladding layer, an n-type light-guiding layer, an active layer, p-type cap layer, a p-type light-guiding layer, a p-type cladding layer and a p-type contact layer are formed in this order on a sapphire substrate. In addition, a stripe-like emitting layer is formed by etching or the like and, then, a p-side electrode and an n-side electrode are formed. Further, after a light emitting plane is formed at a prescribed resonator length, a mirror plane on a light reflecting side is formed, whereby, the oscillated light can be effectively taken out through the mirror plane.

However, in such the structure, there is a problem that irregularity (ripple) is generated in far field pattern (FFP), leading to a non-Gaussian distribution. In a semiconductor laser device in which FFP has a non-Gaussian distribution, there is also a problem that calculation of a shape of FFP makes a great error, and connection to an optical system can not be realized effectively and, for this reason, a driving current becomes great.

In addition, in the previous semiconductor laser device, there is a problem that an emitting end is easily deteriorated.

Then, the first object of the present invention is to provide a semiconductor laser device which has no ripple and can afford better FFP having a pattern near a Gaussian distribution upon operation at the high output.

In addition, the second object of the present invention is to provide a semiconductor laser device which can prevent an end from deteriorating and afford better FFP even when operated at the high output.

DISCLOSURE OF THE INVENTION

In order to solve the aforementioned problems, the first semiconductor laser device of the present invention includes a laminate structure in which a first conductive type semiconductor layer, an active layer and a second conductive type semiconductor layer different from the first conductive type are laminated in this order. The laminate structure has a waveguide region to guide a light in one direction and resonator planes for laser oscillation on both ends. The first semiconductor laser device is characterized in that said laminate structure has a non-resonator plane which is different from the resonator plane on one end side. The non-resonator plain is formed so as to contain a cross-section of the active layer and the cross-section of said active layer of the non-resonator plane is covered with a shading layer.

By adopting such a structure, release of the light exuded from a waveguide region (stray light) from the non-resonator plane to the outside is blocked to prevent from being overlapped with a main beam emitted from a resonator plane (that is, only a main beam can be emitted, and a ripple is prevented from generating) and, thus, excellent FFP can be obtained.

In addition, it is preferable that the resonator plane is projected more than the non-resonator plane in the first semiconductor laser device of the present invention, whereby, stray light can be effectively prevented from releasing to the outside. In addition, by doing so, the light emitted from the resonator plane is not blocked by the non-resonator plane.

Further, in the first semiconductor laser device of the present invention, by adopting a resonator plane formed, in the vicinity of which a non-resonator plane is formed, as an emitting plane for the laser light, more excellent FFP can be obtained.

In addition, the second semiconductor laser device of the present invention includes a laminate structure in which a first conductive type semiconductor layer, an active layer and a second conductive type semiconductor layer different from the first conductive type are laminated in this order. The laminate structure has a waveguide region to guide a light in one direction and resonator planes for laser oscillation on both ends. In the second semiconductor laser device, a side of the laminate structure has a first side containing a cross-section of the active layer, and a second side which is situated nearer the waveguide region than the first side and contains a cross-section of the active layer, and a shading layer is provided on the cross-section of the active layer of the second side.

The thus structured second semiconductor laser device of the present invention can block stray light released from a side of an active layer to the outside at a position nearer a waveguide region.

In addition, in the second semiconductor laser device of the present invention, by provision of such the second side of the vicinity of a light emitting plane, stray light can be effectively blocked and, thus, excellent FFP can be obtained.

In addition, the third semiconductor laser device of the present invention includes a laminate structure in which a first conductive type semiconductor layer, an active layer and a second conductive type semiconductor layer different from the first conductive type are laminated in this order. The laminate structure has a waveguide region to guide a light in one direction and resonator planes for laser oscillation on both ends. The third semiconductor laser device characterized in followings.

(1) The laminate structure has a non-resonator plane which is different from said resonator plane and the non-resonator plain is formed so as to contain a cross-section of said active layer.

(2) The side of the laminate structure has a first side containing a cross-section of the active layer and a second side which is situated nearer the waveguide region than the first side and near the emitting plane, and which contains a cross-section of an active layer.

(3) The shading layer is provided on the cross-section of the active layer of at least one of the non-resonator plane and the second side.

Herein, the shading layer may be provided on a non-resonator plane or a second side, or on both of them. Thereby, stray light from an end side and stray light from a side can be blocked.

In addition, a structure in which this non-resonator plane and a second side are directly connected is preferable. Further, it is preferable that a shading layer is provided on both of the non-resonator plane and the second side directly connected.

In addition, in the first to third semiconductor laser devices of the present invention, a stripe-like waveguide region can be formed by forming a stripe-like convex part. Thereby, a refractive index type waveguide region can be structured, leading to a semiconductor laser device having the excellent device properties.

In addition, a shading layer of the present semiconductor laser device may be formed in contact with a laminate structure. Thereby, release of stray light exuded from a waveguide region to the outside can be effectively blocked.

In addition, a shading layer of the present semiconductor laser device may be formed on an insulating layer provided on a laminate structure. Thereby, a shading layer may be structured by using a material which is easily diffused into a device upon heat treatment.

In addition, as a shading layer of the present semiconductor laser device, a layer comprising any of a conductor, a semiconductor and an insulator may be used. Thereby, the shading layer may be applied to laminate structures made of various materials.

In addition, in a shading layer of the present semiconductor laser device, a dielectric multi-layered membrane may be used. Thereby, stray light can be effectively blocked.

In addition, the present semiconductor laser device can be structured by using a nitride semiconductor in a first conductive type semiconductor layer, an active layer, and a second conductive type semiconductor layer. With this structure, a semiconductor laser device can be obtained which is excellent in the durability and the safety and has a wide range of wavelength from an ultraviolet region to a visible region.

In addition, the present semiconductor laser device is characterized in that a first conductive type semiconductor layer has an n-type nitride semiconductor and the second conductive type semiconductor layer has a p-type nitride semiconductor.

In addition, in the present semiconductor laser device, it is preferable that a shading layer is at least Ti and the insulating layer is $SiO_2$. Thereby, a layer through which the light is difficult to transmit and which reflects less light can be easily formed.

In addition, in the present semiconductor laser device, it is preferable that a shading layer has at least an Rh oxide. Thereby, a shading layer through which the light is difficult to transmit and which is stable can be formed.

In addition, in the present semiconductor laser device, a shading layer may be a multi-layered membrane composed of layers which comprise the same material and have a different constitutional ratio. Thereby, layers of the same material but having the different membranous property can be formed.

The fourth semiconductor laser device of the present invention includes a laminate structure in which a first conductive type semiconductor layer, an active layer and a second conductive type semiconductor layer different from the first conductive type are laminated in this order. The laminate structure has a waveguide region to guide a light in one direction. The fourth semiconductor laser device is characterized in that the laminate structure has a shading membrane provided in the vicinity of an emitting part of one end and at least one layer of a light transmittable membrane comprising the same elements as those constituting the shading membrane and having the higher transmittance than that of a shading membrane And the light transmittable membrane is provided between the shading membrane and the laminate structure.

In the thus structured fourth semiconductor laser device of the present invention, a shading membrane which can control transmittance of the light can be provided tightly in the vicinity of a resonator plane.

In the fourth semiconductor laser device of the present invention, it is preferable that a shading membrane and a light transmittable membrane contain at least an Rh oxide.

The fifth semiconductor laser device of the present invention includes a laminate structure in which a first conductive type semiconductor layer, an active layer and a second conductive type semiconductor layer different from the first conductive type are laminated in this order. The laminate structure has a waveguide region to guide a light in one direction. The fifth semiconductor laser device is characterized in that said laminate structure has a protective membrane on at least one end face which has a first protective membrane and a second protective membrane having the lower light transmittance than that of the first protective membrane.

By adopting such the structure, since the light emitted from an end can be controlled by a protective membranes having a difference in the transmittance, a main beam can be prevented from being mixed with the light other than a main beam and thus, better FFP can be obtained.

That is, in the fifth semiconductor laser device of the present invention, release of the light controlled by provision on an end of two protective membranes which are different at least in the light transmittance, it enables the laser light to be easily released from the resonator plane and it enables stray light to be released from the vicinity of a resonator plane with difficulty and, therefore, a semiconductor laser device can be obtained which has better FFP of the high output having no ripple and having a distribution near a Gaussian distribution.

In addition, in the fifth semiconductor laser device of the present invention, it is preferable that the first protective membrane is provided on an emitting part of a resonator plane on an emitting side, and the second protective membrane is provided in the vicinity of the emitting part. Whereby, since the laser light (main beam) can be emitted effectively from the emitting part and, at the same time, the light can be prevented form being released from the vicinity of the emitting part, better FFP is obtained. In addition, protection of an emitting part of a resonator plane with the first protective membrane can prevent COD from occurring.

In addition, in the fifth semiconductor laser device of the present invention, both of the first protective membrane and the second protective membrane are formed on the same end. Thereby, it becomes possible to control the light in a transverse direction relative to a main beam.

In addition, in the fifth semiconductor laser device of the present invention, an emitting plane may be formed so as to be projected. By doing so, release of the light from the vicinity of an emitting part (plane) can be prevented, it becomes possible for the light from the vicinity of the emitting part (plane) to be mixed with the laser light released from an emitting part with difficulty and, thus, better FFP can be easily obtained. In addition, projection of a resonator plane can alter the diverging properties of the laser light.

In addition, in fifth semiconductor laser device of the present invention, the first protective membrane can be structured by a single-layered or a multi-layered membrane of at least one selected from compounds such as oxides, nitrides and fluorides of Si, Mg, Al, Hf, Nb, Zr, Sc, Ta, Ga, Zn, Y, B and Ti. By using these materials, a protective membrane having the high transmittance can be obtained.

In addition, in the fifth semiconductor laser device of the present invention, the first protective membrane is a reflection reducing coating (AR membrane (Anti-Reflection Coat)). Thereby, reflection of the light can be suppressed, and the laser light can be effectively emitted.

In addition, in the fifth semiconductor laser device of the present invention, the first protective membrane having a refractive index which is within ±10% of that of a laminate structure is preferable. Thereby, a device can be protected without altering the properties of the light from an active layer.

In addition, in the fifth semiconductor laser device of the present invention, it is preferable that the second protective membrane is a shading membrane. This allows the light not to be released to the outside from a part on which the second protective membrane is provided.

In addition, in the fifth semiconductor laser device of the present invention, it is particularly preferable that the first protective membrane is $Nb_2O_5$ and the second protective membrane is a shading membrane.

In addition, in the fifth semiconductor laser device of the present invention, a nitride semiconductor is used in a first conductive type semiconductor layer, an active layer, and a second conductive type semiconductor layer. In particular, it is preferable that a first conductive type semiconductor layer has an n-type nitride semiconductor, and a second conductive type semiconductor layer has a p-type nitride semiconductor. Thereby, a semiconductor laser device can be obtained which has a wide emitting wavelength from the visible light to the ultraviolet light.

BEST MODE FOR CARRYING OUT THE INVENTION

The present invention will be explained below by using drawings, but the present semiconductor laser device is not limited to the device structure and the electrode structure shown in embodiments described later.

Embodiment 1

Figure 1:
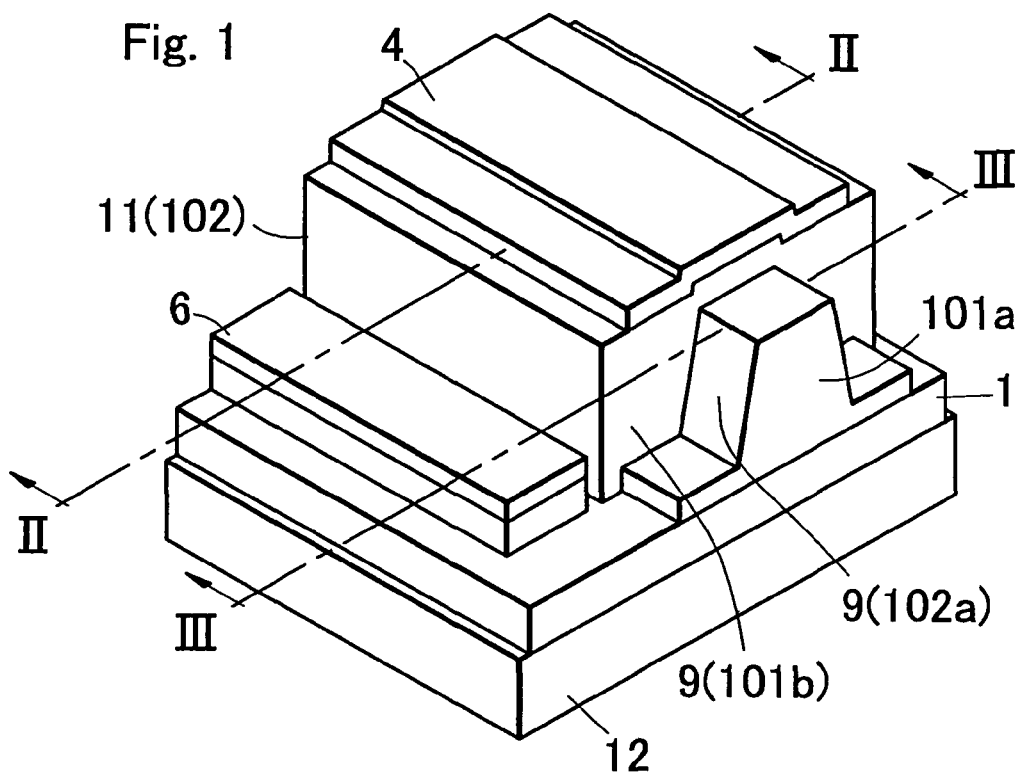
FIG. 1 is a perspective view of an external shape of a semiconductor laser device of an embodiment 1 of the present invention.
Figure 2:
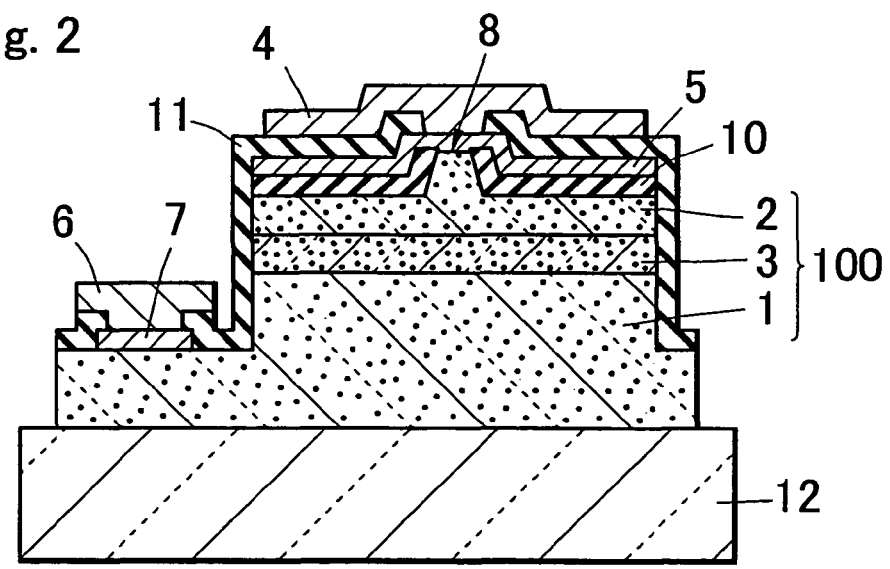
FIG. 2 is a cross-sectional view along the II-II line in FIG. 1.
Figure 3:
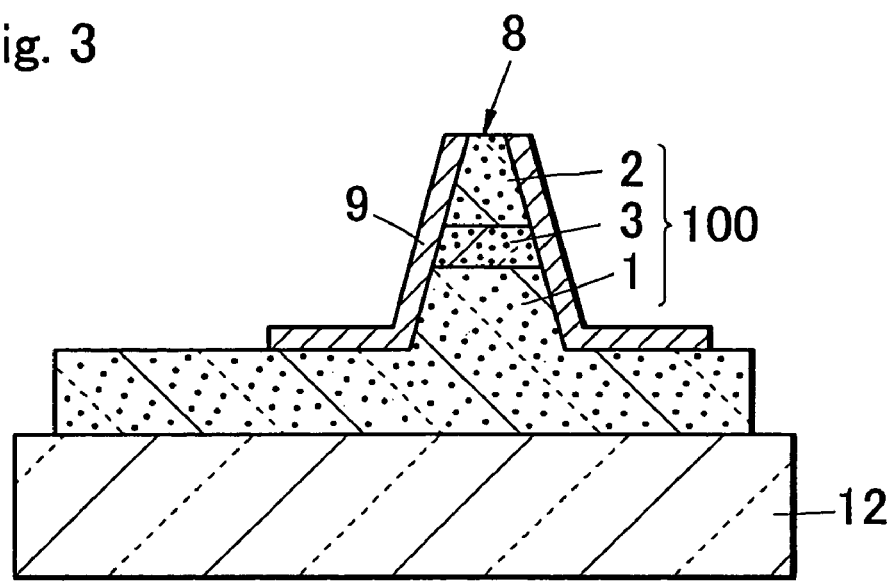
FIG. 3 is a cross-sectional view along the III-III line in FIG. 1.

FIG. 1 is a perspective view of an external shape of a laser device of an embodiment 1 of the present invention, FIG. 2 is a cross-sectional view along the II-II line in FIG. 1, and FIG. 3 is a cross-sectional view along the III-III line in FIG. 1.

The semiconductor laser device of the present embodiment 1 can afford excellent FFP by blocking the light released from parts other than a resonator plane with a shading layer 9. In a specific configuration, a stripe-like convex part (ridge) 8 is provided in a laminate structure 100 in which a first electrically conductive semiconductor layer 1, an active layer 3, a second conductive type semiconductor layer 2 different from the first conductive type are laminated (FIG. 2), and a stripe-like waveguide region is structured in the vicinity of an active layer beneath this stripe-like ridge 8. And by both ends vertical to a longitudinal direction of this ridge 8 as a resonator plane, a light resonator is formed in which a longitudinal direction of a stripe is a resonating direction (light directing direction). Of two resonator planes, one is a light emitting side resonator plane (light emitting plane) having the function of mainly emitting the light to the outside, and the other is a light reflecting side resonator plane (monitor plane) having the function of mainly reflecting the light toward the inside of a waveguide region. In addition, on a side of a stripe-like convex part 8 and on the surface (upper plane) of a laminate structure directly connected to this side, a first insulating membrane 10 is formed, a stripe-like ohmic electrode 5 is provided which is ohmic-contacted with a second conductive type semiconductor layer 2 on an upper plane of a convex part 8 of a second electrically conductive semiconductor layer on which this first insulating membrane 10 is not formed. In addition, on a first conductive type semiconductor layer 1 exposed along a laminate structure 100, an ohmic electrode 7 is formed in a stripe manner which is ohmic-contacted with a first conductive type semiconductor layer 1. Both ohmic electrodes are provided generally parallel. In the laser device of the present embodiment 1, further, a second insulating membrane 11 having an opening on each of these electrodes is formed so as to cover the whole device, and pad electrodes (n-side pad electrode 6, p-side pad electrode 4) are formed, respectively, so as to contact with an ohmic electrode via this second insulating membrane 11.

Figure 4:
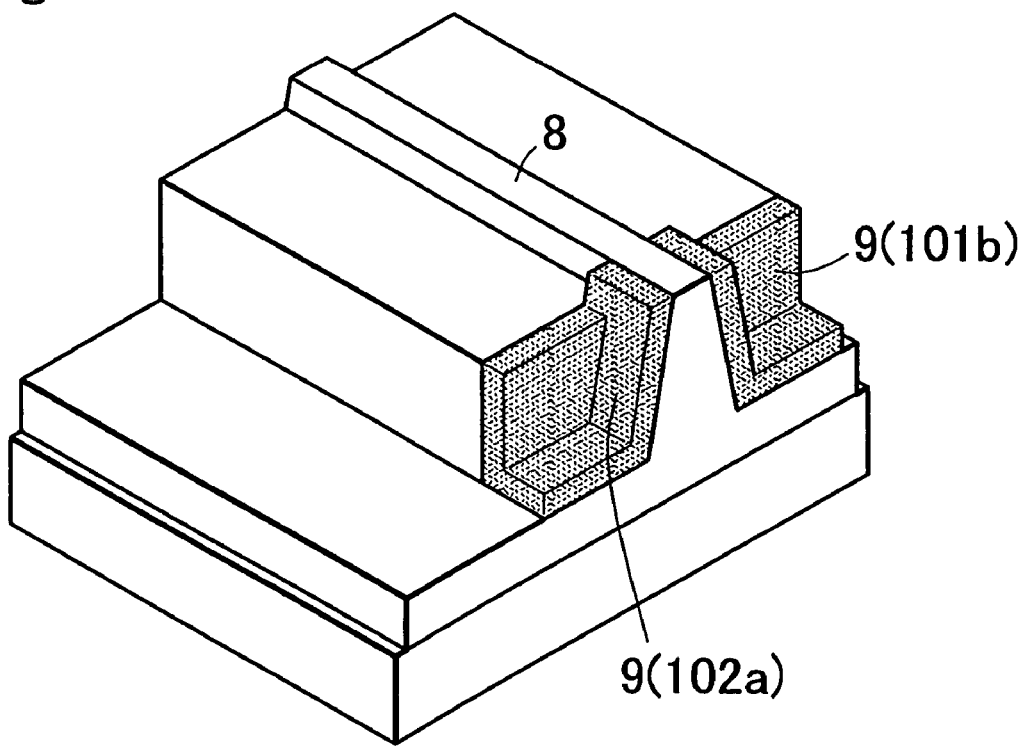
FIG. 4 is a perspective view a shape of a shading layer in a semiconductor laser device of an embodiment 1.

Herein, in the semiconductor laser device of the present embodiment 1, as shown in FIG. 1 and FIG. 3, in the vicinity of a light emitting side resonator plane, semiconductor layers on both sides of a ridge are removed to below an active layer 3 and, thus, the device has, so to speak, a shape in which a corner part of a laminate structure 100 is removed. Thereby, on a light emitting side, a resonator plane 101a having a narrower width than that of a laminate structure 100 is formed, and the light is emitted from the resonator plane 101a. In addition, on both sides of a resonator plane 101a on an emitting end side, a corner part of a laminate structure 100 is removed, whereby, a non-resonator plane 101b is formed which is situated on a different plane from that of a resonator plane 101a and is orthogonal with a resonating direction. Since a plane 101b formed by removing a corner part of a laminate structure 100 reflects a part of the directed light but the reflected light is less than the light reflected by a resonator plane 101a and, thus, it does not substantially contribute to resonation of the light, the plane 101b is called a non-resonator plane herein. Like this, in the present embodiment 1, one of ends in a direction vertical to a light directing direction in a stripe-like waveguide region in a laminate structure is not a single plane but is formed so as to have a resonator plane 101a which is a light emitting plane, and a non-resonator plane 101b containing a cross-section of (stepwise) active layer which is situated rear a resonator plane. In addition, regarding a plane (side) parallel with a light directing direction in a laminate structure 100, on a light emitting side of the present laser device, a second side 102a formed at a position nearer a central part of a waveguide region than a first side 102 which is a main side of a laminate structure is formed. And, in the laser device of an embodiment 1, on the thus formed non-resonator plane 101b and second side 102a, a shading layer 9 is provided as shown in FIG. 3 and FIG. 4. FIG. 4 is a view, in which an insulating membrane and an electrode are omitted, for showing clearly into what shape a shading layer is formed, in the semiconductor of an embodiment 1 shown in FIGS. 1 to 3. In addition, a non-resonator plane 101b and a second side 102a are also called a shading layer forming plane. In FIGS. 1 and 4, symbols for the aforementioned respective planes are shown in parenthesis because those planes do not appear on the surface.

In the laser device of an embodiment 1 structured as described above, the light generated in an active layer (light emitting region) is directed mainly in a waveguide region and emitted through a resonator 101a to become a main beam (laser light). In the previous laser device, a part of the light is exuded from a waveguide region to become stray light which is transmitted in the device, and released from parts other than an emitting part of a resonator plane to the outside, which is mixed with a main beam released from a resonator plane to generate a ripple, deteriorating FFP. However, in the laser device of the present invention, since a shading layer 9 is formed, this stray light can be blocked so as not to be released from parts other than a resonator plane 101a to the outside. It is suitable that a shading layer 9 provided as a layer for blocking stray light has the function of blocking the light by reflecting and absorbing the light. When a shading layer 9 is formed by using a material which reflects the light, stray light can be reflected toward the inside of a device to improve the light output efficacy. In addition, when a shading layer 9 is formed by using a material which absorbs stray light, stray light can be prevented from being released to the outside.

Generally, the light released from parts other than a resonator plane to the outside is most frequently through an end in the vicinity of a resonator plane and, in a resonator end on a light emitting side, since the above light is released in the same direction as an emitting direction for the laser light which is a main beam, those lights are easily mixed. For this reason, as in the present embodiment 1, by provision of a shading layer 9 which blocks the light in the vicinity of a resonator plane, stray light can be effectively prevented from being released to the outside. In the present embodiment 1, in particular, by forming a non-resonator plane 101b on a plane different from a resonator plane 101a and providing a shading layer 9 on this plane, stray light is effectively prevented from being released to the outside and a ripple is prevented from generating in the laser light. Regarding a shading layer 9, a non-resonator plane may not be provided separately from a resonator plane as in the present embodiment 1, but a shading layer may be formed so as to limit an emitting part in a resonator plane comprising one plane as usual. However, in such the structure, since a main beam is blocked when a thickness of a light non-absorbable layer becomes large, it is necessary to select a material through which the light can not be transmitted even thin. However, as in the present embodiment 1, by forming a resonator plane 101a so as to be projected from a non-resonator plane 101b and providing a shading layer 103 on the non-resonator plane 101b, the shading layer may be formed thick without blocking a main beam. Further, since this leads to provision of the shading layer 103 in front of a light emitting plane (resonator plane) 101a, stray light can be more effectively blocked.

In addition, although stray light exuded from a waveguide region is released not only from the aforementioned plane (end) in a direction vertical to a light directing direction but also from a plane (side) parallel with a directing direction, by providing a shading layer 9 also on a second side 102a as shown in FIGS. 3 and 4, release of stray light can be prevented. When an insulating membrane, an electrode and the like are provided on a side of a device, depending on materials for the insulating layer and electrode, they themselves can be functioned as a shading layer. However, in the vicinity of a position where a wafer is divided into devices, an insulating membrane and an electrode are not provided for making division easy and a semiconductor layer is exposed in many cases. In such the case, as in the present invention, by provision of a second side 102a at a position near a waveguide region to provide a shading layer 9, release of stray light to the outside can be prevented and, thus, the laser light having better FFP without ripple can be obtained.

As described above, the reason why stray light is generated is that a width of a laminate structure is large relative to a width of a waveguide region directing the light. That is, the reason is that a layer through which the light can be transmitted like an active layer is present in a part other than a waveguide region (outside a waveguide region). By excluding a part situated outside which does not constitute this waveguide region, stray light can be excluded. By etching a laminate structure to a width equivalent to that of a waveguide region, a region through which stray light is directed can be excluded. However, since when a width of the whole laminate structure 100 (width of an active layer) is made narrow, variation of that width becomes to greatly influence on the properties of a device, it is necessary to control a width with the better accuracy. However, as described later, in order to make a waveguide region suitable for laser oscillation, a width of a stripe is estimated to be around 5 μm at best, it is not easy to form a width of all active layers by such the narrow width with the better accuracy control. In addition, even when formed with the better accuracy, a width is too small, the durability is lacked, difficulty is arisen upon formation of an electrode, being not practicable. In the present invention, taking these into consideration, a laminate having a larger width than that of a waveguide region is formed to provide a stable stripe-like waveguide region (part held by a first side) and a waveguide region (part held by a second side), a width of which is limited to such an extent that no adverse effect is exerted on the device properties, in the laminate structure. And, a shading layer is provided on a shading layer forming plane which is formed in order to structure the waveguide region with a limited width.

In the present embodiment 1, a thickness of a shading layer 9 is preferably 1500 Å to 3000 Å, more preferably 1500 Å to 5000 Å. When the thickness is smaller than 1500 Å, the light becomes difficult to be transmitted, being not preferable. On the other hand, when the thickness is large, it is preferable that a shading layer 9 is provided so as to bury the removed part to the surface. By providing the shading layer thick, even when a width of an active layer becomes narrow, breakage does not easily occur.

In addition, as a material used in a shading layer 9, any of a conductor, a semiconductor and an insulator can be used. However, when a conductor is used, although the conductor may be provided so as to contact directly with a laminate structure, in order to prevent short circuit and in order not to block the flow of current in a device structure, it is necessary to provide the conductor so as not to contact directly with an electrode by interposing an insulating membrane. When an insulating membrane is formed in advance, the same material as that for an electrode can be used and furthermore, the effect of shading the light is enhanced. In addition, when a semiconductor is used, it is preferable to use a semiconductor having a narrower band gap than that of an active layer. When the band gap is wider than that of an active layer, the light absorbing effect is obtained with difficulty, being not preferable. When a semiconductor is used, after all necessary layers are laminated, a shading layer may be formed by forming a shading layer forming plane by etching and performing lamination so as to bury the plane. Alternatively, after lamination is performed at least to a layer over an active layer, a reaction is stopped temporarily and parts other than an active layer constituting a waveguide region are removed to provide a difference in level and, thereafter, a reaction may be initiated again to perform lamination.

When an insulator is used, since it may contact with an electrode, it is easily handled, but the light shading effect is relatively inferior as compared with a conductor. Like this, in the present invention, since a shading layer can be formed by using various materials, the most preferable material can be selected from these materials depending on a structure of a device, a step of manufacturing a device, a method for manufacturing a device and the like.

In addition, as a shading layer 9, a dielectric multi-layered membrane may be used. Thereby, the function of protecting an exposed end, in particular an active layer can be exerted in addition to the effect of light shading.

As a specific material used in a shading layer 9, any material selected from a simple substance of Ni, Cr, Ti, Cu, Fe, Zr, Hf, Nb, W, Rh, Ru, Mg, Al, Sc, Y, Mo, Ta, Co, Pd, Ag, Au, Pt and Ga, an alloy of them, a multi-layered membrane of them, and compounds such as oxides, nitrides and the like of them can be used as a conductor material. These may be used alone or in combination of a plurality of them. A preferable material is material using Ni, Cr, Ti, Cu, Fe, Zr, Hf, Nb, W, Rh, Ru, Mg and Ga, and more preferable materials are materials using Ni, Cr, Ti, Ga, Rh and RhO. In addition, as a semiconductor material, Si, InGaN, GaAs and InP can be used. As an insulator material, $TiO_2$ and $CrO_2$ can be used. In order to form a material at a desired position, various methods such as vapor deposition, sputtering and the like can be used.

Among the aforementioned materials, in particular, Rh oxides such as RhO preferable material. By using this RhO as a shading layer, the light can be effectively shaded. Furthermore, because of a thermally stable layer, a shading layer can be obtained which is hardly deteriorated in a step or upon use. In particular, by forming at a position relatively far from a waveguide region, excellent FFP can be obtained without reducing the slope efficacy. In addition, this Rh oxide can be particularly preferably used when a wavelength of a main beam is a wavelength of visible light from an ultraviolet to relatively short wavelength. Specifically, by using the Rh oxide in a semiconductor laser device comprising a nitride semiconductor and having a wavelength of a main beam in a range of around 360 to 420 nm, the light shading effect becomes larger and, thus, it is effective for blocking stray light and reducing a ripple.

In addition, in the present invention, by using a multi-layered membrane in a shading layer, a ripple can be effectively reduced. When a shading layer is in the form of a multi-layered membrane, a multi-layered membrane made of different materials may be used, or a multi-layered membrane made of the same materials may be used. Even in the case of the same materials, since the property of a membrane can be altered by changing a forming method or the like, a multi-layered membrane can be obtained in which optically or electrically different layers are laminated.

In addition, it is preferable that a shading layer 9 is formed so as to contact directly with a laminate structure as shown in an embodiment 1. Thereby, invasion of the light into the interior of parts other than a laminate structure, for example, an insulating membrane and the like can be prevented, and release of stray light to the outside can be effectively blocked. In particular, when a non-resonator plane 101b is provided in the vicinity of a device separating plane, taking easy separation and the like into consideration, a protective membrane and the like are not provided on the surface near a separating plane (end) and the surface of a laminate structure is exposed in many cases and, therefore, it is preferable that a shading layer is formed directly on the surface of an active layer of an exposed non-resonator plane of a laminate structure in the vicinity of this end.

However, in the present invention, when an insulating layer is formed on the surface of a laminate structure, a shading layer 9 may be formed on the insulating layer. This allows a material having the bad adherability with a laminate structure to be used as a shading layer. In addition, by providing a shading layer on an insulating layer like this, there are the effect that contact with an electrode can be avoided and the effect that diffusion of a material for a shading layer into a laminate structure can be suppressed even at heat treatment. Examples of a material for an insulating layer include oxides such as $SiO_2$, $ZrO_2$ and the like.

When such the insulating layer is used, it is preferable that Ti is used as a shading layer and $SiO_2$ is used as an insulating layer. By adopting such the structure, a shading layer having the excellent light shading effect can be obtained and, further, absorption of the light can be suppressed and, therefore, loss of the light which is directed in a laminate structure can be extremely suppressed to make the laser light effectively emit, and an excellent semiconductor laser device having a small rise in Vf can be obtained. In addition, the aforementioned Rh and Rh oxides such as $SiO_2$ and $ZrO_2$ may be provided in an insulating layer.

FIGS. 5 to 8 show an alteration example of an end structure on an emitting plane side in the present embodiment 1.

A non-resonating plane and a shading layer as an alteration example are explained below by referring to FIGS. 4 to 8.

(Non-Resonator Plane)

In the present invention, a plane in a direction vertical to a light directing direction is an end, and a plane in a direction parallel with a light directing direction is a side. In an embodiment 1, a non-resonator plane 101*b* provided on a plane different from a resonator plane is a plane vertical to a light directing direction and a cross-section of an active layer is exposed on the plane, provided that it has no function as a resonator end. However, as described above, it is a plane through which the light exuded from a waveguide region can be released. In particular, in the vicinity of a resonator plane, the light which is not the laser light is released in many cases. In the present invention, by providing a shading layer on a non-resonator plane situated on a plane different from a resonator plane, release of stray light to the outside is prevented.

Figure 5:
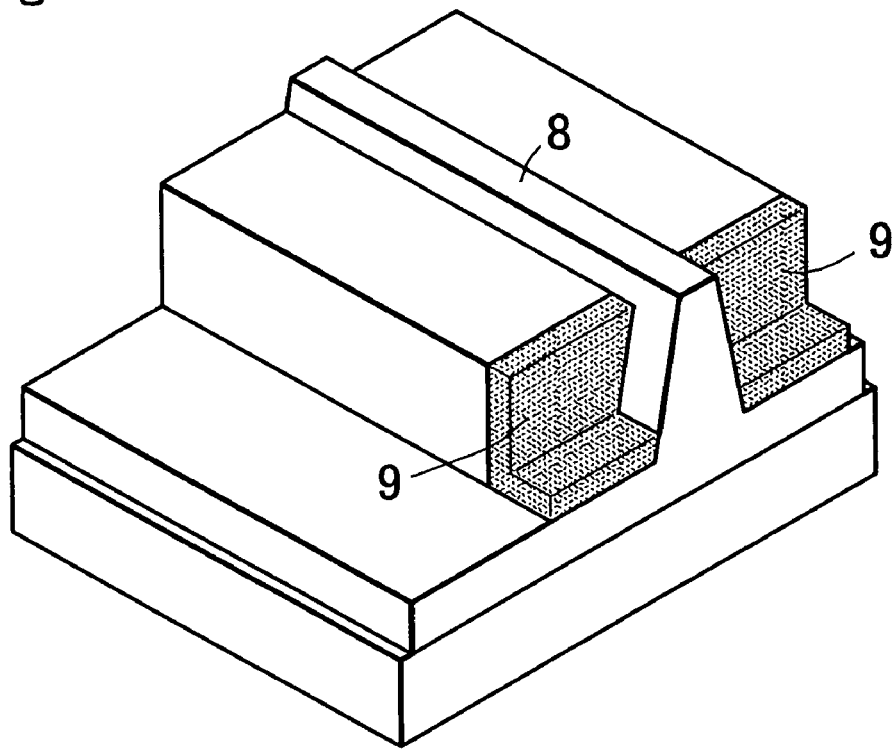
FIGS. 5 to 8 are a perspective view of a semiconductor laser device which is an alteration example of an embodiment 1.
Figure 6:
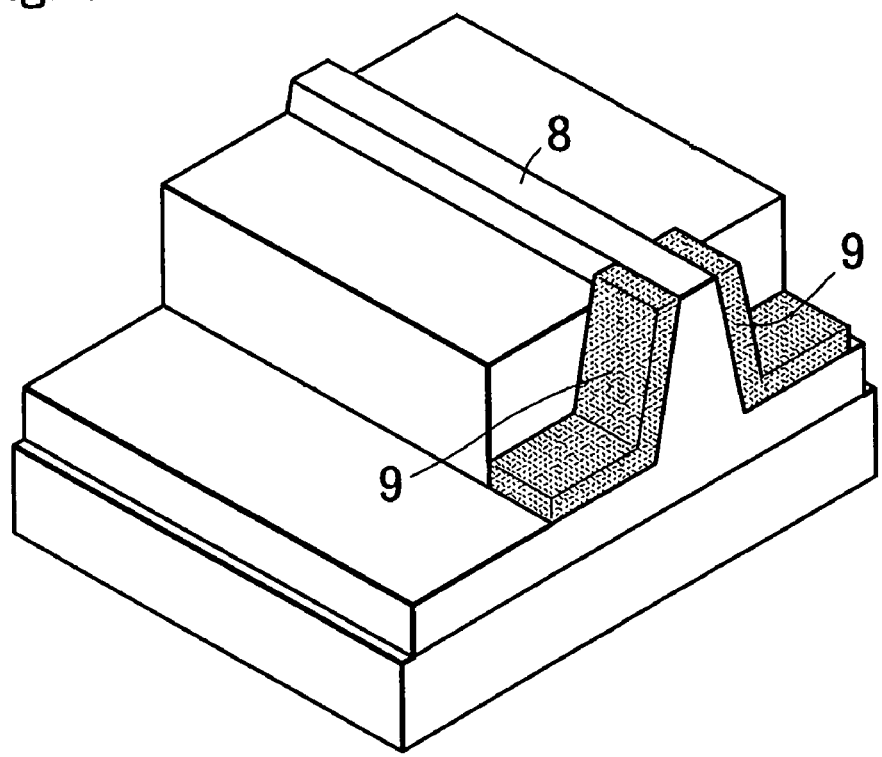
Figure 7:
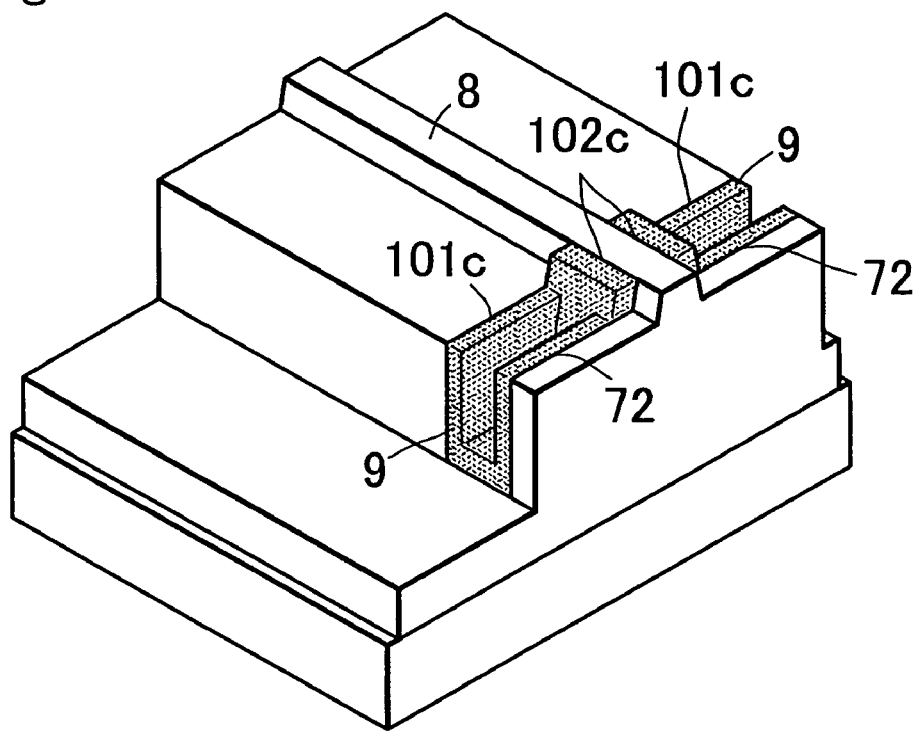
Figure 8:
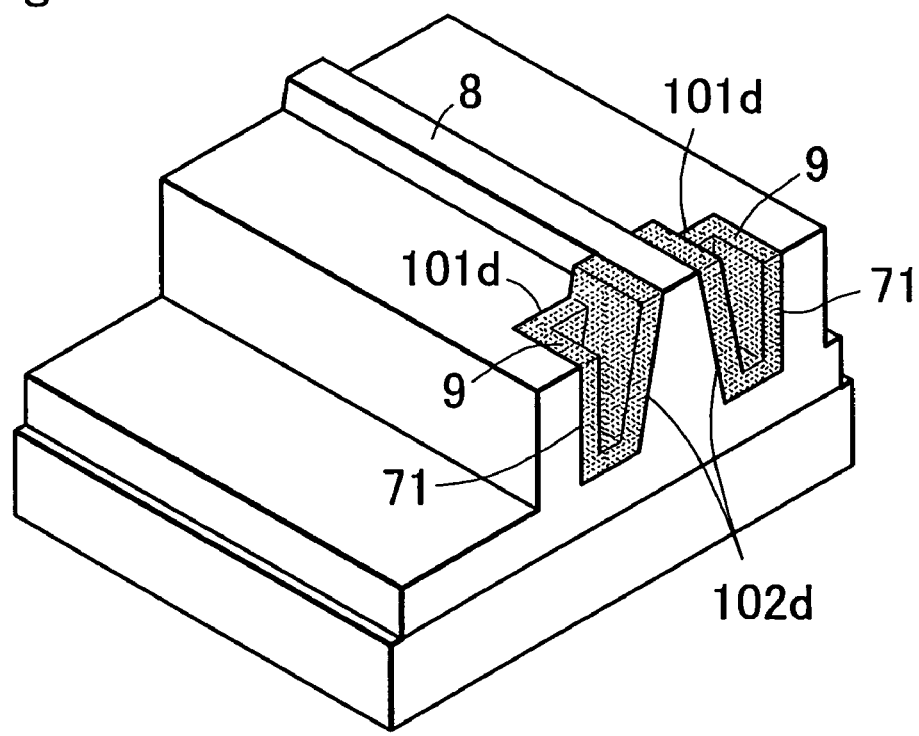

As described above, a non-resonator plane 101*b* is formed on a plane different from a resonator plane 101*a*. A representative example is a plane provided by removing a corner part of a laminate structure as shown in FIGS. 4 to 6. However, the present invention is not limited to this. For example, as shown in FIG. 8, two rectangular grooves 71 putting a ridge between them are formed in an emitting side resonator plane, a bottom surface orthogonal with a resonating direction of the groove 71 may be used as a non-resonator plane 101*d*. That is, in the present invention, like this, a non-resonator plane 101*d* may be formed so as not to reach a side of a laminate structure. In addition, although non-resonator planes are both formed at an end of a device in FIGS. 4 to 6, as shown in FIG. 7, rectangular grooves 72 putting a ridge 8 between them are formed on a side of an emitting side laminate structure, and a side orthogonal with a resonating direction of the groove 72 may be used as a non-resonator plane 101*c*. That is, in the present invention, a non-resonator plane may be provided in a middle of a stripe-like waveguide of a laminate structure. Even in such the structure by a resonator plane and a non-resonating plane in a direction vertical to a directing direction, and providing a shading layer 9 therein, stray light can be shaded. In addition, although it is preferable that a non-resonator plane 101*b* is provided one by one on both sides putting a resonator plane between them, 2 or more is not problematic. When two or more are provided, they may be isolated or close to each other. In addition, since it is suitable that a non-resonator plane faces a direction vertical to a light directing direction, it is not necessary to be completely vertical but may be inclined.

(Second Side)

In the present invention, of planes (sides) in a direction parallel with a light directing direction, a second side is a plane on a side nearer a waveguide region, and a first side 102 is a plane situated on an outer side than a second side. In the structure in FIGS. 7 and 8, a second side is expressed by attaching symbols of 102*c* and 102*d*. Both of a first side and a second side contain a cross-section of an active layer. In addition, a side of an n electrode forming plane and a substrate side are a plane not containing an active layer, and a plane on which it is not necessary to provide a (not exposed) shading layer 9, but formation close to each other is not particularly problematic. A first side and a second side containing a cross-section of an active layer can release the light exuded from a waveguide region like a non-resonator plane. In particular, in a part near a resonator plane, stray light is easily released. In the present invention, by forming a shading layer 9 on a second side in the vicinity of a resonator plane and situated near a waveguide region, release of stray light to the outside is effectively prevented.

It is preferable that a second side is situated nearer a waveguide region than a first side and is provided in the vicinity of a resonating end, and it is particularly preferable that it is contacted with a resonating end. Such the second side can be easily formed, for example, by removing a corner part of a laminate structure as in FIG. 1, and a shading layer 9 can be easily formed. The reason is as follows: Although when a wafer is processed, a waveguide region is provided so that it is successive between adjacent devices at a stage before separation, when a shape as shown in FIG. 1 is adopted, since shading layers of two adjacent devices can be formed at the same time, it is advantageous in respect of a step. However, a second side is not problematic in order to prevent release of stray light even when not contact with a resonating end. For example, as shown in FIG. 7, by forming a groove from a side at a part in a middle of a stripe of a laminate structure, a partial difference in level between a first side may be provided. In addition, in FIG. 8, although a first side and a second side are formed so that they are overlapped (so that they are opposite at a part thereof, even in such the structure, sides are formed on different planes, respectively. By providing a shading layer on a second side situated nearer a waveguide region, release of the stray light to the outside can be prevented. The number of this second side may be 1 or 2, or second sides may be isolated or close to each other. In addition, since a second side may not be completely parallel with a light directing direction, when it faces a plane parallel with a directing direction, inclination is not problematic at all. In addition, as a plane in a direction parallel with a directing direction, other third and fourth sides may be provided at a position nearer a first side furthest from a waveguide region to form a side having a plurality of differences in level, or a shading layer may be formed in that plane. In addition, when a stripe-like convex part (ridge) is formed, by forming a second side so as to be situated on the same plane as a side wall (side) of the convex part 8 as shown in FIG. 3 (cross-sectional view in the vicinity of an emitting part in FIG. 1), there is a merit in respect of a step such as sharing of a mask at etching and the like.

Figure 9:
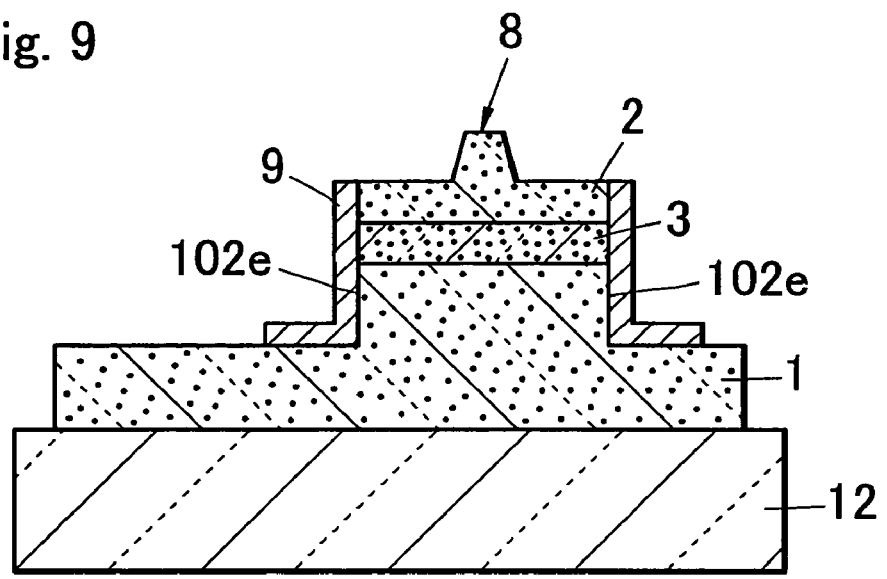
FIG. 9 is a cross-sectional view of a semiconductor laser device which is another alteration example in which an emitting end has a shape different from that of FIG. 1 in an embodiment 1.

However, in the present invention, a second side may be situated on a plane different from a side of a convex side. For example, as in FIG. 9, it may be formed outside a convex part 8. When a distance between second sides 102*e* on both sides is larger than a width of a stripe-like convex part (ridge) 8 as in this FIG. 9, the beam properties of the laser light in addition to the ripple reducing effect due to a shading layer can be changed depending on a distance between second sides 102*e* (a width of an active layer held by second sides). In other words, a width of an active layer held by second sides can be appropriately selected depending on the desired beam properties. For example, when a width of an active layer held by second sides 102*e* becomes small, the lateral light confining effect is enhanced, and an emission angle for the beam can be made large. A preferable range of a width of an end of an active layer held by second sides is around 1.5 to 10 μm, more preferably 4 to 8 µm, particularly preferably 5.5 to 7 µm. When a width of an active layer held by second sides (width of an active layer of a resonator plane) exceeds 10 µm, a distance between a second side and a waveguide region becomes large and, thus, the stray light blocking effect is reduced. In addition, when the distance becomes smaller than 1.5 µm, the light confining effect becomes large and an emission angle becomes large and, thus, the light is concentrated to increase load leading to easy occurrence of COD.

A shading layer in the present invention can prevent release of stray light to the outside by effective shading by providing on both of the aforementioned non-resonator planes 101b, 101c and 101d and second sides 102a, 102c and 102d. In the present invention, it is preferable that a shading layer is provided so that it is successive between a non-resonator plane and a second side as shown in FIG. 4. However, by providing on one of them as in FIGS. 5 and 6, the stray light release preventing effect can be obtained. In addition, an inclined plane may be used in which a non-resonator plane 101b and a second side 102a become the same plane. Further, there is no problem even when a shading layer 9 is provided on the surface, an end and a side of an exposed n-type layer, or on the surface, a side and an end of a substrate 12. Since these are isolated from an emitting part even when on the same plane as a resonator plane, the emitted light is hardly shaded, being not problematic. Further, in addition, these may be provided on a part of the surface (upper plane) of a p-type layer directly connected to a second side 102a or a non-resonator plane 101b, provided that it is preferable that they are provided on the surface of a p-type layer other than a stripe-like convex part (ridge) 8. Like this, since the light is leaked also through an upper plane of a p-type layer in the vicinity of a light resonator plane 101a, also by shading the light leaked from this, a ripple can be suppressed. Furthermore, an upper plane of a p-type layer is a plane in a different direction from that of a second side and that of a non-resonator end and, by forming it continuously also on a plane having such the positional relationship, it allows a shading layer to be hardly peeled. In particular, even a part which is difficult to be formed into a thin membrane layer such as a corner part and a edge part can obtain the firm adherability by successive formation. Since a shading layer can be stably formed, deterioration of a layer itself can be prevented and, thus, the life properties are also improved.

In addition, although it is preferable that a non-resonator plane and a second side are a flat and smooth plane, they may be rough or curved. A shading layer formed on these planes is similar. However, even when it is formed in conformity with the plane states of a non-resonator plane and a second side, there is no problem. In addition, it may be formed in the different plane state depending on a position. In addition, for example, in a structure shown in FIG. 1, a boundary part between a second side and a non-resonator plane is structurally easy for a shading layer material to be deposited thereon. A corner part is formed thick, but it does not lead to deterioration in the effect of the light non-transmittability, being not problematic.

In addition, since it is suitable that a shading layer 9 is provided so as to cover a light transmitting layer in a second side and a non-resonator plane, it is suitably provided so as to cover at least of a cross-section of an active layer, and it may not be formed on the whole non-resonating end and second side. When a guiding layer or the like is formed and, thus, a light-easily transmittable layer is present in addition to an active layer, it is preferable that a shading layer is provided so as to cover such the layer. In addition, in view of a step, a shading layer may be formed so as to cover up to an n-type layer and a substrate.

In the semiconductor laser device of the present invention, a shading layer forming plane is formed on an end and a side. As a method of forming these planes, a proper step and a method can be selected depending on a position for formation and a material for a shading layer. For example, it may be formed at the same time in an etching step for exposing an n-electrode forming plane, or it may be formed using masks having the same width or different width in an etching step for forming a stripe-like convex part. In addition, when it is formed before formation of a stripe-like convex part, a resonator plane with an active layer having a narrower width can be obtained and, therefore, it becomes possible to form a shading layer at a position nearer a waveguide region and, thus, by preventing mixing of stray light with a main beam and making a width of an active layer narrow, it becomes possible to form a waveguide structure excellent in the light confinement.

(Waveguide Region)

In the semiconductor laser device of the present invention, a stripe-like waveguide region is formed mainly in the vicinity of an active layer held by a first conductive type semiconductor layer and a second conductive type semiconductor layer, and this stripe direction and a resonator direction are almost consistent. Herein, a waveguide region is structured mainly in an active layer or in the vicinity thereof, and light guiding layers holding an active layer are formed to adopt a region up to guiding layers holding an active layer as a light directing layer, which may be used as a waveguide region.

(Resonator Plane)

A pair of resonator planes formed on both ends of a waveguide region are a flat plane which is formed by cleavage or etching. When formed by cleavage, it is necessary that a substrate and a laminate structure layer have the cleaving property and, by utilizing the cleaving property, an excellent mirror plane can be easily obtained. In addition, when a resonator plane is formed by etching, etching times can be reduced by formation at the same time with exposure of an n-electrode forming plane. Alternatively, a resonator plane may be formed at the same time in an etching step for forming a stripe-like convex part. Like this, the number of steps can be reduced by formation at the same time with each step. However, in order to obtain a more excellent resonator plane, it is suitable that another step is set. In addition, a reflecting membrane composed of a single membrane or a multi-layered membrane may be formed on a resonator plane thus formed by cleavage or etching, in order to effectively reflect the emitted light of an active layer or adjust a refractive index. One of the resonator planes is composed of a plane having a relatively high reflective rate and functions mainly as a light reflection side resonator plane which reflects the light toward inside a waveguide region, and the other is composed of a plane having a relatively low refractive index and functions mainly as a light emitting side resonator plane which emits the light to the outside.

(Stripe-Like Convex Part)

In the semiconductor laser device of the present invention, a stripe-like waveguide region can be easily formed by providing a convex part on a laminate structure. Specifically, in a second electrically type semiconductor layer in a laminate structure, a stripe-like convex part is formed by removing both sides of a peak by etching or the like so as to leave a central part in a peak manner, whereby, a stripe-like waveguide region can be formed in the vicinity of an active layer beneath the stripe-like convex part. A convex part is not limited to a forward mesa shape in which a width of a bottom side of the convex part is large and a stripe width becomes small as approaching an upper plane and, conversely, a convex part may be a reverse mesa shape in which a stripe width becomes small as approaching a bottom of the convex part. Further, a convex part may be a convex part having a vertical side such that a width becomes constant irrespective of a position in a lamination direction, or may be a shape in which these are combined. In addition, it is not necessary that a stripe-like waveguide has the same width over its full length. In addition, an embedded type laser device may be formed by re-growing a semiconductor layer on the surface of a convex part after formation of such the convex part.

In the present invention, by partially changing a depth of etching for forming the thus provided stripe-like convex part, a difference in level can be made in an active layer end and an active layer side. For example, in FIG. 1, since both sides of a convex part are etched deeper than an active layer on a light emitting plane side among a stripe-like convex part, a difference in level is formed on an emitting plane side end and, as a result, a resonator plane and a non-resonator plane are formed. Further, on an emitting end side, a second side successive to a side of a stripe-like convex part is formed, and the other side is a first side. By forming an end and a side so as to correspond to a stripe convex part like this, a plane on which a shading layer is provided can be formed effectively without via complex steps.

A stripe-like convex part and a shading layer forming plane may be formed in either order. As described above, a stripe-like convex part is formed in advance and, thereafter, a difference in level is set, whereby, formation corresponding to a stripe becomes easy. Since a waveguide region is formed corresponding to a stripe-like convex part, by forming a stripe in advance, a distance between a shading layer forming plane and a waveguide region can be controlled with the better accuracy.

Figure 10:
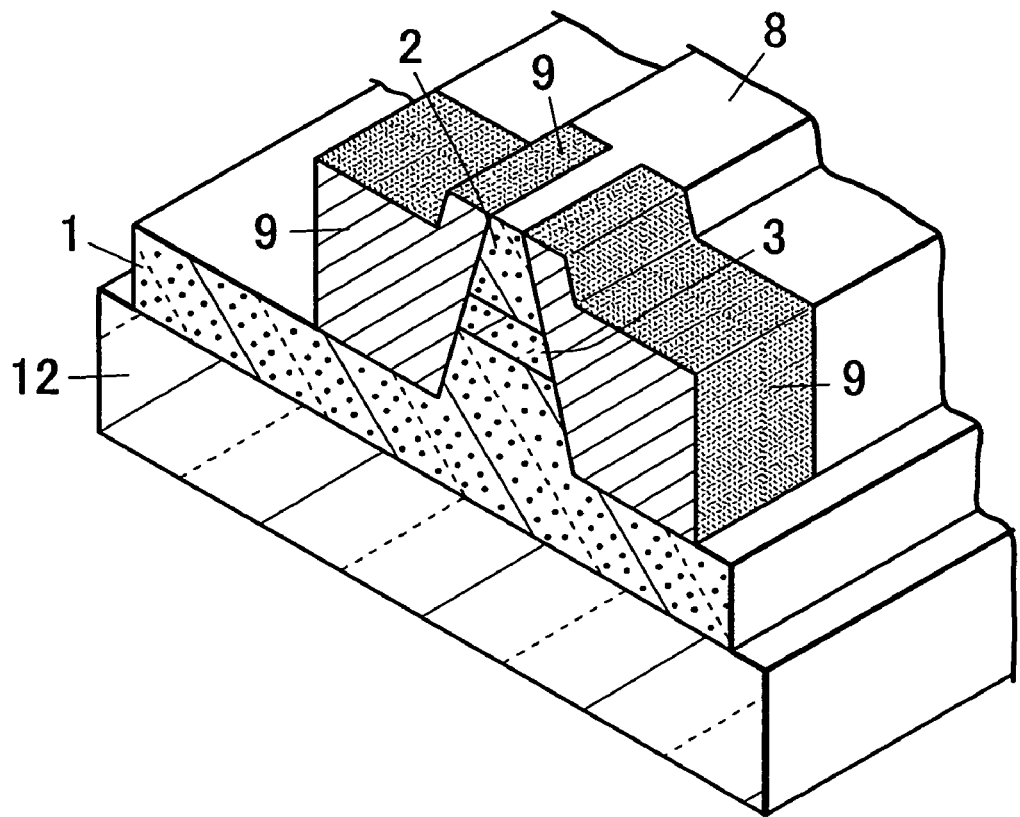
FIG. 10 is a cross-sectional view of a semiconductor laser device of another alteration example in which an emitting end has a shape different from that of FIG. 9 in an embodiment 1.

In addition, a part of an active layer may be removed in advance and, thereafter, a stripe-like convex part may be provided corresponding to the removed position. When a stripe-like convex part is formed in advance, it is difficult to form an active layer held by second sides narrower than a width of a convex part because it is technically difficult to form a mask having a further narrower width on a stripe-like convex part after formation of the convex part. However, on a relatively large flat plane before formation of a stripe-like convex part, it is relatively easy to form a mask thinner than a mask to be formed for forming a ridge. Therefore, a thin mask is formed on a part on which a narrow active layer held by second sides is to be formed (a masked part is a part on which a narrow active layer held by second sides is to be formed), and parts on both sides thereof are etched to below an active layer to form first a shading layer forming plane. Upon this, on the whole part other than both sides of the thin mask, a mask is formed. And, thereafter, a material which is to be a shading layer is embedded into a part removed by etching to the same level as the surface of a semiconductor layer. Then, a mask for forming a ridge is formed and both sides of the mask are etched to form a ridge. By doing so, as shown in FIG. 10, an active layer having a smaller width than that of a convex part 8 in the vicinity of an emitting plane can be formed. Thereby, the transverse light can be confined more strongly. In addition, in that case, by growing a suitable semiconductor layer outside a second side so as to embed at least a side of a thinly formed stripe-like active layer, breakage of the vicinity of an emitting end can be prevented upon formation of a resonator plane by cleavage.

In the present invention, as described above, by providing a part having a small width of an active layer on an emitting end side of a laminate structure to form a shading layer forming plane, a structure can be obtained which effectively prevents release of stray light to the outside and, at the same time, by changing a width of an active layer like this, the directing properties of a waveguide can be changed. In particular, when a second side is formed so that a width of an active layer becomes small to the vicinity of a waveguide region, it completely results in a difference in refractive index (not an effective difference in refractive index but actual difference in refractive index) and, therefore, the controllability of the transverse mode becomes particularly better. To the contrary, since a part having a first side is a waveguide region in which a difference in refractive index is effectively set by formation of a stripe-like convex part, a region in which a difference in refractive index is completely set and a region in which a difference in refractive index is effectively set are formed in one continuous waveguide region in the present embodiment. When this is utilized, a divergence angle of the emitted light can be adjusted in the laser device of the present embodiment.

(Laminate Structure)

In the semiconductor laser device of the present invention, as a semiconductor used as a first conductive type semiconductor layer, an active layer or a second conductive type semiconductor layer of a laminate structure, nitride semiconductors such as GaN, AlN and InN, and III-V Group nitride semiconductors ($In_xAl_yGa_{1-x-y}N$, $0 \leq x$, $0 \leq y$, $x+y \leq 1$) which are a mixed crystal of the above nitride semiconductors can be used. A preferable example using nitride semiconductors will be specifically explained below regarding the semiconductor laser device of the present invention. Herein, a laser device using a nitride semiconductor is a semiconductor laser device using a nitride semiconductor in any layer of a laminate structure in which a first conductive type semiconductor layer, an active layer, and a second conductive type semiconductor layer are laminated in this order, preferably a semiconductor laser device using a nitride semiconductor in all layers. Specifically, a cladding layer having a nitride semiconductor is provided in a first conductive type semiconductor layer and a second conductive type semiconductor layer, respectively, and a waveguide is formed in an active layer and in the vicinity thereof. As a more preferable structure of a semiconductor laser device structured by using a nitride semiconductor (nitride semiconductor laser device), an n-type nitride semiconductor layer is used in a first conductive type semiconductor layer, a p-type nitride semiconductor layer is used in a second electrically type semiconductor layer, and a layer containing a nitride semiconductor layer containing In is used in an active layer.

(Nitride Semiconductor)

As a nitride semiconductor used in the laser device of the present invention, there are GaN, AlN, and InN, and III-V Group nitride semiconductors ($In_bAl_dGa_{1-b-d}N$, $0 \leq b$, $0 \leq d$, $b+d \leq 1$) which are a mixed crystal of GaN and the like. In addition, B can be used as a III Group element, or a mixed crystal in which a part of N of a V Group element is replaced with As or P may be used. In addition, each conductive type impurity can be added to such the nitride semiconductor to obtain the desired conductive type. As an n-type impurity used in a nitride semiconductor, specifically, IV Group and VI Group elements such as Si, Ge, Sn, S, O, Ti, Zr and the like can be used, preferably Si, Ge and Sn are used, more preferably Si is used. In addition, as a p-type impurity, specifically, there are Be, Zn, Mn, Cr, Mg and Ca, preferably Mg is used. A laser device using a nitride semiconductor will be specifically explained below regarding the laser device of the present invention. Herein, a laser device using a nitride semiconductor means that a nitride semiconductor is used in any layer of a laminate structure in which a first conductive type layer, an active layer, and a second conductive type layer are laminated, preferably in all layers. For example, a cladding layer comprising a nitride semiconductor is provided in a first conductive type layer and a second conductive type layer, respectively, and an active layer is provided between those two cladding layers to form a waveguide. More specifically, a first conductive type layer contains an n-type nitride semiconductor layer, a second conductive type layer contains a p-type nitride semiconductor layer, and an active layer contains a nitride semiconductor containing In.

In addition, in the nitride semiconductor laser device of the present invention, when an n-type cladding layer and a p-type cladding layer are provided to structure a waveguide region, a guiding layer and an electron confining layer may be provided between each cladding layer and an active layer.

A preferable structure of each layer in the nitride semiconductor laser element of the present invention will be explained below.

(N-Type Cladding Layer)

In the laser device using a nitride semiconductor of the present invention, as a nitride semiconductor used in an n-type cladding layer, it is enough that a sufficient difference in refractive index for confining the light is set as in a p-type cladding layer, and a nitride semiconductor layer containing Al is preferably used. In addition, this layer may be a single membrane or a multi-layered membrane. Specifically, as shown in examples, a superlattice structure in which AlGaN and GaN are laminated alternately may be used. In addition, this n-type cladding layer acts as a carrier confining layer and a light confining layer and, in the case of a multi-layered structure, as described above, a nitride semiconductor containing Al, preferably AlGaN may be grown. Further, this layer may be doped with an n-type impurity, or may be undoped. Alternatively, in a multi-layered membrane layer as shown in examples, at least one layer constituting the layer may be doped. In a laser device having an oscillating wavelength of long wavelength 430 to 550 nm, this cladding layer is preferably GaN doped with an n-type impurity. In addition, a membrane thickness is not particularly limited as in a p-type cladding layer, but by forming a layer at not less than 100 Å and not more than 2 μm, preferably by forming a layer in a range of not less than 500 Å and not more than 1 μm, the sufficient function as a light confining layer is exerted.

(Active Layer)

In the present invention, when the semiconductor laser device of the present invention is structured by using a nitride semiconductor, inclusion of a nitride semiconductor layer containing In in an active layer can generate the laser light in a wavelength region of an ultraviolet region and a visible region from blue to red. In addition, a nitride semiconductor layer containing In causes extremely important device deterioration in driving a laser device in some cases when an active layer is exposed to the air. However, in the present invention, since a waveguide region isolated from an emitting part is a waveguide region structured by a ridge provided at a depth not reaching an active layer, it is possible to suppress such the device deterioration to minimum. The reason is as follows: Since In has a low melting point, a nitride semiconductor containing In is a material which is easily degraded and vaporized, and easily undergoes breakage at etching or the like. In addition, in processing after exposure of an active layer, it becomes difficult to retain its crystallinity and, as a result, it leads to shortening of the device life.

Herein, an active layer may be a quantum well structure and, in that case, may be a single quantum well or a multiple quantum well. Preferably, by adopting a quantum well structure, a laser device and an edge emitting device excellent in the emitting efficacy and having the high output can be obtained. It is preferable that, as an active layer of a nitride semiconductor, as described above, a nitride semiconductor containing In is used. Specifically, it is preferable to use a nitride semiconductor represented by $Al_xIn_yGa_{1-x-y}N$ ($0 \leq x \leq 1$, $0 < y \leq 1$, $x+y \leq 1$). It means that, in this case, in an active layer having a quantum well structure, it is preferable to use nitride semiconductors shown herein as a well layer. In addition, a wavelength region from near ultraviolet to green of the visible light (380 nm to 550 nm), it is preferable to use $In_yGa_{1-y}N$ ($0 < y < 1$). In addition, also in a wavelength region longer than that (red), similarly, $In_yGa_{1-y}N$ ($0 < y < 1$) can be used. Upon this, mainly by changing an In crystal mixing ratio y, the desired wavelength can be obtained. In a short wavelength region of not more than 380 nm, since a wavelength corresponding to a band gap of GaN is 365 nm and since the band gap energy which is almost the same as the band gap energy for GaN or slightly larger is necessary, for example, $Al_xIn_yGa_{1-x-y}N$ ($0 < x \leq 1$, $0 < y \leq 1$, $x+y \leq 1$) is used.

When an active layer has a quantum well structure, by adopting a range of not less than 10 Å and not more than 300 Å, preferably a range of not less than 20 Å and not more than 200 Å as a specific membrane thickness of a well layer, Vf (threshold current density) can be reduced. In addition, from a viewpoint of the crystal growth, when the thickness is 20 Å or more, a layer not having a great scatter in a membrane thickness and having the relatively uniform membraneous properties can be obtained. By adopting 200 Å or less, the crystal growth suppressing occurrence of crystal defect low becomes possible. The number of well layers in an active layer is not particularly limited but is 1 or more. Upon this, when the number of well layers is 4 or more, if a thickness of each layer constituting an active layer becomes large, a thickness of the whole active layer becomes large, leading to increase in Vf. Therefore, it is preferable to suppress a thickness of an active layer low by adopting a range of 100 Å or less as a thickness of a well layer. In high output LD, by adopting not less than 1 and not more than 3 as the number of well layers, there is a tendency that a device having the high emitting efficacy is obtained, being preferable.

In addition, a well layer may be doped with a p- or n-type impurity (acceptor or donor), or undoped or non-doped. However, when a nitride semiconductor containing In is used as a well layer, since there is a tendency that the crystallinity is deteriorated when the n-type impurity concentration becomes large, it is preferable that the n-type impurity concentration is suppressed low to obtain a well layer having the better crystallinity. Specifically, it is preferable to grow a well layer undoped in order to maximize the crystallinity better. Specifically, it is preferable that the n-type impurity concentration is $5 \times 10^{16}/cm^3$ or less. The state where the n-type impurity concentration is $5 \times 10^{16}/cm^3$ or less is the state where the impurity concentration is extremely low, and this state can be said to be a well layer containing substantially no n-type impurity. In addition, where a well layer is doped with the n-type impurity, when doped with the n-type impurity concentration of a range of not less than $1 \times 10^{18}$ and not more than $5 \times 10^{16}/cm^3$, deterioration of the crystallinity can be suppressed low and the carrier concentration can be increased.

The composition of a barrier layer is not particularly limited but the same nitride semiconductor as that for a well layer can be used. Specifically, a nitride semiconductor containing In such as InGaN having a lower In crystal mixing ratio than that of a well layer, and a nitride semiconductor containing Al such as GaN, AlGaN and the like can be used. Upon this, it is necessary that a barrier layer has greater band gap energy than that of a well layer. As the specific composition, $In_\beta Ga_{1-\beta}N$ ($0 \leq \beta < 1$, $\alpha > \beta$), GaN, $Al_\gamma Ga_{1-\gamma}N$ ($0 < \gamma \leq 1$) can be used, preferably $In_\beta Ga_{1-\beta}N$ ($0 \leq \beta <$, $\alpha > \beta$) and GaN can be used to form a barrier layer with the better crystallinity. The reason is as follows: When a well layer comprising a nitride semiconductor containing In is grown directly on a nitride semiconductor containing Al such as AlGaN, there is a tendency that the crystallinity is reduced and the function of a well layer is deteriorated. When $Al_\gamma Ga_{1-\gamma}N$ ($0 < \gamma \leq 1$) is used as a barrier layer, this can be avoided by providing a barrier layer containing Al on a well layer and providing a multi-layered membrane barrier layer using a barrier layer of $In_\beta Ga_{1-\beta}N$ ($0 \leq \beta < 1$, $\alpha > \beta$) and GaN under a well layer. Like this, in a multiple quantum well structure, a barrier layer held by well layers is not particularly limited to one layer (well layer/barrier layer/well layer) but a plurality of barrier layers having the different composition, impurity amount and the like may be provided such as a barrier layer of 2 or more layers, "well layer/barrier layer (1)/barrier layer (2)/ . . . /well layer". Herein, a is an In constituent ratio for a well layer, and it is preferable that an In constituent ratio β for a barrier layer is smaller than that for a well layer by adopting $\alpha > \beta$.

A barrier layer may be doped with the n-type impurity, or may be undoped. Preferably, a barrier layer is doped with the n-type impurity. Upon this, it is preferable that the n-type impurity concentration in a barrier layer is at least $5 \times 10^{16}/cm^3$ or more, and the upper limit is $1 \times 10^{20}/cm^3$. Specifically, for example, in the case of LD for which the high output is not required, it is preferable that the n-type impurity is contained at a range of not less than $5 \times 10^{16}/cm^3$ and not more than $2 \times 10^{18}/cm^3$. In addition, in the case of LD having the higher output, it is preferable to dope at a range of not less than $5 \times 10^{17}/cm^3$ and not more than $1 \times 10^{20}/cm^3$, preferably at a range of not less than $1 \times 10^{18}/cm^3$ and not more than $5 \times 10^{19}/cm^3$. When doped at the high concentration like this, it is preferable that a well layer contains substantially no n-type impurity, or a well layer is grown undoped. By doping at the aforementioned preferable range, as described above, carriers can be injected at the high concentration with the better crystallinity.

When doped with the n-type impurity, all barrier layers in an active layer may be doped, or a part of barrier layers may be doped with the n-type impurity. When a part of barrier layers are doped with the n-type impurity, it is preferable to dope a barrier layer arranged on an n-type layer side in an active layer. Specifically, by doping an n-th barrier layer Bn (N=1, 2, 3 . . . ) counting from an n-type layer side, electrons are effectively injected in an active layer and, thus, a device excellent in the emitting efficacy and the inner quantum efficacy can be obtained. This is not limited to a barrier layer but is also true in the case of a well layer. When both are doped, by doping an n-th barrier layer Bn (N=1, 2, 3 . . . ) and a m-th well layer Wm (m=1, 2, 3 . . . ) counting from an n-type layer, that is, by doping starting with a side near an n-type layer, there is a tendency that the aforementioned effects can be obtained.

A thickness of a barrier layer is not particularly limited, but 500 Å or less, more particularly a range of not less than 10 Å and not more than 300 Å as in a well layer can be applied.

In a laser device using a nitride semiconductor of the present invention, a laminate structure is preferable in which a first conductive type layer has an n-type nitride semiconductor and a p-type nitride semiconductor is used in a second conductive type layer. Specifically, an n-type cladding layer and a p-type cladding layer are provided in each conductive type layer to structure a waveguide. Upon this, a guiding layer and an electrode confining layer described later may be provided between each cladding layer and an active layer.

(P-Type Cap Layer)

As a p-type cap layer provided between a p-type cladding layer and an active layer, AlGaN and the like can be preferably used, leading to a layer having the effect of confining carriers in an active layer and, since a threshold current can be reduced, easy oscillation becomes possible. AlGaN may be doped with the p-type impurity, or may be non-doped. A thickness is preferably 500 Å or less.

(Guiding Layer)

In the present invention, by providing p-type and n-type guiding layers holding an active layer on inner side than a cladding layer (active layer side) to form a light waveguide, an excellent waveguide can be formed. Upon this, a thickness of a waveguide (active layer and both guiding layers holding it) is preferably 6000 Å or less. When a thickness is 6000 Å or less, rapid increase in an oscillation threshold current can be suppressed. More preferably, by adopting 4500 Å or less, continuous oscillation becomes possible at a base mode and a long life with low-suppressed oscillation threshold current. In addition, both guiding layers are formed at the almost same thickness, preferably not less than 100 Å and not more than 1 μm, more preferably not less than 500 Å and not more than 2000 Å. As a nitride semiconductor used in a guiding layer, refractive index suitable for forming a waveguide is selected by comparing with a cladding layer to be provided on its external side, and a single membrane or a multi-layered membrane may be used. Specifically, undoped GaN is preferable at an oscillation wavelength of 370 nm to 470 nm, and a multi-layered membrane structure of InGaN/GaN is preferably used at a relatively long wavelength region (450 nm or more).

(P-Type Cladding Layer)

In a laser element using a nitride semiconductor of the present invention, it is preferable that a p-type cladding layer containing a p-type nitride semiconductor (first p-type nitride semiconductor) is provided as a second conductive type layer or a first conductive type layer. Upon this, an n-type cladding layer containing an n-type nitride semiconductor is provided on an conductive type layer different from an conductive type layer on which a p-type cladding layer is provided, to form a waveguide in a laminate structure. In addition, as a nitride semiconductor used in this p-type cladding layer, it is enough that a sufficient difference in refractive index for confining the light is set, and a nitride semiconductor layer containing Al is preferably used. In addition, this layer may be a single or multi-layered membrane. Specifically, as shown in examples, the layer may be a superlattice structure in which AlGaN and GaN are laminated alternately. The superlattice structure makes the crystallinity better, being preferable. Further, this layer may be doped with the p-type impurity, or may be undoped. Alternatively, as shown in examples, in a multi-layered membrane layer, at least one layer constituting it may be doped. In a laser device having an oscillation wavelength of long wavelength 430 to 550 nm, this cladding layer is preferably GaN doped with the p-type impurity. A thickness is not particularly limited, but a p-type cladding layer functions as a sufficient light confining layer by formation in a range of not less than 100 Å and not more than 2 μm, preferably by formation in a range of not less than 500 Å and not more than 1 μm.

In the present invention, an electron confining layer and a light guiding layer described later may be provided between an active layer and a p-type cladding layer. Upon this, when a light guiding layer is provided, a structure is preferable in which a light guiding layer is provided also between an n-type cladding layer and an active layer to hold an active layer by light guiding layers. In this case, an SCH structure is obtained, and a difference in refractive index is set by rendering an Al constituent ratio for a cladding layer greater than an Al constituent ratio for a guiding layer, and the light is confined by a cladding layer. When a cladding layer and a guiding layer are formed of a multi-layered membrane, respectively, a magnitude of an Al constituent ratio is determined by an Al average composition.

(P-Type Electron Confining Layer)

In addition, a p-type electron confining layer provided between an active layer and a p-type cladding layer, preferably between an active layer and a p-type light guiding layer is a layer which functions to confine carriers in an active layer, and contributes to each oscillation by reducing a threshold current. Specifically, AlGaN is used. In particular, by adopting a structure in which a p-type cladding layer and a p-type electron confining layer are provided in a second conductive type layer, the more effective electron confining effect can be obtained. When AlGaN is used in this p-type electron confining layer, preferably by doping with the p-type impurity, the aforementioned function can be assuredly exerted, but even a non-doped layer has the aforementioned carrier confining function. A lower limit of a thickness is at least 10 Å, preferably 20 Å. In addition, the aforementioned effects can be sufficiently expected by formation at a thickness of 500 Å or less and adopting x of 0 or more, preferably 0.2 or more in the composition of $Al_xGa_{1-x}N$. In addition, an n-side carrier confining layer which confines holes in an active layer also on an n-type layer side. Confinement of holes is possible unless offset (difference of a band gap between an active layer) is set to an extent for electron confinement. Specifically, the same composition as that for a p-side electron confining layer can be applied. In addition, in order to render the crystallinity better, the layer may be formed of a nitride semiconductor containing no Al. Specifically, almost the same composition as that for a barrier layer in an active layer can be used. In this case, it is preferable that an n-side barrier layer for carrier confinement is arranged on the most n-type layer side in an active layer, or it may be arranged in an n-type layer in contact with an active layer. Like this, by providing p-side and n-side carrier confining layers, preferably in contact with an active layer, those layers can inject carriers effectively into an active layer or a well layer. As another form, in an active layer, a layer in contact with a p-side or n-side layer can be used as a carrier confining layer.

(Electrode)

In the semiconductor laser device of the present invention, a p-side electrode formed on a stripe-like convex part and an n-side electrode provided on an n-side layer (n-type contact layer) are not particularly limited, but a material which can obtain better ohmic contact with a nitride semiconductor can be preferably used. By formation corresponding to a stripe-like convex part which is to be a waveguide region, injection of carriers can be effectively performed. Alternatively, a nitride semiconductor may be provided in contact therewith via an insulating membrane described later. Alternatively, an ohmic electrode provided in contact with a semiconductor, and a pad electrode comprising a material suitable for bonding may be provided. In the present embodiment, a structure is obtained in which after a first insulating membrane is formed, an opening is provided to form an ohmic electrode, a first insulating membrane having an opening is further formed thereon, and a pad electrode is formed thereon. As a specific material, there are Ni, Co, Fe, Ti, Cu, Rh, Au, Ru, W, Zr, Mo, Ta, Pt and Ag and oxides and nitrides of them in the case of a p-side electrode. Thus, a single layer, an alloy or a multi-layered membrane of the foregoing may be used. In the case of an n-side electrode, there are Ni, Co, Fe, Ti, Cu, Rh, Au, Ru, W, Zr, Mo, Ta, Pt, Ag and the like, and a single layer, an alloy or a multi-layered membrane of them can be used.

(Insulating Membrane)

In the semiconductor laser device of the present invention, it is preferable that a protective membrane is formed on a side of a stripe-like convex part and on an exposed surface (plane) continuing to the side. When formed only on a part for protecting a convex part, the insulating property does not matter, but by using an insulating protective membrane, a membrane can be obtained which has the function as an insulating membrane for preventing short circuit between electrodes and the function as a protective membrane for protecting an exposed layer. Specifically, a single membrane or a multi-layered membrane of $SiO_2$, $TiO_2$ and $ZrO_2$ can be preferably used. Alternatively, as described above, an insulating membrane may be formed into a multi-layered membrane via an electrode.

Herein, in a laser device using a nitride semiconductor, by setting a position on which a stripe-like ridge is to be provided in a nitride semiconductor layer containing Al and providing an insulating membrane on the surface of an exposed nitride semiconductor and on a convex part side, better insulation is obtained and, thus, even when an electrode is provided on an insulating membrane, a laser device without leak current can be obtained. The reason is as follows: Since there is hardly a material which can ohmic-contact better among a nitride semiconductor containing Al, even when an insulating membrane and an electrode are provided on the surface of this semiconductor, suitable insulation is attained such that leak current is hardly generated. Conversely, when an electrode is provided on the surface of a nitride semiconductor containing no Al, ohmic contact is easily formed between a material for the electrode and a nitride semiconductor and, when an electrode is formed on the surface of a nitride semiconductor containing no Al via an insulating membrane, it becomes a cause for leakage when fine holes are present on an insulating membrane due to the membraneous properties of an insulating membrane and an electrode. For this reason, in order to solve them, such a consideration is necessary that an insulating membrane is formed at a thickness at which insulation is sufficiently maintained, or a shape and a position of an electrode is not imposed on the surface of an exposed semiconductor and, thus, a great limitation arises in designing a laser element structure in addition, a position on which a ridge (convex part) is to be provided is important. The surface (plane) of nitride semiconductors on both sides of a ridge which is exposed at formation of a ridge (convex part) occupies an extremely great area as compared with a ridge (convex part) side and, by maintaining the better insulating property on this surface, a laser device having high design degree of freedom to which various electrode shapes can be applied and for which an electrode formation position can be selected comparatively freely can be obtained, being extremely advantageous in formation of a ridge (convex part). Herein, as a nitride semiconductor containing Al, specifically, AlGaN, or the aforementioned a superlattice multi-layered membrane structure of AlGaN/GaN is suitably used.

Embodiment 2

Figure 13:
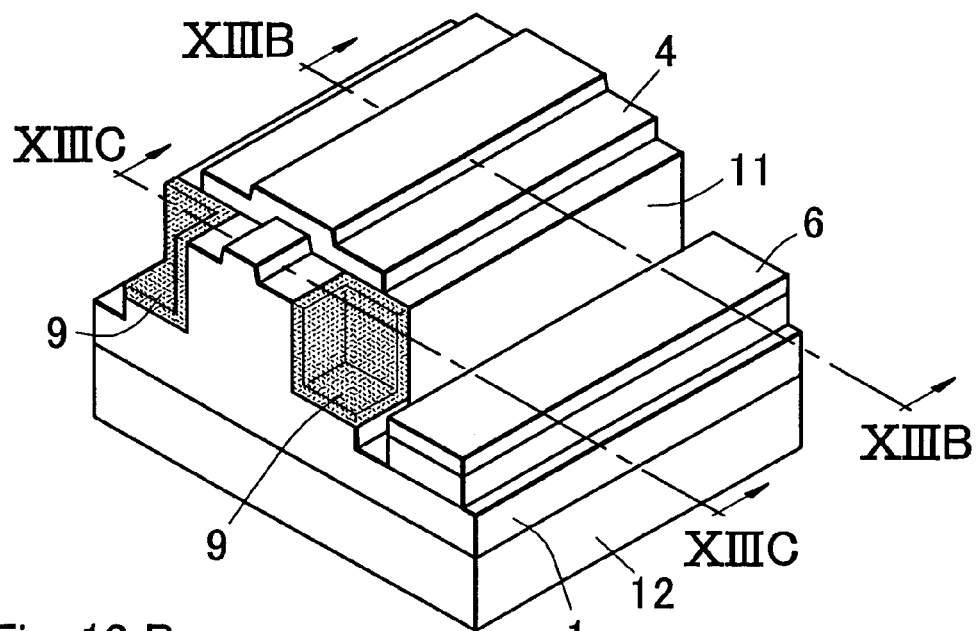
FIG. 13A is a perspective view of a semiconductor laser device of an example 9 of the present invention.
FIG. 13B is a cross-sectional view along the XIIIB-XIIIB line in FIG. 13A.
FIG. 13C is a cross-sectional view along the XIIIC-XIIIC line in FIG. 13A.
Figure 13:
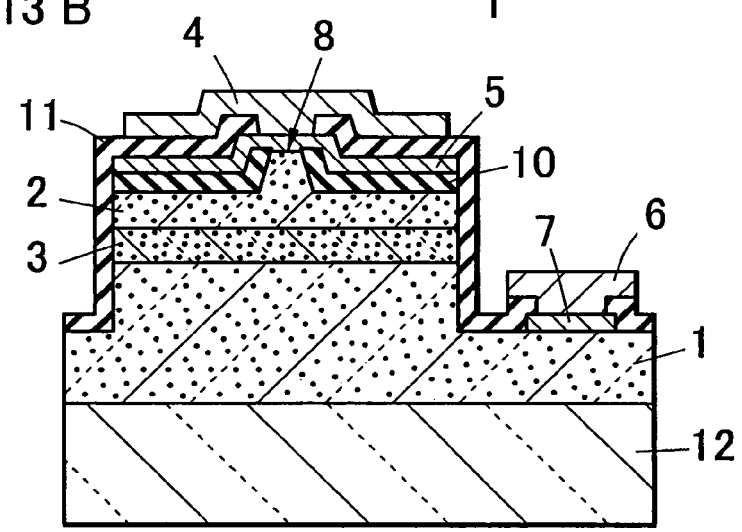
Figure 13:
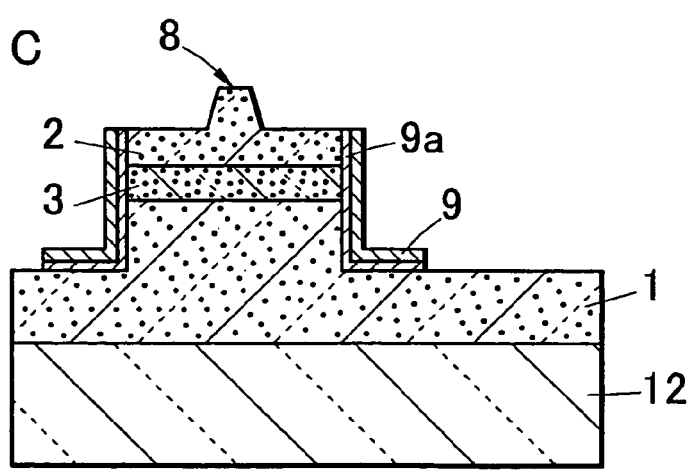

In the semiconductor laser device of an embodiment 2 of the present invention, like an embodiment 1, by providing a shading membrane in the vicinity of a resonator plane, release of the light exuded from a waveguide region (stray light) to the outside is prevented, and has the same structure as that of an embodiment 1 except that, in order to form a shading membrane to be peeled with difficulty, a light-transmittable membrane 9a comprising the same elements as those constituting a shading membrane is provided between a shading membrane and a laminate structure (FIG. 13A-FIG. 13C).

In the laser device of this embodiment 2, a membrane having the desired shading property is formed on the surface of a laminate structure with the better adherability, by utilizing the fact that even compounds constituted by the same element have the different physical properties and chemical properties when a constituent ratio is different. It means that, for example, when an oxidized membrane of the particular metal is used as a shading membrane, an oxide having an oxygen rate different from that of a shading membrane is used as a light-transmittable membrane between a shading membrane and a laminate structure. More specifically, it means that an oxide containing much oxygen which is highly light-transmittable is used as a light-transmittable membrane, and an oxide containing much metal which highly shades the light is used as a shading membrane. Like this, when the content of a metal is changed from small to large, the light transmittance of some materials is greatly changed. In this embodiment 2, the materials having such the nature can be used. In addition, such the membrane can be easily obtained by changing the conditions at membrane formation. The conditions at growth to be changed are the conditions changeable in an apparatus used for forming a membrane, such as a flow rate and a constituent ratio of a gas to be used, and a gas supplying direction, as well as the vacuum degree, the atmosphere, a temperature and the like in an apparatus.

If materials having the different transmittance are simply provided, the effect of shading the light can be obtained also by forming a metal layer on an insulating light-transmittable membrane such as $SiO_2$. However, there are cases where a process for production is different using a different material as a raw material or a problem of the adherability arises. In response thereto, if the optical properties can be changed by using the same raw material and only by changing the membrane forming conditions in the same apparatus, since a membrane can be prepared continuously, mixing of a foreign matter can be prevented. In the present embodiment 2, between this light-transmittable membrane and a shading membrane, an intermediate membrane having the light transmittance which is between the transmittances of both membranes may be formed. Like this, by changing the transmittance gradually, the light can be almost completely blocked by a shading membrane. Like this, when laminated in combination of membranes having the constituent elements, a protective membrane (shading membrane) having the extremely excellent adherability can be obtained as compared with the case where membranes comprising different elements are laminated.

In addition, a light-transmittable membrane and a shading membrane can be formed by a composition graded layer by changing the conditions gradually and successively instead of a method for forming a multi-layered membrane by step-wisely changing the membrane forming conditions. Even in such the case, since it is enough that the composition is finally changed to that which can block the light, in the present invention, such the composition graded membrane may be a membrane in which an underside of the membrane (side in contact with a laminate structure) is light-transmittable and, as a position at a higher level, the light transmittability is lowered, that is, the light shading property is enhanced.

As a method for forming a light-transmittable membrane and a shading membrane on the surface of a laminate structure, there are gas phase growing methods such as physical vapor deposition method (PVD method) and chemical vapor deposition method (CVD method). By changing the conditions when these methods are used, membranes having the different constituent ratio can be easily obtained. In the present invention, it is preferable that the PVD method is used, and a sputtering method and a vacuum vapor deposition method may be used. When such the methods are used, since a light-transmittable membrane and a shading membrane comprising the same elements as in the present invention are formed using the same raw material, a membrane can be formed successively. For this reason, mixing of impurities and the like can be prevented to form a membrane having the high purity, and a time necessary for exchanging a raw material is not necessary. By formation by changing the conditions, a shading membrane having both of the tightness and optical property can be formed. As a preferable material used in a shading membrane and a light-transmittable membrane, materials which can change the light transmittance by changing a constituent ratio are preferable. Examples of the preferable material include oxides, nitrides and fluorides of metals. Specific materials are Rh, Si, Ti, Al, Cr, Nb, Mg, V, Fe, Co, Ni, Cu, Zn, Ga, Y, Zr, Mo, Ru, Pd, Ag, Sn, In, Hf, Ta, W, Ir, Pt and Au. These may be used alone or in combination of a plurality of them.

In addition, a membrane having the different crystallinity corresponding to a constituent ratio may be used. Since when the crystallinity is different, the optical property is also changed by utilizing this, a membrane having the shading property can be formed with the better adherability. For example, a membrane having the high crystallinity is used as a light-transmittable membrane, and a membrane having the low crystallinity can be used thereon as a shading membrane. This utilizes the fact that a membrane having the high crystallinity is formed compact and easily produces a membrane having the high transmittance and having the uniform crystallinity and, in addition, since a membrane having the low crystallinity is a crystal lattice which is irregular to the light, its light transmittability is easily decreased. In the case of membrane formation by a sputtering method or the like, when one tries to form an irregular crystal having the shading property by rendering the conditions (for example, air pressure) mild, there is an a tendency that a peelable membrane is obtained. However, instead of forming such the membrane directly on a semiconductor layer, by forming on a compact light-transmittable membrane comprising the same elements having the better crystallinity, the formed membrane can be used as a shading membrane.

In addition, in the present invention, among the aforementioned materials, in particular, Rh oxides (a representative of which is RhO) are a preferable material as a material forming a shading membrane and a light-transmittable membrane. By using this Rh oxide as a shading membrane and as a light-transmittable membrane, a membrane which can effectively shade the light can be formed with the better adherability. Furthermore, since the Rh oxide is thermally stable, a stable shading membrane can be obtained in which deterioration hardly occurs in a step or upon use. In particular, by formation at a position in the vicinity of a resonator plane and slightly isolated from a resonator plane, excellent FFP can be obtained without reducing the slope efficacy. In addition, this Rh oxide can be particularly preferably used in a laser device in which a wavelength of a main beam is in a region from an ultraviolet to a comparatively short wavelength visible region. Specifically, by using in a semiconductor laser device comprising a nitride semiconductor and having a wavelength of a main beam in a range of around 360 to 420 nm, since the light shading effect can be enhanced, it is advantageous to block stray light and reduce a ripple.

A total thickness of a shading membrane is preferably 500 Å to 10000 Å, more preferably 1000 Å to 5000 Å. When a thickness is smaller than 1000 Å, the light is easily transmitted and the shading effect is reduced, being not preferable.

In addition, a total thickness of a light-transmittable membrane is preferably 100 Å to 1000 Å, more preferably 200 Å to 600 Å. When a thickness is smaller than 200 Å, a light-transmittable membrane itself becomes peelable, being not preferable. In addition, when a thickness is too large, the productivity is reduced, being not preferable.

In addition, a thickness as a protective membrane in combination of a shading membrane and a light-transmittable membrane is preferably a total thickness of 500 Å to 20000 Å including the case where an intermediate layer is provided therebetween.

In addition, as a position on which a shading membrane is to be provided, the vicinity of a resonator plane is preferable. The position may be on the same plane as a resonator end or on the different plane from a resonator end. Preferably, a shading membrane is formed on the different plane. Specifically, as in an embodiment 1, ends on both sides of a resonator plane are removed below an active layer in the vicinity of a light emitting side resonator plane, and a corner part of a laminate structure is removed. By the foregoing, the laser device of an embodiment 2 has the same actions and effects as those of the laser device of an embodiment 1.

Embodiment 3

Figure 14:
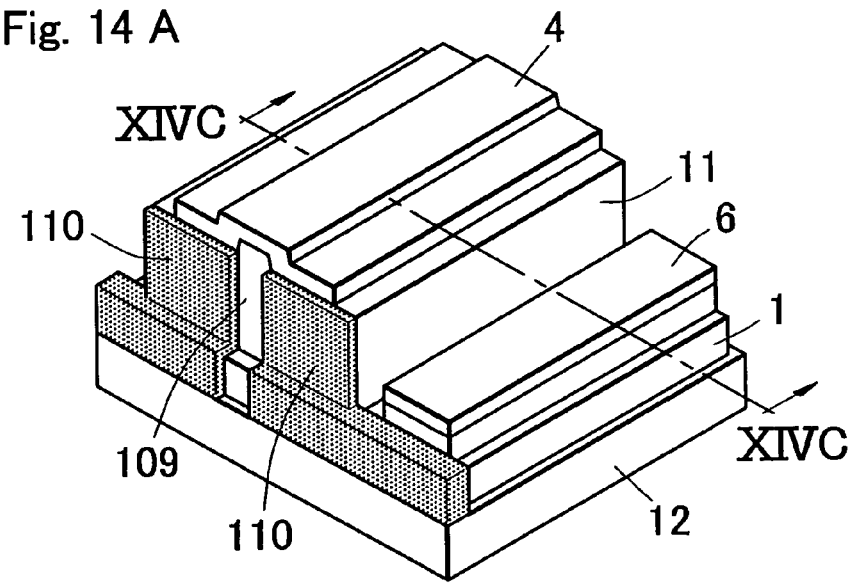
FIG. 14A is a perspective view of a semiconductor laser device of an embodiment 3 of the present invention.
FIG. 14B is a perspective view of the first and second protective membranes in an embodiment 3.
FIG. 14C is a cross-sectional view along the XIVC-XIVC line in FIG. 14A.
Figure 14:
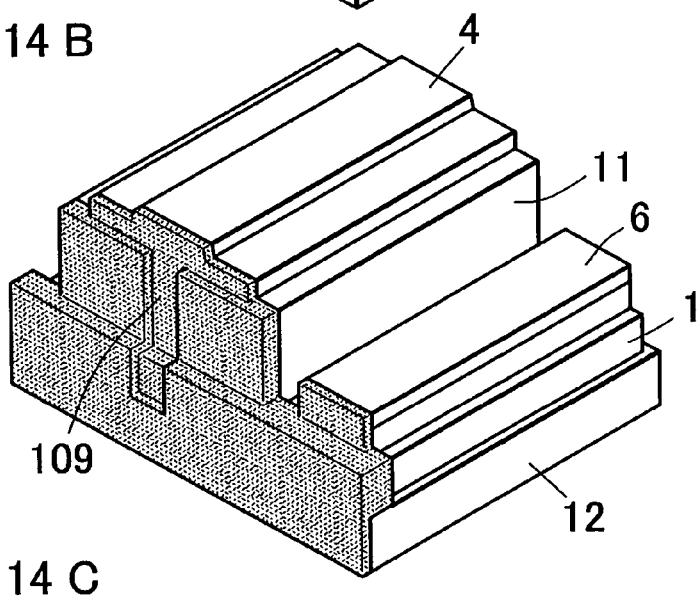
Figure 14:
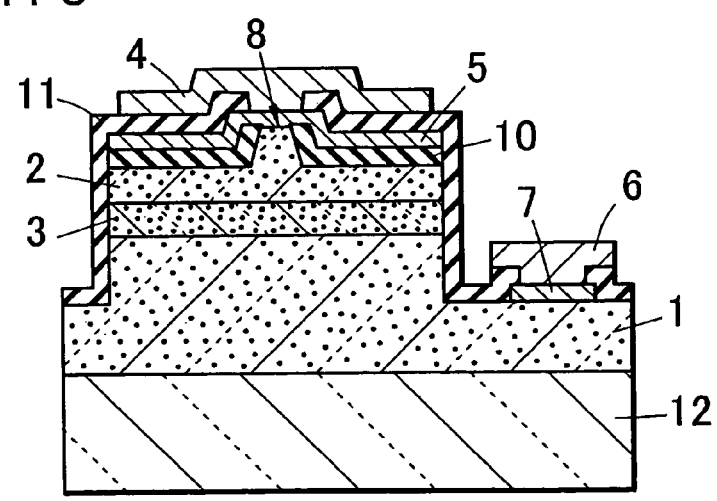

The semiconductor laser device of an embodiment 3 of the present invention has at least two protective membranes (first protective membrane 109, and a second protective membrane 110 having the lower transmittance than that of the protective membrane 109) having the different light transmittance on an end in a direction vertical to a light resonating direction, and controls release of the light from an end by provision of two protective membranes having the different light transmittance on an end. Specific forms are shown in FIGS. 14A to 14C. In a view of the figure in an embodiment 3, the same parts as those of an embodiment 1 are shown by attaching the same symbols. FIG. 14C is an XIVC-XIVC cross-sectional view of FIG. 14A. In the present embodiment 3, as shown in FIG. 14C, a stripe-like convex part (ridge) 8 is provided in a laminate structure in which a first conductive type semiconductor layer (n-type nitride semiconductor layer) 1, an active layer 3, and a second conductive type semiconductor layer (p-type nitride semiconductor layer) 2 are laminated on a substrate 12 and, by providing a resonator end on both ends vertical to a longitudinal direction on a stripe, a waveguide region is formed in which a stripe direction is a directing direction (resonating direction). One of resonator ends is a light emitting side resonator end (light emitting plane) having the function of mainly emitting the light to the outside, and the other is a light reflection side resonator end (monitor end) having the function of mainly reflecting the light in a waveguide region. A first insulating membrane 10 is formed on a side of a stripe-like convex part (ridge) 8 and on an upper plane of a laminate structure continuing to this side. A stripe-like p-side ohmic electrode 5 which is ohmic contact with a p-type nitride semiconductor layer is provided on an upper plane of a convex part 8 of a p-type nitride semiconductor layer 2 via a first insulating membrane 10. In addition, in an n-type nitride semiconductor layer which is exposed along a laminate structure, an n-side ohmic electrode 7 which ohmic-contacts with an n-type nitride semiconductor layer is formed in a stripe-like manner. Both electrodes are provided generally parallel. On these electrodes, a second insulating membrane 11 having an opening is further provided, and a p-side pad electrode 4 and an n-side pad electrode 6 are formed, respectively, so as to contact with an ohmic electrode via this second insulating membrane 11.

In the semiconductor laser device of the present embodiment 3, by providing a protective membrane having the light transmittance on an end in a direction vertical to a light directing direction of a waveguide region, release of the light is controlled. In particular, by providing a first protective membrane 109 having the high light transmittance on an emitting part of a resonator plane on an emitting side, deterioration of a resonator plane is prevented and, at the same time, the laser light is easily emitted. In addition, by providing a second protective membrane 110 having the lower light transmittance than that of a first protective membrane 109 on both sides of an emitting part in a resonator plane on an emitting side, stray light is not released from the vicinity of an emitting plane. Thereby, in the semiconductor laser device of the present embodiment 3, stray light release of stray light to the outside can be prevented and occurrence of a ripple can be suppressed.

In the thus structured laser device of an embodiment 3, the light generated from a light emitting region containing an active layer is directed mainly in a waveguide region and emitted through an end of a waveguide region (emitting plane) in a resonator plane to become the laser light (main beam). However, when a resonator plane on an emitting side is exposed, the emitting plane is easily deteriorated at high output and COD is easily produced. In addition, a part of the light is exuded from a waveguide region to become stray light which is transmitted in a device and released through parts other than an emitting plane to the outside. Overlapping of this with a main beam generates a ripple. Here, the light, stray light which is released to the outside is the light transmitted to a device end at an angle at which total reflection does not occurs. The totally reflected stray light is reflected again toward the inside of a device and reflection is repeated in a device until it reaches an end at a total reflection angle. During repetition of reflection, stray light is resonated and amplified. Then, when this amplified stray light is released to the outside, it is mixed in a main beam to generate a ripple. By forming two protective membranes having the different light transmittance on an end as in the present embodiment 3, emission of the light can be controlled (the light emitted through parts other than an emitting plane can be suppressed).

In the semiconductor laser device of the present embodiment 3, all or a part of respective protective membranes may be overlapped at a position where two protective membranes having the different transmittance are contacted. By protecting second protective membranes 110 on both sides of an emitting plane in a resonator plane as in FIG. 14A and providing a first protective membrane 109 so as to cover it as in FIG. 14B, a structure is obtained in which only a first protective 109 is formed on an emitting plane and a first protective membrane 109 is laminated on a second protective membrane 110 on both sides of an emitting plane (in the vicinity of an emitting plane). In addition, in the present invention, an end structure on an emitting side is structured as in an embodiment 1 and, as shown in FIG. 17B, a first protective membrane 109 may be provided on a wide range of a resonating end, a non-resonating end and whole end side of a second side, and a second protective membrane 110 may be provided thereon except for a resonator end.

Like this, if a part where a first protective membrane 109 and second protective membrane 110 are overlapped is a part other than an emitting plane on an emitting side, any one of the protective membrane 109 and the second protective membrane 110 may be formed first. Preferable order can be selected for formation, depending on a material for a protective membrane and the like. In addition, by formation by overlapping, formation can be performed so that a semiconductor layer is not exposed at the boundary.

Figure 15:
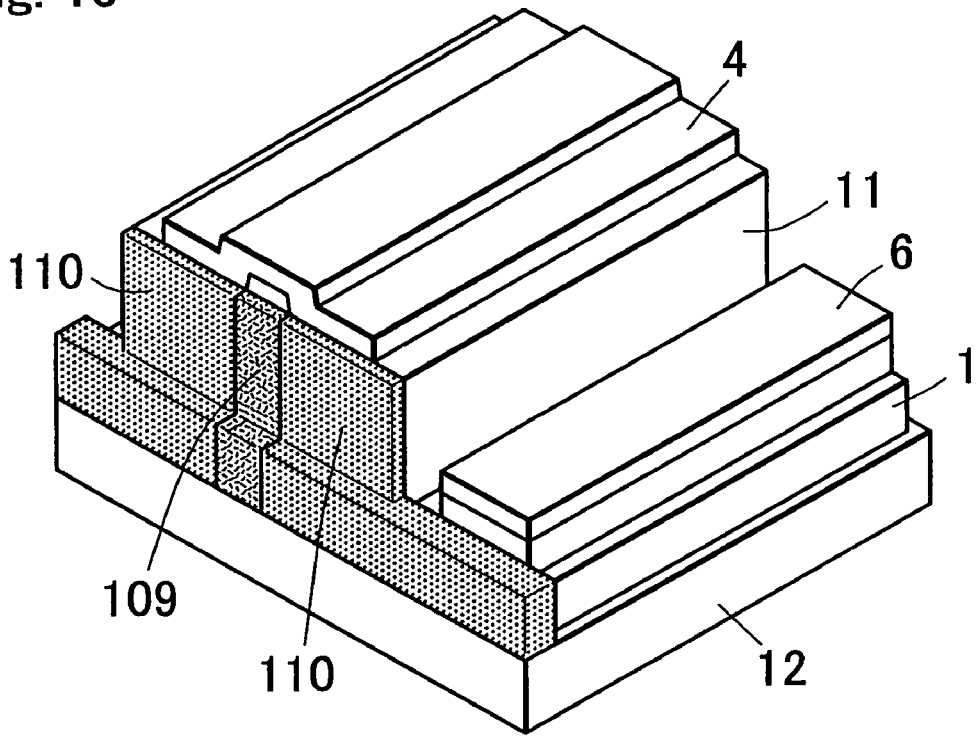
FIG. 15 is a perspective view of a semiconductor laser device which is an alteration example in an embodiment 3.

In addition, in the present invention, as shown in FIG. 15, a first protective membrane 109 and a second protective membrane 110 can be made not to be overlapped with each other. By such the provision, a difference in respective light transmittances can be effectively utilized and, by no overlapping part, since a thickness of a membrane does not grow large, a main beam becomes difficult to be physically blocked.

Figure 16:
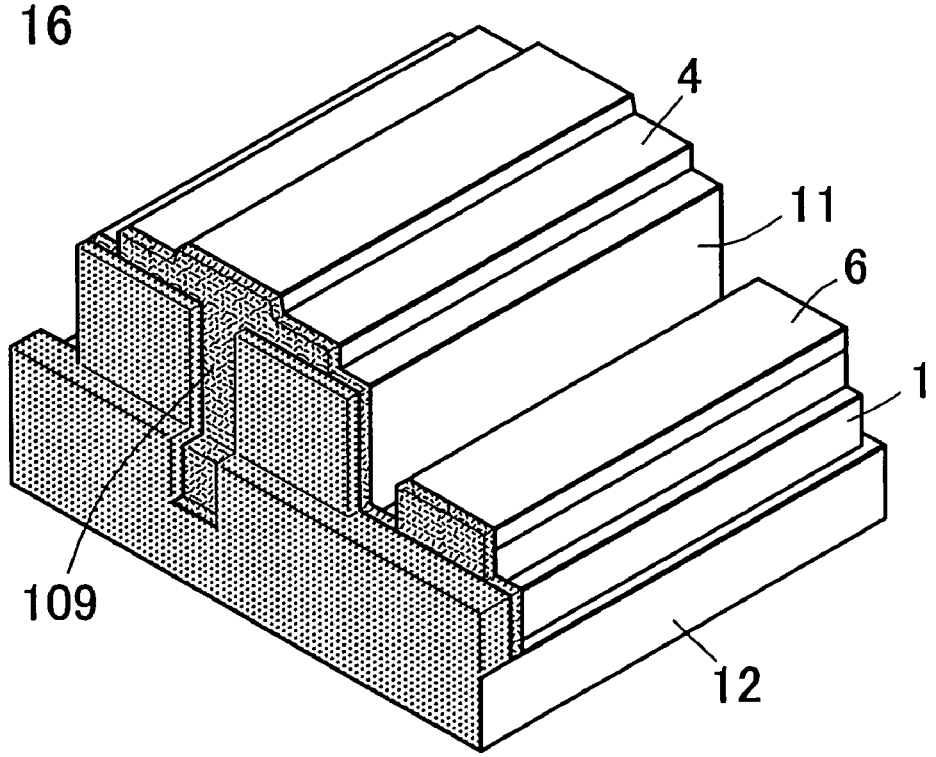
FIG. 16 is a perspective view of a semiconductor laser device which is another alteration example in an embodiment 3.

In addition, an end may be formed in which neither a first protective membrane 109 nor a second protective membrane 110 is provided. In the case where a protective membrane is formed and, thereafter, it is divided and an end appears depending on a step, for example, as in FIG. 16, neither of protective membranes is not formed on an end of a substrate 12. However, since it is isolated from a part through which the laser light is emitted, there is no problem.

In addition, when a ripple of the laser light emitted through a resonator plane is small, a first protective membrane 109 having the high light transmittance may be provided on a resonator plane on an emitting side, a second protective membrane 110 which is the same as the first protective membrane 109 may be used.

As described above, in the present embodiment 3, by providing two protective membranes having the different light transmittance on an end of a resonator plane, a light emitting part is limited to a prescribed range to control release and, thus, better FFP can be stably obtained. In the present embodiment 3, better FFP can be stably obtained without processing a device itself as in an embodiment 1 and without influencing on the beam properties.

Embodiment 4

As shown in FIG. 17A, FIG. 17B, FIG. 18A and FIG. 18B, the semiconductor laser device of the present embodiment 4 is obtained y applying a first protective membrane 109 and a second protective membrane 110 of an embodiment 3 to a semiconductor laser device having the same end structure as that explained for an embodiment 2, in which both sides of a resonator end are removed below an active layer in the vicinity of a light emitting side resonator plane and a corner part of a laminate structure is removed. That is, in the semiconductor laser device of an embodiment 4, an end in a direction vertical to a light directing direction of a stripe-like waveguide region of a laminate structure is not a single plane, and is composed of a resonator end which is a light emitting plane, and a non-resonator end which is situated on a plane different from the resonator end. In addition, even when seen from a plane (side) parallel with a light directing direction of a stripe-like waveguide region of a laminate structure, a first side having an active layer cross-section isolated from a waveguide region, and a second side having an active layer cross-section which is situated at a position nearer a waveguide region, are formed. And, a first protective membrane 109 is provided on a resonator plane which is an emitting plane (FIG. 17B) and, at the same time, a second protective membrane 110 is provided on a non-resonator plane and a second side (FIG. 17A). Specifically, at least a second protective membrane 110 is provided on a non-resonator plane containing an active layer cross-section which is not on the same plane as a resonator end, and on a second side nearer a waveguide region, and a first protective membrane 109 is provided so as to cover both of a resonator end and a second protective membrane 110.

Like this, in the present embodiment 4, a second protective membrane having the low light transmittance is provided on a second side near a waveguide region and on a non-resonating end, whereby, the light is difficult to be released, and a first protective membrane having the high light transmittance is formed on a resonator plane on an emitting side, whereby, the laser light is effectively emitted and, at the same time, release of stray light is prevented.

In addition, in the semiconductor laser device of the present embodiment 4, by limiting a width of an active layer on an emitting side as in an embodiment 1, the beam properties can be also improved. In the present embodiment 4, since processing of a device itself is necessary before first and second protective membranes are provided on the surface of a device, the workability is superior in an embodiment 3. However, a beam having a wide divergence angle can be obtained by controlling a width of an active layer and, thus, the beam properties can be improved, leading to the advantage which is not harbored by an embodiment 3. Further, since a second protective membrane 110 can be provided in front of a resonator plane, a ripple can be more effectively reduced.

In addition, as in an embodiment 1, the semiconductor laser device of the present embodiment 4 may be formed so that a side wall (side) of a ridge and a second side are on the same plane. However, when a ridge is thinly formed, since it becomes difficult to confine the light in a width of the ridge and the better properties can not be obtained, it is preferable that a second side is formed so that a width of an active layer is larger than that of a stripe-like convex part (ridge) as in FIG. 17 and FIG. 18. In addition, since the strength can be enhanced by rendering a width of an active layer of an end on an emitting side larger than that of a ridge, breakage hardly occurs and a resonator plane can be stably formed. In particular, in the case where a width of a ridge is formed narrowly, when a width of an active layer cross-section exposed on an emitting plane is made narrow corresponding to a width of a ridge, a resonator plane is not cleaved at a desired position but is broken when the plane is formed by cleavage. However, by exposing an active layer cross-section having a larger width than that of a ridge on an emitting plane, a resonator plane can be stably cleaved.

In the case where a second protective membrane in the present invention is applied to an end structure in which both of a resonator end and a second side are provided, when the protective membrane is provided on both, the protective membrane is effective. However, the protective membrane may be provided only on one of them, or it may be provided continuously. In addition, a second protective membrane may be formed on a plane (slant face) which is formed over a resonator end and a first side.

In addition, a non-resonator plane and a second side may be variously changed as explained in an embodiment 1.

In addition, it is enough that a second protective membrane is provided so as to cover at least a layer through which the light is transmitted. Therefore, it may be provided so as to cover at least an active layer, and it may not be formed on the whole plane containing an active layer. It is preferable that a second protective membrane is provided also in a layer through which the light is easily transmitted due to formation of a guiding layer and the like.

A preferable material for a first protective membrane 109 and a second protective membrane 110 in embodiments 3 and 4 will be described below.

As a material used in a first protective membrane and a second protective membrane, any one of a conductor, a semiconductor and an insulator may be used. However, when a conductor is used, it is necessary that a conductor is provided so as not to contact directly with an electrode, in order to prevent short circuit and in order not to block the current flow in a device structure. In addition, when a semiconductor is used, a first protective membrane having a larger band gap than that of an active layer is preferable. In addition, it is preferable to use a second protective membrane having a smaller band gap than that of an active layer. The most preferable materials among these materials can be selected depending on a structure of a device, a manufacturing step, a manufacturing process and the like.

In addition, as a first protective membrane, a dielectric multi-layered membrane may be used. Thereby, the function of allowing the light to be easily transmitted and protecting an exposed end, in particular, an active layer is accompanied therewith.

In addition, as a specific material used in a first protective membrane and a second protective membrane, there are materials described below. Among them, a material having the higher light transmittance is used as a first protective membrane, and a material having the lower light transmittance than that of a first protective membrane is used as a second protective membrane. However, since first and second protective membranes are selected by comparing the light transmittances of them, a material for a first protective membrane is used as a second protective membrane in some cases by combining with another material, depending on a selected material.

That is, it goes without saying that a part through which the laser light is mainly emitted is an end of a waveguide region. In the present specification, this end of a waveguide region is used as an emitting plane or an emitting part. For example, in an embodiment 1, a resonator end itself with a limited width is an emitting plane. However, when an emitting side end is composed of a single plane as in an embodiment 3, a part which is to be an end of a waveguide region among the single plane is an emitting part or an emitting plane.

In contrast to the laser light which is radiated through this emitting part, the light which is radiated though parts other than an emitting part is the light having the adverse effect on a shape of a laser beam, and has the extremely small intensity as compared with the light which is radiated through an emitting part. Therefore, simply by rendering the transmittance of a second protective membrane slightly smaller as compared with the transmittance of a first protective membrane, the light which is radiated through parts other than an emitting part is significantly reduced, and the adverse effect on a shape of a laser beam is suppressed.

Therefore, in the laser devices in embodiments 3 and 4, as materials for a first protective membrane and a second protective membrane, various materials can be selected at least under the condition that the transmittance of a first protective membrane is larger than the transmittance of a second protective membrane.

(First Protective Membrane)

As a preferable material for a first protective membrane, any one selected from compounds such as oxides, nitrides and fluorides of Si, Mg, Al, Hf, Nb, Zr, Sc, Ta, Ga, Zn, Y, B and Ti, or a multi-layered membrane composed of them can be used. These may be used alone, or may be used in combination thereof. A preferable material includes materials using Si, Mg, Al, Hf, Zr, Y and Ga. In addition, as a semiconductor material, AlN, AlGaN and BN can be used. As an insulating material, compounds such as oxides, nitrides, fluorides and the like of Si, Mg, Al, Hf, Nb, Zr, Sc, Ta, Ga, Zn, Y and B can be used.

In addition, by structuring a first protective membrane with a material having the refractive index between the refractive index of the air and the refractive index of a semiconductor, the membrane can be used as an anti-reflection (AR) membrane and, thus, reflection of the light can be prevented. When used as an AR membrane, it is suitable that the relationship between the refractive index $n_{AR}$ of a first protective membrane and the refractive index $n_S$ of a semiconductor device which is a laminate structure satisfies: $0.75\ n_S^{1/2} \leq n_{AR} \leq 1.25\ n_S^{1/2}$. Preferably, $0.85\ n_S^{1/2} \leq n_{AR} \leq 1.15\ n_S^{1/2}$, most preferably $0.93\ n_S^{1/2} \leq n_{AR} \leq 1.07$. As a material having such the refractive index, there are $Al_2O_3$, $MgO$, $Y_2O_3$, $SiO_2$, $MgF_2$ and the like. The AR membrane is obtained by these materials and controlling a thickness thereof. In order to obtain the AR membrane, a thickness preferably satisfies the condition: $\lambda \times (2m_{AR}-1)/4n_{AR}$, or $\lambda \times m_{AR}/2n + \lambda \times (2m_{AR}-1)/4n_{AR}$ ($m_{AR}=1, 2, 3, \ldots$), more preferably the thickness is $\lambda/4n_{AR}$, or $\lambda/2n + \lambda/4n_{AR}$ ($\lambda$: wavelength of the light generated from an active layer). By forming a protective membrane so as to satisfy such the condition, the AR membrane can be easily obtained.

In addition, when a conductive material such as metal materials is used, an insulating layer may be formed on the surface of a laminate structure, and the material may be formed on the insulating layer. Thereby, even a material having the poor adherability with a laminate structure can be used as a material for a first protective membrane.

In addition, when the present invention focuses on protection of an emitting plane, it is preferable that a first protective membrane is structured using a material having a refractive index difference which is within ±10% of the refractive index of a laminate structure. In addition, by forming a first protective membrane of a material having the refractive index near that of a semiconductor layer (mainly active layer) constituting a waveguide region, a membrane (absent layer) in which the reflectivity and the transmittance of the light are not changed even when a thickness of a first protective membrane is changed more or less.

For example, when a laminate structure is a nitride semiconductor device, the refractive index of an active layer in which a wavelength is set to be about 400 nm is about 2.5 (provided that, actually, the refractive index varies more or less depending on the concentration of the impurity and a constituent ratio). In this case, a preferable refractive index of a first protective membrane is ±10% of 2.5, being 2.25 to 2.75. Specific examples of a material having the refractive index in this range include $Nb_2O_5$ and the like. When the refractive index is within ±10% of that of a laminate structure, a laminate structure can be protected while the properties of the emitted light are scarcely changed. A material having the refractive index which is higher than 10% of that of a laminate structure can reduce a threshold but deteriorates the slope efficacy. On the other hand, a material having the refractive index which is lower than the 10% improves the slope efficacy but increases a threshold, being not preferable.

Figure 19:
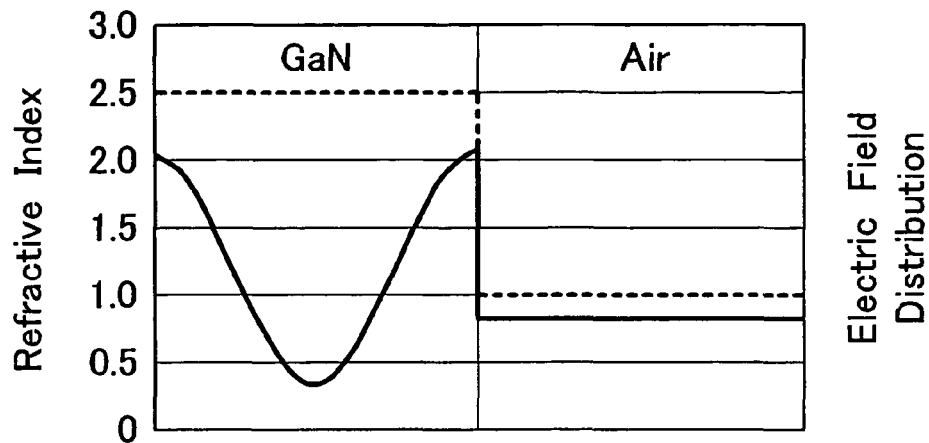
FIG. 19A is a graph showing a refractive index distribution and an electric field intensity distribution in the case where a first protective membrane in not formed on an emitting plane, which graph is shown for comparing with a semiconductor laser device of an embodiment 4.
FIG. 19B is a graph showing a refractive index distribution and an electric field intensity distribution in the case where a first protective membrane comprising $Al_2O_3$ is formed on an emitting plane, in a semiconductor laser device of an embodiment 4.
FIG. 19C is a graph showing a refractive index distribution and an electric field intensity distribution in the case where a first protective membrane comprising $Nb_2O_5$ is formed on an emitting plane, in a semiconductor laser device of an embodiment 4.
Figure 19:
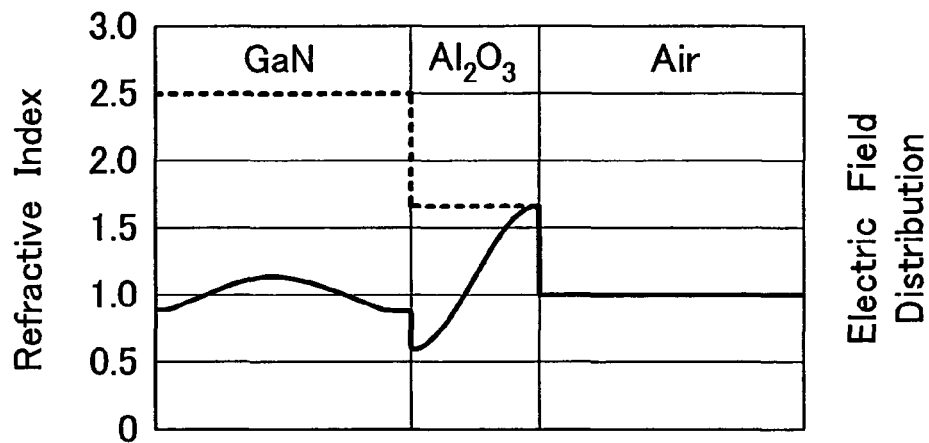
Figure 19:
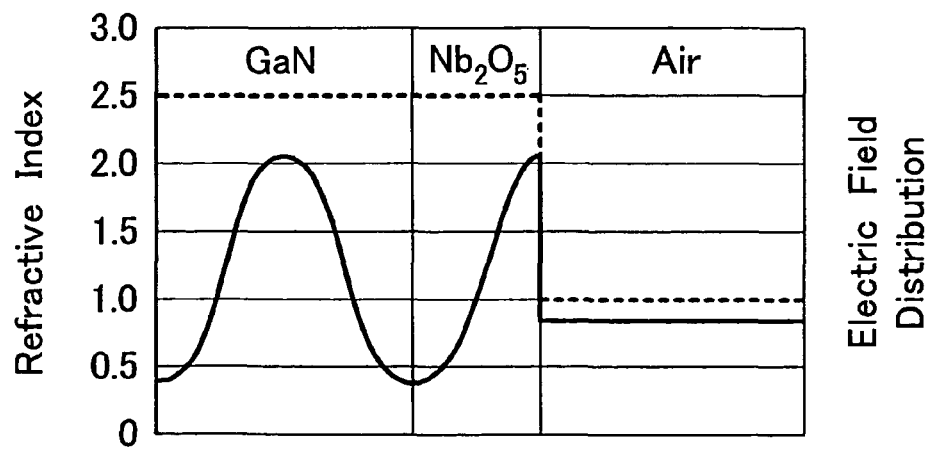

Here, electric field intensity distributions in the case of where a first protective membrane is not formed on an emitting plane of a resonator plane and the case where the protective membrane is formed, are shown in FIGS. 19A to 19C. As a laminate structure, a semiconductor device comprising gallium nitride (GaN) is used. FIG. 19A shows the case where a protective membrane is not formed, FIG. 19B shows the case where $Al_2O_3$ is formed mainly for the purpose of preventing reflection, and FIG. 19C shows the case where $Nb_2O_5$ is formed mainly for the purpose of protecting an emitting end. In addition, a broken line shows a refractive index distribution, and a solid line shows the electric field intensity (light power distribution).

As seen from FIG. 19A, when a first protective membrane is not formed, the electric field intensity is maximum at a device end. This is because a device end is contacted with a layer having the low refractive index (air layer: refractive index 1). In such the case, the electric field intensity becomes maximum at the interface. For this reason, an excess load is applied to a resonator plane and, as a result, there arises a problem that COD easily occurs.

To the contrary, when $Al_2O_3$ is formed as a first protective membrane, in the electric field intensity, a load applied to a device end is smaller as compared with the case where a first protective membrane is not formed, as shown in FIG. 19B. Such the protective membrane can reduce a load applied to a resonator plane by controlling a thickness so as to be an AR membrane. Conversely, there arises the phenomenon that RIN (relative intensity of noise) properties are deteriorated and the noise is slightly increased. For this reason, such the device can be used for a particular utility where influence of IRN is small, such as high output utility.

In addition, when $Nb_2O_5$ is used as a first protective membrane to be formed on a resonator plane, since the electric field intensity at a device end can be lowered as shown in FIG. 19C, a load applied to an end can be suppressed to prevent deterioration. In addition, $Nb_2O_5$ has almost the same refractive index as that of GaN, the reflectivity of an end (surface of a first protective membrane) is not lowered as in $Al_2O_3$ and, thus, deterioration of the RIN properties can be prevented. For this reason, it is preferable that such the device is used in utility attaching greater importance to the safety, e.g., the fields dealing optical disc such as DVR.

In addition, since a protective membrane has various properties depending on a refractive index and a thickness, it is preferable that a thickness of a first protective membrane is $\lambda/4n$ or odd-fold of the same. Thereby, damage applied to a resonator plane can be reduced. As described above, by taking this and the refractive index into consideration, an AR membrane can be obtained. However, it is preferable that a thickness is $\lambda/4n$ irrespective of the refractive index. In the case of a single layer, a thickness may be $\lambda/4n$ and, in the case of a multi-layered membrane, a thickness may be $\lambda/2n+\lambda/4n$ or real number-fold of the same. Thereby, since such a thickness is obtained that the electric field intensity of a standing wave takes a minimum at the interface between a laminate structure end and a protective membrane (see FIG. 19C), damage to a resonator end can be suppressed, and the device life can be improved.

Described above, control of a thickness of a protective membrane can be applied not only to a resonator plane on a light emitting side but also to a protective membrane (mirror) formed on a light reflecting side (monitor side). For emission of the laser light, since the properties are deteriorated even when one of resonators is deteriorated, deterioration can be prevented and the device life can be improved by controlling a thickness of a protective membrane (mirror) so that a device does not undergo damage due to the light from an active layer also on a light reflecting side, as in a light emitting side.

(Second Protective Membrane)

As a material for a second protective membrane, there are materials using Ni, Cr, Ti, Cu, Fe, Zr, Hf, Nb, W, Rh, Ru, Mg, Ga, Pt, Au, Si, Pd, V, Ta, Mo, C and the like, more preferable are materials using Ni, Cr, Ti and Si. In addition, as a semiconductor material, Si, InGaN, GaAs and InP can be used. As an insulating material, $TiO_2$ and $CrO_2$ can be used. It is preferable that, a shading membrane through which the light is hardly transmitted is formed using these materials. As a specific preferable material, Ti, $TiO_2$, $SiO_2$, RhO and $ZrO_2$ are preferable, and these may be formed as a single-layered membrane or a multi-layered membrane. In order to form these at a desired position, various methods such as vapor deposition, sputtering and the like can be used.

Herein, in the present invention, the light transmittance is a relative value relative to the output of the laser light emitted from a waveguide region when a protective membrane is not formed, and the higher value shows the higher light transmittance. In addition, when the light transmittance is almost 0% and the light is almost blocked, it is regarded as a shading membrane. This light transmittance varies even in the same material, depending on a thickness. In addition, even in the different refractive index, the light transmittance becomes almost the same magnitude from a balance between a thickness, in some cases.

In addition, a thickness of a second protective membrane varies depending on a material, but it is preferably 200 Å or more when a conductive material is used. This second protective membrane is a membrane allowing the light to be emitted to the outside with difficulty and, therefore, an object can be easily attained when a thickness is made to be large. However, in order not to block the light emitted from an emitting plane and in order to block the light, a thickness is preferably around 1500 Å to 3000 Å. However, when a conductive material is used as a second protective membrane, it is necessary that an insulating membrane is formed between a device and a second protective membrane. In this case, a thickness of an insulating membrane does not matter as long as the insulating property can be maintained. In addition, the light transmittance does not particularly matter. In addition, when a dielectric multi-layered membrane is used as a second protective membrane, the light transmittance can be controlled by forming a membrane having the low refractive index at a thickness of $\lambda/4n$ and forming a membrane having the high refractive index thereon at a thickness of $\lambda/4n$.

In addition, as a preferable combination of a first protective membrane and a second protective membrane, $Nb_2O_5$ is used as a first protective membrane on an emitting plane of a resonator plane, and a shading membrane is used as a second protective membrane in the vicinity of a resonator plane except for an emitting plane. As a shading membrane, metal materials and compounds thereof are preferable. As a specific material, Ti, $TiO_2$, $SiO_2$, RhO and $ZrO_2$ are preferable, and these may be formed as a single-layered membrane or a multi-layered membrane. By selecting such the materials, a semiconductor laser device which suppresses deterioration of a resonator plane and has little ripple can be obtained.

A waveguide region can be formed according to the same manner as that for an embodiment 1 and the like.

In addition, in order to adopt a longitudinal direction of a stripe-like convex part as a resonating direction, a pair of resonator planes provided on an end are a flat plane formed by cleavage or etching. A method for forming a resonator plane varies depending on a kind of a substrate described later.

When the same kind of substrates are used, for example, when a laminate structure comprising a gallium nitride series compound semiconductor layer is formed on a gallium nitride substrate, a resonator plane can be easily formed by cleavage. However, when a laminate structure is formed on different substrates, for example, when a gallium nitride series compound semiconductor layer is formed on a sapphire substrate, a cleavage plane for a substrate is not consistent with a cleavage plane for a semiconductor layer thereon depending on a main plane of a substrate, and a resonator plane is hardly obtained. In such the case, it is preferable that a resonator plane is formed by etching. In addition, when a resonator plane is formed by etching, if etched deep until a substrate is exposed, a plane is roughened in some cases and, therefore, a better resonator plane is obtained by etching to a depth at which at least a waveguide region is exposed. However, in order to make division of a device easy, it is preferable to etch until a substrate is exposed. However, when an end is processed by etching, an end of a single plane is not obtained as in a cleaved resonator plane, and a difference in level is generated as in FIG. 14. In particular, since increase in etching time increases a difference in level to that extent and, in that case, it is necessary that a part protruding more than a resonator plane does not block the emitted light. In addition, both of resonator planes may be formed by the same method such as cleavage and etching, or may be formed by a different method. For example, one of them is cleaved and the other is etched. The method can be appropriately selected depending on an object.

In addition, a stripe-like convex part can be formed according to the same manner as that for an embodiment 1 and the like, various substrates shown in embodiments 1 to 3 can be applied.

Further, various kinds of laminate structures and semiconductor layers constituting the structures explained in an embodiment 1 and the like can be used.

Still further, when the same structure on an emitting end side for an embodiment 1 is applied, a method for forming a non-resonator plane and a second side explained in embodiments 1 to 3 can be applied.

EXAMPLES

In the present invention, as a structure of each layer of a first conductive type semiconductor layer, an active layer and a second conductive type semiconductor layer which constitute a laminate structure, various layer structures can be used. As a specific structure of a device, for example, there are device structures described in examples below. In addition, an electrode, an insulating membrane (protective membrane) and the like are not particularly limited, but various ones can be used. In the case of a nitride semiconductor laser device, as a method for growing a nitride semiconductor, all the known methods for growing a nitride semiconductor can be used, such as MOVPE, MOCVD (metal organic chemical vapor deposition), HVPE (halide vapor phase epitaxy), MBE (molecular beam epitaxy) and the like.

A semiconductor laser device using a nitride semiconductor will be explained below, but it goes without saying that the semiconductor laser device of the present invention is not limited thereto and can be applied to various laser devices in the technical concept of the present invention.

Example 1

In an example 1, a heterogeneous substrate different from a nitride semiconductor is used as a substrate. However, in the present invention, a substrate comprising a nitride semiconductor such as a GaN substrate may be used. Here, as a heterogeneous substrate, for example, substrate materials which can grow a nitride semiconductor can be used, such as sapphire, spinel, ZnS, ZnO, GaAs, Si and SiC having either of C plane, R plane and A plane as a main plane, oxide substrates which are lattice-matched with a nitride semiconductor, and the like. Preferable examples of a heterogeneous substrate include sapphire and spinel. In addition, a heterogeneous substrate may be offangle and, in this case, when step-wisely offangled substrate is used, growth of a ground layer comprising gallium nitride can be performed with the better crystallinity, being preferable. Further, when a heterogeneous substrate is used, a device structure having a single substance substrate of a nitride semiconductor may be formed by growing a nitride semiconductor which is to be a ground layer before formation of a device structure, on a heterogeneous substrate and, thereafter, removing a heterogeneous substrate by a method such as grinding, or alternatively, a heterogeneous substrate may be removed after formation of a device structure. In the case where a heterogeneous substrate is used, when a device is formed via a buffer layer and a ground layer, a nitride semiconductor having the better crystallinity can be grown.

A semiconductor laser device of the example 1 will be explained below in a manufacturing step order.

(Buffer Layer)

A two inch φ heterogeneous substrate comprising sapphire having a C plane as a main plane is set in a MOVPE reactor, a temperature is set at 500° C., and a buffer layer comprising GaN is grown at a thickness of 200 Å using trimethylgallium (TMG) and ammonia ($NH_3$).

(Ground Layer)

After formation of a buffer layer, a temperature is set at 1050° C., and a nitride semiconductor layer comprising undoped GaN is grown at a thickness of 4 μm using TMG and ammonia. This layer acts as a ground layer (growth substrate) in growing each layer which forms a device structure. Besides, when a nitride semiconductor grown by ELOG (Epitaxially Laterally Overgrowth) is used as a growth substrate, a ground layer (growth substrate) having the better crystallinity is obtained. As a specific example of the ELOG-grown layer, there is the following method.

Embodiment 1 of ELOG-Grown Layer

A nitride semiconductor layer is grown on a heterogeneous substrate, and a protective membrane comprising a material (on the surface of which a nitride semiconductor is not grown at all or hardly grown) is provided in a stripe-like manner so that openings are formed at a constant interval. A mask region in which a mask is formed like this, and a non-mask region in which the surface of a nitride semiconductor is exposed for growing a nitride semiconductor, are provided alternately and, by growing a nitride semiconductor starting from the non-mask region to perform lateral growth so as to cover a mask in addition to growth in a thickness direction, a nitride semiconductor is grown also on a mask region to form a membrane so as to cover the whole.

Embodiment 2 of ELOG-Grown Layer

Openings are provided at a constant interval on a nitride semiconductor layer grown on a heterogeneous substrate, and a nitride semiconductor is grown laterally starting from a nitride semiconductor on the opening side, to a nitride semiconductor layer which covers the whole.

Next, each layer constituting a laminate structure is formed on a ground layer comprising a nitride semiconductor.

(N-Type Contact Layer)

An n-type contact layer comprising GaN doped with Si at $1\times10^{18}/cm^3$ is grown at a thickness of 4.5 μm at 1050° C. on a ground layer (nitride semiconductor substrate) using TMG, ammonia, and a silane gas as an impurity gas.

(Crack Preventing Layer)

Then, a temperature is set at 800° C., and a crack preventing layer comprising $In_{0.06}Ga_{0.94}N$ is grown at a thickness of 0.15 μm using TMG, TMI (trimethylindium) and ammonia. This crack preventing layer may be omitted.

(N-Type Cladding Layer)

Then, a temperature is set at 1050° C., an A layer comprising undoped AlGaN is grown at a thickness of 25 A using TMA (trimethylaluminium), TMG and ammonia as a raw material gas, subsequently TMA is stopped, and a B layer comprising GaN doped with Si at $5\times10^{18}/cm^3$ is grown at a thickness of 25 A using a silane gas as an impurity gas. These procedures are repeated 160 times, respectively, to laminate an A layer and a B layer alternately, and an n-type cladding layer comprising a multi-layered membrane (superlattice structure) having a total thickness of 8000 Å is grown. Upon this, when a crystal mixing ratio of Al for undoped AlGaN is in a range of not less than 0.05 and not more than 0.3, a difference in refractive index which sufficiently functions as a cladding layer can be set.

(N-Type Light Guiding Layer)

Then, an n-type light guiding layer comprising undoped GaN is grown at a thickness of 0.1 μm at the same temperature using TMG and ammonia as a raw material gas. This layer may be doped with an n-type impurity.

(Active Layer)

Then, a temperature is set at 800° C., and a barrier layer comprising $In_{0.05}Ga_{0.95}N$ doped with Si at $5\times10^{18}/cm^3$ is grown at a thickness of 100 Å using TMI (trimethylindium), TMG and ammonia as a raw material, and a silane gas as an impurity gas. Subsequently, a silane gas is stopped, and a well layer comprising undoped $In_{0.1}Ga_{0.9}N$ is grown at a thickness of 50 Å. These procedures are repeated three times and, finally, a barrier layer is laminated to grow an active layer of a multiple quantum well structure (MQW) having a total thickness of 550 Å.

(P-Type Cap Layer)

Then, a p-type electron confining layer comprising AlGaN doped with Mg at $1\times10^{19}/cm^3$ is grown at a thickness of 10 Å at the same temperature using TMA, TMG and ammonia as a raw material, and $Cp_2Mg$ (cyclopentadienylmagnesium) as an impurity gas.

(P-Type Light Guiding Layer)

Then, a temperature is set at 1050° C., and a p-type light guiding layer comprising undoped GaN is grown at a thickness of 750 Å using TMG and ammonia as a raw material gas. This p-type light guiding layer is grown undoped, but may be doped with Mg.

(P-Type Cladding Layer)

Subsequently, a layer comprising undoped $Al_{0.16}Ga_{0.84}N$ is grown at a thickness of 25 A at 1050° C., TMG is stopped, and a layer comprising Mg-doped GaN is grown at a thickness of 25 A using $Cp_2Mg$, to grow a p-type cladding layer of a superlattice layer having a total thickness of 0.6 μm. At least one of p-type cladding layers contains a nitride semiconductor layer containing Al and, when a layer is prepared with a superlattice in which nitride semiconductor layers, each having the different band gap energy, all the impurities are doped more into one of the layers and, there is a tendency that the crystallinity becomes better when so-called modified doping is performed, but both may be doped similarly.

(P-Type Contact Layer)

Finally, a p-type contact layer comprising p-type GaN doped with Mg at $1\times10^{20}/cm^3$ is grown on a p-type cladding layer at a thickness of 150 Å at 1050° C. A p-type contact layer can be structured with p-type $In_xAl_yGa_{1-x-y}N$ ($x\leq0$, $y\leq0$, $X+Y\leq1$) and, preferably by forming GaN doped with Mg, most preferable ohmic contact with a p-electrode is obtained. After completion of the reaction, a wafer is annealed at 700° C. under the nitrogen atmosphere in a reactor to further reduce the resistance of a p-type layer.

(Exposure of an n-Type Layer)

After a laminate structure is formed by growing a nitride semiconductor as described above, a wafer is removed from a reactor, and a protective membrane comprising $SiO_2$ is formed on the surface of an uppermost layer p-type contact layer, which is etched with a $SiCl_4$ gas using RIE (reactive ion etching), to expose the surface of an n-type contact layer on which an n-electrode is to be formed. Upon this, an active layer end which is to be a resonator plane is exposed, and an etching end may be used as a resonator plane. Instead of $SiCl_4$ gas, $Cl_2$ gas may be used as a etching gas.

(Formation of a Stripe-Like Convex Part and a Shading Layer Forming Plane)

Then, in order to form a stripe-like waveguide region, after a protective membrane comprising Si oxide (mainly $SiO_2$) is formed on almost the whole plane of an uppermost layer p-type contact layer at a thickness of 0.5 μm using a CVD apparatus, a mask having a prescribed shape is formed on a protective membrane, and a stripe-like protective membrane is formed by the photolithography technique using a $CHF_3$ gas in the RIE apparatus, to form a stripe-like convex part above an active layer. Thereafter, only the vicinity of a resonator plane of this convex part is further etched to below an active layer using a resist mask to remove a corner part of a device as in FIG. 1 and, thus, a non-resonator plane which is a shading layer forming plane, and a second side are formed.

(Light Non-Transmittable Layer)

A shading layer continuing to a light non-resonator plane, a second side and an exposed plane of an n-type layer is formed by sputtering while the aforementioned protective membrane and resist mask are retained. A shading layer comprises Si, and a thickness thereof is 4000 Å. This shading layer may be formed after a first insulating layer is formed in a post-step. Alternatively, the layer may be formed after an ohmic electrode is formed and a second insulating membrane is formed.

(First Insulating Membrane)

A first insulating membrane comprising $ZrO_2$ is formed on the surface of a p-type layer while the $SiO_2$ mask is retained. This first insulating membrane may be provided on the whole semiconductor layer by masking an n-side ohmic electrode forming plane. In addition, a part on which no insulating membrane is formed is provided for later easy division. This part is provided in a 10 μm stripe-like manner so as to be orthogonal with a convex part. A first insulating membrane is formed, which is soaked in a buffered solution to dissolve and remove $SiO_2$ formed on an upper plane of a stripe-like convex part, and $ZrO_2$ on a p-type contact layer (further on an n-type contact layer) is removed together with $SiO_2$ by a liftoff method. Thereby, an upper plane of a stripe-like convex part is exposed and, thus, a side of a convex part becomes a structure covered with $ZrO_2$.

(Ohmic Electrode)

Then, a p-side ohmic electrode is formed on a first insulating membrane on the most superficial convex part on a p-type contact layer. This p-side ohmic electrode comprises Au and Ni. In addition, a stripe-like n-side ohmic electrode is formed also on the surface of an n-type contact layer which is exposed by etching. An n-side ohmic electrode comprises Ti and Al. After formation of them, each is annealed at 600° C. in the atmosphere at a ratio of oxygen:nitrogen of 80:20, to alloy ohmic electrodes on both p-side and n-side and, thus, the better ohmic properties are obtained.

(Second Insulating Membrane)

Then, a resist is coated on a part of a p-side ohmic electrode and an n-side ohmic electrode on a stripe-like convex part and a second insulating membrane comprising Si oxide (mainly $SiO_2$) is formed on the whole plane, which is lifted off to expose a part of a p-side ohmic electrode and an n-side ohmic electrode. A division position is a position which is situated between previously formed non-resonator planes so as to confront each other and is orthogonal with a stripe-like convex part. A device is divided by cleaving this part. By not forming first and second insulating membranes and electrodes in a stripe-like range of a width of around 10 μm which holds this division position, it becomes easy to perform cleavage and convert a resonator plane into a mirror plane.

(Pad Electrode)

Then, a p-side pad electrode and an n-side pad electrode are formed, respectively, so as to cover the aforementioned insulating membrane. The electrodes comprise Ni—Ti—Au. This pad electrode is in contact with an exposed ohmic electrode in a stripe-like manner.

(Cleavage and Resonator Plane Formation)

A sapphire substrate of a wafer is abraded to 70 μm, which is cleaved in a bar-like manner starting from a substrate side in a direction vertical to a stripe-like electrode, to form a resonator plane on a cleavage plane (11-00 plane, plane corresponding to a side of a hexagonal pillar crystal=M plane). This resonator plane may be formed by etching.

(Mirror Formation)

On the thus formed resonator plane, a dielectric multilayered membrane comprising $SiO_2$ and $ZrO_2$ is formed as a mirror. A protective membrane comprising $ZrO_2$ is formed on a resonator plane on a light reflecting side using a sputtering apparatus and, then, $SiO_2$ and $ZrO_2$ are alternately laminated at three pairs to form a high reflecting membrane. Here, a thickness of a protective membrane, and thicknesses of $SiO_2$ membrane and $ZrO_2$ membrane constituting a high reflecting membrane can be set to a preferable thickness, respectively, depending on an emitting wavelength from an active layer. In addition, nothing may be provided on a resonator plane on a light emitting side, or a first low reflecting membrane comprising $ZrO_2$ and a second low reflecting membrane comprising $SiO_2$ may be formed thereon using a sputtering apparatus. Upon this, a mirror may be formed on a non-resonator plane. Then, a bar is finally cut in a direction parallel with a stripe-like convex part to obtain a semiconductor laser device of the present invention.

In the thus obtained semiconductor laser device, continuous oscillation of an oscillation wavelength 405 nm was confirmed at room temperature and at a threshold 2.0 kA/cm$^2$ and a high output 30 mW. In addition, in FFP, the better beam free of ripple was obtained.

Example 2

In an example 1, a nitride semiconductor substrate comprising GaN which is formed on sapphire (prepared as below) is used as a substrate. First, a two inch φ sapphire substrate having a thickness of 425 μm, a C plane as a main plane and an A plane as an orientation flat plane (hereinafter, referred to as orifla plane) is prepared as a heterogeneous substrate on which a nitride semiconductor is to be grown, and the substrate (wafer) is set in a reactor for MOCVD. Then, a temperature is set at 510° C., and a low temperature-grown buffer layer comprising GaN is grown on a sapphire substrate at a thickness of about 200 Å using hydrogen as a carrier gas, and ammonia and TNG (trimethylgallium) as a raw material gas. Then, a temperature is set at 1050° C., and a ground layer comprising undoped GaN is grown at a thickness of 2.5 μm using TMG and ammonia as a raw material gas. Subsequently, a plurality of stripe-like masks comprising $SiO_2$ having a width of 6 μm are formed parallel in a direction that this wafer is tilted from a direction vertical to an orifla plane (A plane) of a sapphire substrate by Θ=0.3°, so that a distance between masks (mask opening) becomes 14 μm. Then, it is returned to the MOCVD apparatus, and undoped GaN is grown at a thickness of 15 μm. Thereby, GaN selectively grown starting with a mask opening is grown mainly in a longitudinal direction (thickness direction) at a mask opening, and is grown in a transverse direction on a mask and, thus, a ground layer covering a mask and a mask opening is formed (ELOG growth). In the thus grown ground layer, a nitride semiconductor layer grown in a transverse direction can reduce penetration rearrangement. Specifically, in penetration rearrangement, the rearrangement density becomes higher to around $10^{10}/cm^2$ on a mask opening and at an around mask central part where nitride semiconductors grown transversely from both sides of a mask are connected, and the rearrangement density becomes lower to around $10^8/cm^2$ on a mask except for a mask central part.

(Thick Layer)

A substrate having the thus obtained nitride semiconductor is used and, subsequently, a wafer is placed in the HVPE apparatus to grow further undoped GaN on a ground layer at a thickness of about 100 μm (this layer grown at a thickness of about 100 μm is referred to as thick layer).

(Ground Layer)

By growing a nitride semiconductor also in a transverse direction using a stripe-like $SiO_2$ mask as in the ground layer upon preparation of a nitride semiconductor substrate on a nitride semiconductor substrate, a ground layer is grown at a thickness of 15 μm.

(Formation of a Shading Layer Forming Plane)

After formation of a ground layer, the same procedures as those in the example 1 are performed to laminate a semiconductor layer. After lamination to a p-side contact layer, an n-type layer exposing step is performed, and a stripe-like convex part (ridge) having a width of 1.6 μm is formed. Then, by providing a mask having a larger width of that of a ridge and etching to an n-type layer upon formation of a shading forming plane, a second side can be formed on a plane different from a ridge side. Here, by providing a mask having a width of about 7 μm (in which a ridge is situated almost at its center) and etching to an n-type layer near an active layer, a resonator plane is formed in which a width of an active layer of a resonator plane on an emitting plane is about 7 µm. The thus formed etching planes are a non-resonator plane and a second side, both of which are used as a shading layer forming plane.

(Light Non-Transmittable Layer)

A shading layer is formed on the thus formed second side and non-resonator plane and on an exposed plane of an n-type layer by sputtering. First, Rh oxide is formed at a thickness of 500 Å, and the same Rh oxide is formed thereon at a thickness of 1500 Å by changing the sputtering conditions. Like this, by laminating the same material under the different sputtering condition to form a multi-layered membrane, a shading layer excellent in the both properties of the tightness and the light non-transmittability can be obtained. In the example 2, since the mask used for forming a shading layer forming plane is used as it is, a shading layer is formed on a second side, a non-resonator plane, and an exposed plane of an n-type layer. However, even when a shading layer is provided so as to extend to the surface of a p-type layer by changing a mask, there is no problem. By formation of a shading layer also on a part of the surface (upper plane) of a p-type layer, leakage of the light toward an upper direction can be also prevented. In addition, peeling easily occurs in some cases due to formation of an end part of a shading layer on an end and an edge of an upper plane. However, by provision continuing to an upper plane, a shading layer can be formed with the better tightness, and the stable beam properties can be obtained.

(Peeling of a Heterogeneous Substrate)

Thereafter, the same procedures as those in the example 1 are performed by formation of a pad electrode and, before cleavage, a part of a sapphire substrate, a low temperature-grown buffer layer, a ground layer and a thick layer is removed to obtain a GaN substrate. The GaN substrate is formed such that a thickness thereof is about 80 µm. Here, other nitride semiconductors other than GaN may be used in a thick layer according to HVPE. However, in the present invention, it is preferable to use GaN or AlN on which a nitride semiconductor having the better crystallinity and a large thickness can be easily grown. In addition, in removal of a heterogeneous substrate and the like, a part of a thick layer may be removed before formation of the aforementioned device structure, or removal may be performed at any stage after formation of a waveguide, or after formation of an electrode. In addition, by removing a heterogeneous substrate before a wafer is cut into bar-like or chip-like, upon cutting into chip-like, cutting and cleavage can be performed using a cleavage plane (hexagonal crystal system-approximated {11-00} M plane, {1010} A plane, (0001) C plane) of a nitride semiconductor. Then, a eutectic crystal metal comprising Ti—Pt—Au is formed on a back, which is divided in a bar-like manner starting from a substrate side in a direction vertical to a stripe-like electrode to form a resonator plane and form a mirror on a monitor side according to the same manner as that in the example 1 and, thus, a semiconductor laser device of the present invention is obtained.

In the thus obtained semiconductor laser device, continuous oscillation at an oscillation wavelength 405 nm is confirmed at room temperature and at a threshold 2.0 kA/cm² and a high output 30 mW. The better beam having no ripple in FFP can be obtained.

Example 3

In the example 2, the same procedures as those in the example 2 are performed except that a substrate which is prepared as described below is used. First, a buffer layer comprising GaN is grown at a thickness of 200 Å at 510° C. using hydrogen as a carrier gas and ammonia and TMG as a raw material gas and using a sapphire substrate having a C plane as a main plane and an A plane as an orifla plane by the MOCVD method. Then, only TMG gas is stopped, a temperature is risen to 1050° C. and, when a temperature reaches 1050° C., a nitride semiconductor comprising undoped GaN is grown at a thickness of 2.5 µm using TMG, ammonia and a silane gas as a raw material gas. On the nitride semiconductor, a protective membrane comprising $SiO_2$ is grown at a thickness of 0.5 µm by the CVD method, a stripe-like mask is formed, and etching is performed to form a protective membrane comprising $SiO_2$ in which a stripe width is 14 µm and an interval between stripes is 6 µm. This stripe-like protective membrane is in a direction vertical to an A plane of sapphire.

Then, a temperature is set at 1050° C., and a first nitride semiconductor comprising GaN is grown at a thickness of 2 µm using TMG, ammonia, a silane gas and $Cp_2Mg$ as a raw material gas under the reduced pressure condition by the MOCVD method. Upon this, a first nitride semiconductor is grown starting at a part on which a $SiO_2$ protective membrane is not formed, and is grown transversely on this protective membrane. The growth is stopped before a first nitride semiconductor completely covers the $SiO_2$ protective membrane, and a distance between adjacent first nitride semiconductors is about 2 µm.

Then, the $SiO_2$ protective membrane is removed by 0.3 µm at a temperature of 120° C. using oxygen and $CF_4$ as an etching gas by isotropic etching which is dry etching.

Further, a second nitride semiconductor comprising GaN is grown at a thickness of 15 µm starting at a side and an upper plane of the transversely grown first nitride semiconductor at a normal pressure and a temperature of 1050° C. using TMG, ammonia, a silane gas and $Cp_2Mg$ as a raw material gas by the MOCVD method. A second nitride semiconductor may be grown under reduced pressure instead of normal pressure. On the thus obtained substrate, layers are grown until thick layer to p-side contact layer according to the same manner as that in the example 2 and, thereafter, each step is performed similarly to obtain a semiconductor laser device of the present invention. In the thus obtained semiconductor laser device, continuous oscillation at an oscillation wavelength 405 nm is confirmed at room temperature and at a threshold 2.0 kA/cm² and a high output 30 mW. In addition, in FFP, the better beam free of ripple is obtained.

Example 4

In the example 1, before exposure of an n-type layer, removal by etching is performed so that an active layer in the vicinity of a light emitting plane of a stripe-like convex part is left at a width of 2 µm, to form a shading layer forming plane and, further, a semiconductor layer comprising GaN is laminated on this removed part to grow to the same height as an upper plane of a p-contact layer. Thereafter, the same procedures as those in the example 1 are performed except that a stripe-like convex part is formed corresponding to the left active layer having a width of 2 µm and an n-type layer is exposed, to obtain a semiconductor laser device of the present invention. In the resulting semiconductor laser device, continuous oscillation at an oscillation wavelength 405 nm is confirmed at room temperature and at a threshold 2.0 kA/cm² and a high output 30 mW. In addition, in FFP, the better beam free of ripple and having a large light divergence angle is obtained.

Example 5

Figure 12:
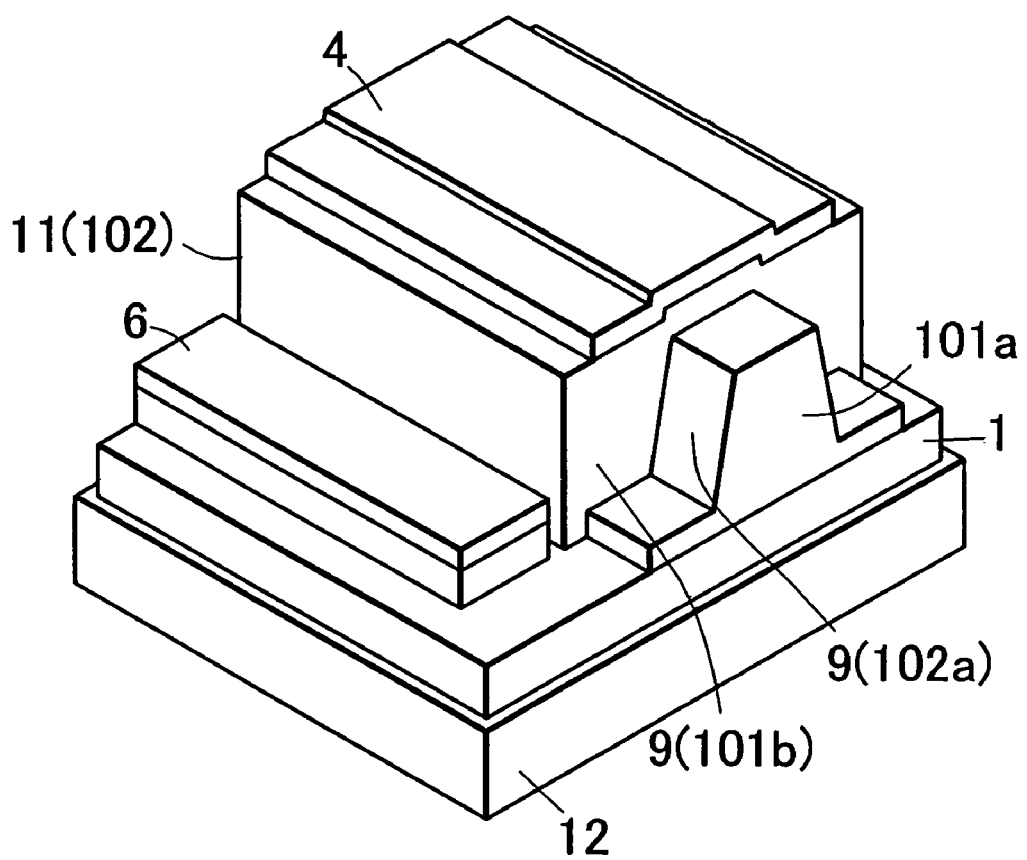
FIG. 12 is a perspective view of a semiconductor laser device of the example 4.

In the example 1, the same step for laminating a semiconductor layer is performed, and steps after exposure of an n-type layer are performed as follows: whereas an emitting plane is a cleavage plane in the example 1, an emitting plane is formed by etching in an example 5. That is, as shown in FIG. 12, an emitting plane side end is at least not a single plane, but is a shape in which a difference in level is set.

(Exposure of an n-Type Layer and Formation of a Resonator Plane)

After a laminate structure is formed, a wafer is removed from a reactor, a protective membrane comprising $SiO_2$ is formed on the surface of an uppermost layer p-type contact layer, and etching is performed with $SiCl_4$ gas using RIE (reactive ion etching), to expose an n-type contact layer on which an n-electrode is to be formed and, at the same time, expose a plane which is to be a resonator plane. That is, although a stripe-like convex part continues over a plurality of elements on a wafer until final cleavage in the example 1, a plane orthogonal with a stripe-like convex part is also etched upon exposure of an n-type layer, to form a resonator plane at the same time in the example 2. Upon this, a stripe-like convex part for two elements may continue.

(Formation of a Stripe-Like Convex Part and a Shading Layer Forming Plane)

Then, in order to form a stripe-like waveguide, a protective membrane comprising $SiO_2$ is formed at a thickness of 0.5 µm approximately on a front plane containing an uppermost layer p-type contact layer and a resonator plane exposed in the previous step using the CVD apparatus and, thereafter, a mask having a prescribed shape is formed on a protective membrane, a stripe-like protective membrane is formed by the photolithography technique using a $CF_4$ gas in the RIE apparatus, and a stripe-like convex part is formed above an active layer. A stripe-like convex part is formed orthogonal with a resonator plane.

The vicinity of a resonator plane which is an end part of this stripe-like convex part is further etched until an active layer is exposed, whereby, a second side and a non-resonator plane are formed. Upon this, they are formed in the vicinity of a resonator plane which is to be a light emitting side resonator plane, but may be formed on both of them.

(Light Non-Transmittable Layer)

A shading layer continuing to a light non-resonator plane, a second side and an exposed plane of an n-type layer is formed by sputtering while the aforementioned protective membrane is retained. A shading layer comprises Si, and a thickness thereof is 5000 Å. This shading layer may be formed after a first insulating membrane is formed in a later step. Alternatively, it may be formed after an ohmic electrode is formed, or after a second insulating membrane is formed.

(First Insulating Membrane)

A first insulating membrane comprising $ZrO_2$ is formed on the surface of a p-type layer while a $SiO_2$ mask is retained. After formation of a first insulating membrane, it is soaked in a buffered solution, $SiO_2$ formed on an upper plane of a stripe-like convex part is dissolved and removed, and $ZrO_2$ on a p-type contact layer is removed together with $SiO_2$ by a liftoff method. Thereby, a p-type layer is exposed on an upper plane of a stripe-like convex part, and a structure is obtained in which from a side of a convex part to a p-type layer upper plane are covered with $ZrO_2$.

(Ohmic Electrode)

Then, a p-side ohmic electrode is formed on a p-type contact layer. This ohmic electrode comprises Au—Ni, and is formed also over a first insulating membrane on a p-type contact layer. In addition, an ohmic electrode is formed also on an upper plane of an n-type contact layer. An n-side ohmic electrode comprises Ti—Al, is parallel with a stripe-like convex part, and is formed into a stripe having the same extent of a length. After formation of them, they are annealed at 600° C. in the atmosphere at a ratio of oxygen:nitrogen of 80:20 to alloy p-side and n-side ohmic electrodes, and ohmic electrodes having the better ohmic properties are obtained.

(Second Insulating Membrane)

Then, a resist is coated on a part of a p-side ohmic electrode and an n-side ohmic electrode on a stripe-like convex part and a second insulating membrane of a multi-layered membrane comprising $SiO_2$ and $ZrO_2$ is formed on almost the whole plane except for a light emitting side resonator plane. $SiO_2$ and $ZrO_2$ are alternately laminated at two pairs. And lifting off is conducted to expose a part of each electrode. A second insulating membrane is formed also on a shading layer. Further, since a second insulating membrane is formed so as to cover also a light reflecting side resonator plane, this second insulating membrane functions also as a light reflecting membrane (mirror). Like this, since at least one of resonator planes is formed by etching prior to an insulating membrane forming step, a light reflecting membrane (mirror) can be formed so as to go behind in the wafer state before division. Thereby, a second insulating may be formed so that a material for a light emitting side resonator plane and a material for a light reflecting side resonator plane are different or the second insulating membrane comprises reflecting membranes having a different thickness.

(Pad Electrode)

Figure 11:
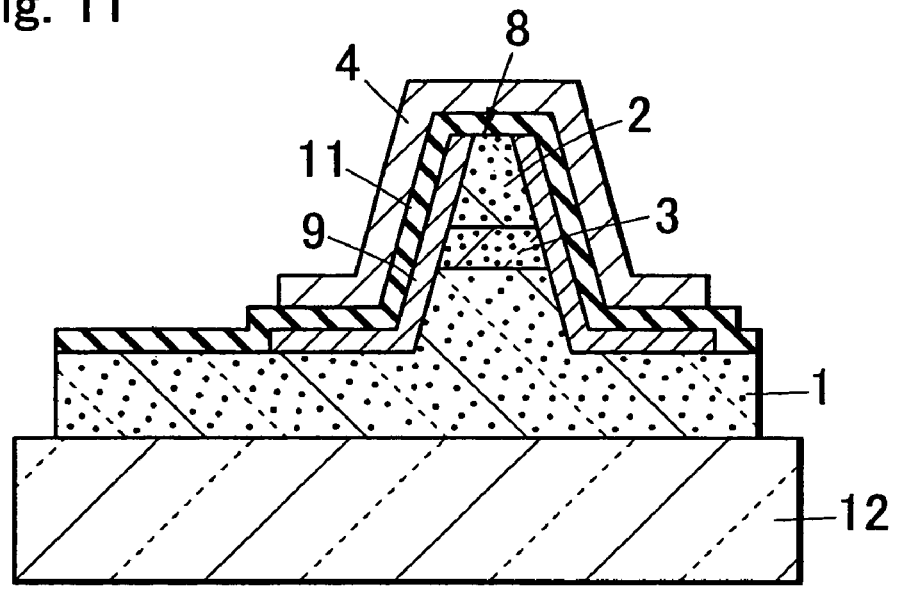
FIG. 11 is a cross-sectional view of a semiconductor laser device of an example 4 of the present invention.

Then, a p-side pad electrode and an n-side pad electrode are formed so as to cover the aforementioned second insulating membrane. This pad electrode comprises Ni—Ti—Au, and is contacted with a p-side ohmic electrode and an n-side ohmic electrode, respectively, via a second insulating membrane in a stripe-like manner. In addition, in the present example, as shown in FIG. 11, a p-side pad electrode 4 is formed also on a stripe-like convex upper plane held by second sides via a second insulating membrane.

(Division and Formation of a Light Emitting Side Protective Membrane)

The previously exposed n-type layer is further etched until a substrate is exposed. Thereby, only a substrate remains at a division position and, as shown in FIG. 12, a resonator plane and an n-type layer end are formed by etching. Division into a bar is performed starting at a substrate side, in a direction vertical to a stripe-like electrode. Then, $ZrO_2$ is formed on a light emitting side, and $SiO_2$ is formed so as to cover it, to obtain a protective membrane. Finally, a bar is cut in a direction parallel with a stripe-like electrode to obtain a semiconductor laser device of the present invention. In this example, as shown in FIG. 12, an end of a substrate is protruded more than a resonator plane. However, since the protruded length can be suppressed small to an extent that a laser beam shape does not have no influence, there is no problem.

In the thus obtained semiconductor laser device, continuous oscillation at an oscillation wavelength 405 nm is confirmed at room temperature and at a threshold 2.0 kA/cm² and a high output 30 mW and, in addition, in FFP, the better beam free of ripple is obtained.

Example 6

In the example 4, the same procedures as those in the example 4 are performed except that Ti is used as a shading layer and $SiO_2$ is used as an insulating membrane, to obtain a semiconductor laser device of the present invention. First, after $SiO_2$ is formed, Ti is formed, whereby, a shading layer is obtained which is excellent in the insulating property and which can effectively block stray light. A thickness of Ti is 4500 Å, and a thickness of $SiO_2$ is 1500 Å. In the resulting semiconductor laser device, continuous oscillation at an oscillation wavelength 405 nm is confirmed at room temperature and at a threshold 2.0 kA/cm² and a high output 30 mW and in addition, in FFP, the better beam free of ripple and having the large light divergence angle is obtained.

Example 7

According to the same manner as that in the example 6 except that a substrate having the same nitride semiconductor as that in the example 3 is used, a semiconductor laser device of the present invention is obtained. In the resulting semiconductor laser device, continuous oscillation at an oscillation wavelength 405 nm is confirmed at room temperature and at a threshold 2.0 kA/cm² and a high output 30 mW and in addition, FFP, the better beam free of ripple is obtained.

Example 8

A semiconductor laser device of an example 8 is prepared according to the same manner as that in the example 1 except that a light-transmitting membrane 9a is formed under the shading layer 9 in a semiconductor laser device of the example 1 as described below (FIG. 13A-FIG. 13C).

(Light-Transmitting Membrane 9a)

According to the same manner as that in the example 1, after formation of a stripe-like convex part and a shading membrane forming plane, a light-transmitting membrane continuing to a light non-resonator plane, a second side and an exposed plane of an n-type layer is formed by sputtering while a protective membrane used for the above formation is retained. A light-transmitting membrane comprises Rh oxide, and a thickness thereof is 560 Å.

(Shading Membrane)

Further, a shading membrane is formed on the aforementioned light-transmitting membrane. This shading membrane, like a light-transmitting membrane, comprises Rh oxide, and a thickness thereof is 1500 Å. This shading membrane can be formed by changing a constituent ratio of Rh and that of oxygen by reducing the vacuum degree, in the sputtering conditions for forming the aforementioned light-transmitting membrane. A layer having the different membraneous properties, particularly the light transmittance can be formed by changing only the vacuum degree while an apparatus is not changed. These light-transmitting membranes and shading membrane may be formed after a first insulating membrane is formed in a later step. Alternatively, they may be formed after formation of an ohmic electrode and formation of a second insulating membrane.

According to the same manner as that in the example 1 regarding from formation of a first insulating membrane to formation of a mirror, a semiconductor laser device is manufactured.

In the thus obtained semiconductor laser device, continuous oscillation at an oscillation wavelength 405 nm was confirmed at room temperature and at a threshold 2.0 kA/cm² and a high output 30 mW and, in addition, in FFP, the better beam free of ripple was obtained.

Example 9

In the semiconductor laser device in an example 9, after lamination is performed up to a p-side contact layer as in the laser device in the same manner as in the example 2, a plane for forming a shading membrane and a light-transmitting membrane, a light-transmitting membrane and a shading membrane are formed as follows.

(Formation of a Shading Membrane and Light-Transmitting Membrane Forming Plane)

After lamination up to a p-side contact layer and exposure of an n-type layer, a stripe-like convex part (ridge) having a width of 1.6 μm is formed. Then, a mask having a larger width of that of a ridge is provided in the vicinity of a resonating end on an emitting side for forming a light-transmitting membrane, and etching is performed until an n-type layer, whereby, a second side on a plane different from a ridge side is formed. Although a width of an active layer can be controlled by a mask having a larger width of that of this ridge, as in FIG. 13A, in order to remove only an active layer in the vicinity of an emitting side resonator plane, a mask is provided on an almost whole plane other than the vicinity of a resonator plane, and a mask having a larger width of that of a ridge is provided in the vicinity of a resonator plane, whereby, a structure can be obtained in which an active layer is removed in a limited part, that is, in the vicinity of a resonator plane. In addition, a mask having a width of that of a ridge may be provided over the whole ridge. Here, a resonator plane in which a width of an active layer of a resonator plane of an emitting plane is about 7 μm is formed by providing a mask at a width of about 7 μm so that a ridge is approximately at a center thereof and etching up to an n-type layer near an active layer. The thus formed etching planes are a non-resonator plane and a second side and, on both, a light-transmitting membrane and a shading membrane are provided.

(Light-Transmitting Membrane and Shading Membrane)

A light-transmitting membrane is formed on the thus formed second side and non-resonator plane, and an exposed plane of an n-type layer by sputtering. First, Rh oxide is formed at a thickness of 500 Å as a lower light-transmitting membrane, the same Rh oxide as that for a light-transmitting membrane is formed thereon at a thickness of 500 Å as an intermediate layer by changing the sputtering conditions, and the same Rh oxide is further formed thereon at a thickness of 1500 Å as an upper shading membrane by changing the sputtering conditions. In the sputtering conditions, a three-layered structure may be obtained by forming a lower light-transmitting membrane, an intermediate membrane and an upper shading membrane under the constant conditions, or a light-transmitting membrane and a shading membrane are formed under the constant conditions and only an intermediate membrane is formed by reducing the vacuum degree gradually. Accordingly, Rh oxides having the different constituent ratio can be easily formed. Although in the example 2, since a mask used for forming a light-transmitting membrane forming plane is used as it is, a light-transmitting membrane and a shading membrane are formed on a second side, a non-resonator plane, and an exposed plane of an n-type layer, there is no problem even when a mask is provided so as to extend until the surface of a p-type layer. By formation of a light-transmitting membrane and a shading membrane until a part of the surface (upper plane) of a p-type layer, leakage of the light toward an upper direction can be also prevented. In addition, although peeling easily occurs in some cases by formation of an end part of a shading membrane at an edge between an end and an upper plane, a shading membrane can be formed with the better tightness and the stable beam properties can be obtained by providing so as to also continue to an upper plane like this.

Thereafter, according to the same manner as that for the example 2, the semiconductor laser device of the example 9 is manufactured.

In the thus obtained semiconductor laser device of the example 9, continuous oscillation at an oscillation wavelength 405 is confirmed at room temperature and a threshold 2.0 kA/cm$^2$ and a high output 30 mW and, in addition, in FFP, the better beam free of repple can be obtained.

Example 10

According to the same manner as that for the example 9 except that a substrate prepared as in the example 3 is used, a semiconductor laser device is manufactured.

The thus manufactured laser device of an example 10 has the similar properties to those of the semiconductor laser device of the example 3.

Example 11

In the example 9, the same step of laminating semiconductor layers is performed, and steps after exposure of an n-type layer are performed as follows: In contrary to the example 9 in which an emitting plane is a cleavage plane, an emitting plane is formed by etching in the example 11. That is, an emitting plane side end shown in FIG. 12 is not a single plane, but a shape in which a difference in level is set. The case where an emitting plane is formed by such the etching is effective when a substrate which is difficult to be cleaved is used.

(Exposure of an n-Type Layer and Formation of a Resonator Plane)

After formation of a laminate structure, a wafer is removed from a reactor, a protective membrane comprising SiO$_2$ is formed on the surface of an uppermost p-type contact layer, which is etched with a SiCl$_4$ gas using RIE (reactive ion etching), and an n-type contact layer on which an n-electrode is to be formed and, at the same time, a plane which is to be a resonator plane are exposed. That is, in the example 9, a stripe-like convex part continues over a plurality of elements on a wafer until final cleavage, whereas in the example 4, a plane orthogonal with a stripe-like convex layer is also etched upon exposure of an n-type layer, and a resonator plane is formed at the same time. Upon this, a stripe-like convex part corresponding to two elements may be continuous.

(Formation of a Stripe-Like Convex Part and a Shading Layer Forming Plane)

Then, in order to form a stripe-like waveguide, after a protective membrane comprising SiO$_2$ is formed at a thickness of 0.5 μm on an almost whole front plane containing an uppermost p-type contact layer and a resonator plane exposed in the previous step using a CVD apparatus, a mask having a prescribed shape is provided on a protective membrane, a stripe-like protective membrane is formed by etching using a CHF$_3$ gas in RIE apparatus, and whereby, a stripe-like convex part is formed above an active layer. A stripe-like convex part is formed orthogonal with a resonator plane.

By further etching the vicinity of a resonator plane which is an end of this stripe-like convex part until an active layer is exposed, a second side and a non-resonator plane are formed. Upon this, they are formed in the vicinity of a resonator plane which is to be a light emitting side resonator plane, but they may be formed on both of them.

(Light-Transmitting Membrane and Shading Membrane)

A light-transmitting membrane and a shading membrane continuing to a light non-resonator plane, a second side and an exposed plane of an n-type layer are formed by sputtering while the aforementioned protective membrane is retained. As a light-transmitting membrane, Rh oxide is formed at a thickness of 600 Å, the same Rh oxide is formed thereon at a thickness of 600 Å by changing the sputtering conditions, and the same Rh oxide is further formed thereon at a thickness of 2000 Å by changing the sputtering conditions. Each layer is formed under the constant sputtering conditions, and the vacuum degree is reduced at an upper layer. Whereby, Rh oxides having the different constituent ratio can be easily formed. Those light-transmitting membrane and shading membrane may be formed after a first insulating membrane is formed in a post-step. Further, they may be formed after an ohmic electrode is formed, or after a second insulating membrane is formed.

(First Insulating Membrane)

A first insulating membrane comprising ZrO$_2$ is formed on the surface of a p-type layer while the SiO$_2$ mask is retained. The formed first insulating membrane is soaked in a buffered solution to dissolve and remove SiO$_2$ formed on an upper plane of a stripe-like convex part, and ZrO$_2$ on a p-type contact layer is removed together with SiO$_2$ by a liftoff method. Whereby, a p-type layer is exposed on an upper plane of a stripe-like convex part, leading to a structure in which from a side of a convex part to an upper plane of a p-type layer are covered with ZrO$_2$.

(Ohmic Electrode)

Then, a p-side ohmic electrode is formed on a p-type contact layer. This ohmic electrode comprises Au—Ni, and is formed also over a first insulating membrane on a p-type contact layer. In addition, an ohmic electrode is formed also on an upper plane of an n-type contact layer. An n-side ohmic electrode comprises Ti—Al, is parallel with a stripe-like convex part, and is formed into stripes having an equivalent extent of a length. After formation of them, p-side and n-side ohmic electrodes are alloyed by annealing at 600° C. in the atmosphere at a ratio of oxygen:nitrogen of 80:20, and an ohmic electrode having the better ohmic properties is obtained.

(Second Insulating Membrane)

Then, a second insulating membrane of a multi-layered membrane comprising SiO$_2$ and TiO$_2$ is formed on an almost whole plane except for a light emitting side resonator plane. SiO$_2$ and TiO$_2$ are alternately laminated at two pairs. A resist is coated on a part 6f a p-side ohmic electrode and an n-side ohmic electrode on a stripe-like convex part, which is dry-etched to expose a part of each electrode. A second insulating membrane is formed also on an upper plane of a shading layer. Since a second insulating membrane is further formed so as to cover a light reflecting side resonator plane, this second insulating membrane functions also as a light reflecting membrane (mirror). Like this, since at least one resonator plane is formed by etching prior to an insulating membrane forming step, a second insulating membrane can be formed so as to go behind in the wafer state before division of a light reflecting membrane (mirror). Thereby, a second insulating membrane may be formed of a material for a light emitting side resonator plane and a material for a light reflecting side resonator plane may be different, or an anti-reflection membrane comprising materials having a different thickness.

(Pad Electrode)

Then, a p-side pad electrode and an n-side pad electrode are formed so as to cover the aforementioned second insulating membrane. This pad electrode comprises Ni—Ti—Au, and is contacted with a p-side ohmic electrode and an n-side ohmic electrode, respectively, via a second insulating membrane. In addition, a pad electrode is formed also on an upper plane of a stripe-like convex part held by second sides.

(Division and Formation of a Light Emitting Side Mirror)

The previously exposed n-type layer is further etched until a substrate is exposed. Therefore, only a substrate is left at a division position, and a resonator plane and an n-type layer end are formed by etching, which is divided into a bar starting at a substrate side in a direction vertical to a stripe-like electrode. Then, $SiO_2$ is formed on a light emitting side resonator plane, and $ZrO_2$ is formed so as to cover it to obtain a mirror. Finally, a bar is cut in a direction parallel with a stripe-like electrode to obtain a semiconductor laser device of the present invention.

In the thus obtained semiconductor laser device of the example 11, continuous oscillation at an oscillation wavelength 405 nm is confirmed at room temperature and at a threshold 2.0 kA/cm$^2$ and a high output 30 mW and, in addition, in FFP, the better beam free of ripple is obtained.

Example 12

In the semiconductor laser device of an example 12, according to the same manner as that in the example 1, a buffer layer and a ground layer are grown on a substrate, and an n-type contact layer comprising AlGaN doped with Si at $1\times10^{18}$/cm$^3$ is grown on the ground layer (nitride semiconductor substrate) at a thickness of 4.5 μm at 1050° C. using TMG, TMA and anmmonia, and a silane gas as an impurity gas.

Then, according to the same manner as that in the example 1, a crack preventing layer, an n-type cladding layer, an n-light guiding layer, an active layer, a p-type cap layer, a p-type light guiding layer, a p-type cladding layer and a p-type contact layer are grown on the n-type contact layer comprising AlGaN. Further, according to the same manner as that in the example 1, an n-type layer is exposed, a resonator plane is formed, and a convex part is formed as described below.

(Formation of a Stripe-Like Convex Part)

In the present the example 12, in order to form a stripe-like waveguide region, after a protective membrane comprising Si oxide (mainly $SiO_2$) is formed on an almost whole plane of an uppermost p-type contact layer at a thickness of 0.5 μm by the CVD apparatus, a mask having a prescribed shape is provided on a protective membrane, and a stripe-like protective membrane is formed by the photolithography technique using a $CF_4$ gas in the RIE apparatus, whereby, a stripe-like convex part is formed above an active layer. Alternatively, in the RIE apparatus, $CHF_3$ can be used instead of a $CF_4$ gas.

After formation of a convex part, according to the same manner as that in the example 1, a first insulating membrane and p-side and n-side ohmic electrodes are formed, and the following steps are performed to manufacture a semiconductor laser device.

(Second Insulating Membrane)

Then, a resist is coated on a part of a p-side ohmic electrode and an n-side ohmic electrode on a stripe-like convex part, a second insulating membrane comprising Si oxide (mainly $SiO_2$) is formed on a whole plane except for a division position, and liftoff is performed to expose a part of a p-side ohmic electrode and an n-side ohmic electrode.

(Pad Electrode)

Then, a p-side pad electrode and an n-side pad electrode are formed, respectively, so as to contact with a p-side ohmic electrode and an n-side ohmic electrode via an opening of the aforementioned second insulating membrane. Electrodes comprise Ni—Ti—Au. This pad electrode is contacted with an exposed ohmic electrode in a stripe-like manner.

(Exposure of a Substrate)

Then, after $SiO_2$ is formed on a front plane of a wafer, a resist membrane is formed thereon except for an exposed plane of an n-type contact layer, and etched until a substrate is exposed. Since a resist membrane is formed also on a side such as a resonator plane, after etching, an end is formed which includes two steps of a side such as the previously formed resonator plane (including a p-type layer, an active layer, and a part of an n-type layer), and an n-type layer between a resonator plane and a substrate.

(Second Protective Membrane)

Then, a second protective membrane is formed. A light emitting side resonator plane is masked with a resist membrane and the like, and a second protective membrane comprising $SiO_2$ (1350 Å)/Ti (2250 Å) is formed by sputtering. The transmittance of this second protective membrane is about 0.01% and, thus, the shading effect of approximately 100% is obtained.

(Bar-Like Division)

After formation of a p-side ohmic electrode and an n-side ohmic electrode as described above, a substrate is abraded to a total thickness including a substrate of 200 μm, and a back metal comprising Ti—Pt—Au is formed on a back, which is divided into a bar starting at a substrate side in a direction vertical to a stripe-like electrode. Upon this, when a scribe is provided, corresponding to a division position from a backside of a substrate before bar-like division, the division becomes easy in a later step.

(Light Reflection Side Mirror and First Protective Membrane)

In the semiconductor thus divided into a bar, a light emitting side resonator plane is arrayed on one side of a bar, and a light reflecting side resonator plane is arrayed on an opposite side. An angle of a few such the bars is changed so that a light emitting side resonator plane and a light reflecting side resonator plane face the same direction. Then, film formation jigs are arrayed between respective bars via a spacer without a gap. By provision of a spacer like this, a protective membrane is not formed on an electrode and the like formed in a device. First, $ZrO_2$ and 6 pairs of ($SiO_2$/$ZrO_2$) are formed on a light reflecting side resonator plane to obtain a mirror. Then, on a light emitting side, a membrane of $Nb_2O_5$ as a first protective membrane is formed at a thickness of 400 Å. This $Nb_2O_5$ is provided over a light emitting plane of a resonator plane and a second protective membrane provided in the vicinity of the light emitting plane.

Additionally, the light transmittance of the second protective membrane comprising $Nb_2O_5$ is about 82%.

Finally, a bar is cut in a direction parallel with a stripe-like convex part to obtain a semiconductor laser device of the present invention.

In the thus obtained semiconductor laser device, continuous oscillation at an oscillation wavelength 405 nm was confirmed at room temperature and at a threshold 2.0 kA/cm² and a high output 30 mW and, in addition, in FFP, the better beam free of ripple was obtained.

Example 13

Figure 17:
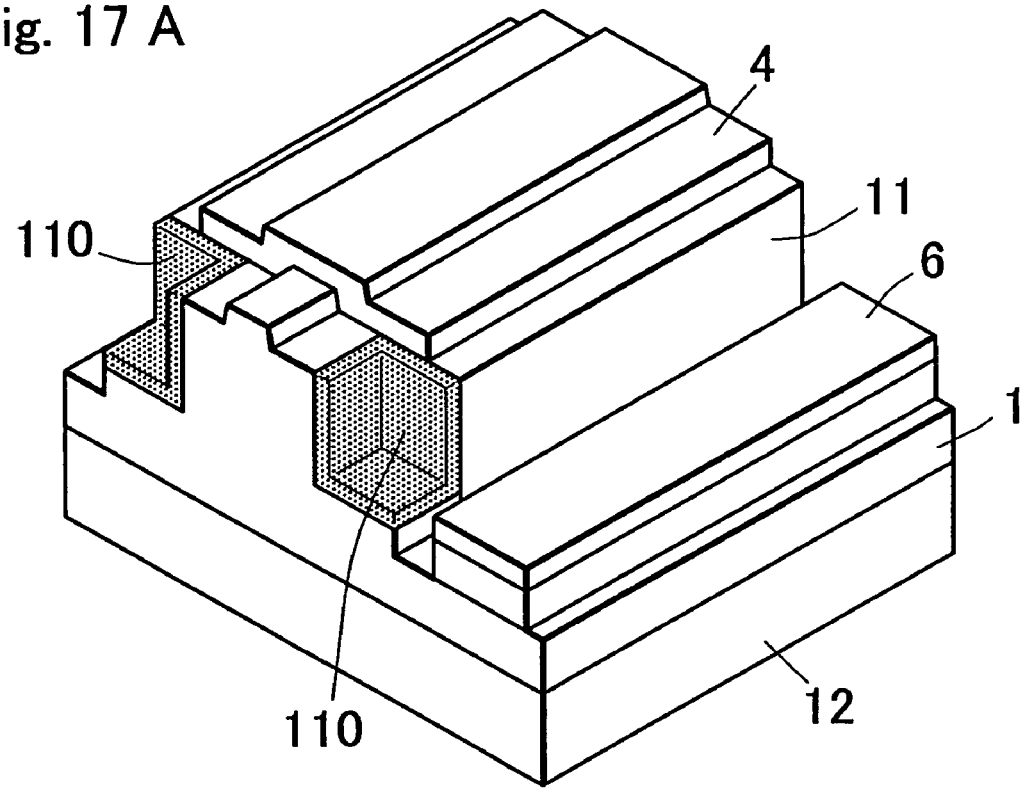
FIG. 17A, FIG. 17B, FIG. 18A, FIG. 18B are perspective views of a semiconductor laser device in an embodiment 4 of the present invention.
Figure 17:
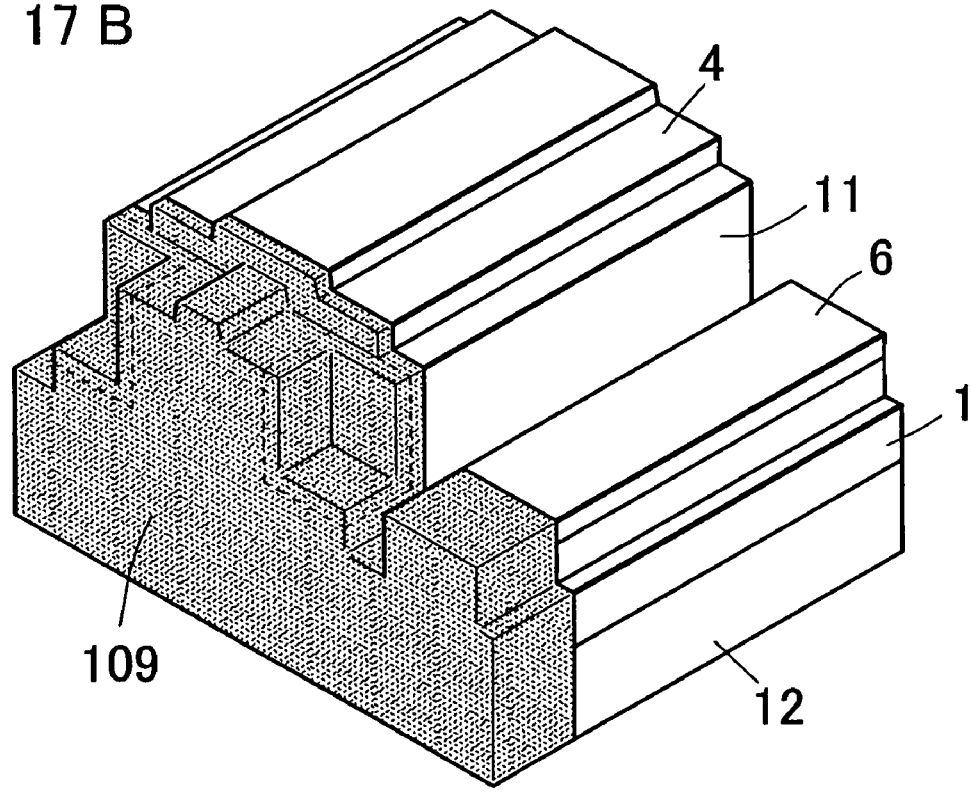

In an example 13, using a nitride semiconductor substrate composed of GaN formed on sapphire as a substrate (manufactured according to the same manner as that in the example 2), a semiconductor laser device shown in FIG. 17 is manufactured.

Specifically, the semiconductor laser device is manufactured as described below.

(Buffer Layer)

First, a buffer layer composed of undoped AlGaN having an Al crystal mixing ratio of 0.01 is formed on a ground layer of a nitride semiconductor substrate. This buffer layer can be omitted. However, when a substrate using transverse growth is GaN, or when a ground layer formed by transverse growth is GaN, a pit can be reduced by using a buffer layer composed of a nitride semiconductor having a smaller thermal expansion coefficient, that is, $Al_aGa_{1-a}N$ ($0<a\leq 1$) or the like and, therefore, it is preferable to form a buffer layer. That is, like a ground layer, when another nitride semiconductor is grown on a nitride semiconductor layer which is formed accompanied with transverse growth, a pit easily occurs, but this buffer layer has the effect of preventing occurrence of a pit.

It is preferable that an Al crystal mixing ratio of a buffer layer is $0<a<0.3$, whereby, a buffer layer having the better crystallinity can be formed. In addition, this buffer layer may be formed as a layer also having the function as an n-side contact layer, or after formation of a buffer layer, an n-side contact layer having the same composition as that of the aforementioned buffer layer may be formed to impart the buffer effect to the n-side contact layer. That is, this buffer layer can reduce a pit to improve the device properties by provision between a transversely grown layer (GaN substrate) and a nitride semiconductor layer constituting a device structure, or an active layer in a device structure and a transversely grown layer (GaN substrate), more preferably provision of at least one layer on a substrate side in a device structure, or between a lower cladding layer and a transversely grown layer (GaN substrate). In addition, a buffer layer also having the function as an n-side contact layer is intended, it is preferable that an Al crystal mixing ratio a is 0.1 or less so that the better ohmic contact with an electrode is obtained. A buffer layer to be formed on this ground layer may be grown at a low temperature of not lower than 300° C. and not higher than 900° C. like a buffer layer to be provided on the aforementioned heterogeneous substrate, but when it is preferably single crystal-grown at a temperature of not lower than 800° C. and not higher than 1200° C., there is a tendency that the aforementioned pit reducing effect can be effectively obtained. Further, this buffer layer may be doped with an n-type or p-type impurity, or may be undoped, but in order to obtain the better crystallinity, the buffer layer is preferably formed undoped. Still further, when two or more layers of buffer layer are provided, they may be provided by changing the n-type or p-type impurity concentration and an Al crystal mixing ratio.

(N-Type Contact Layer)

An n-side contact layer composed of $Al_{0.01}Ga_{0.99}N$ doped with Si at $3\times10^{18}/cm^3$ is formed on a buffer layer at a thickness of 4 μm.

(Crack Preventing Layer)

A crack preventing layer composed of $In_{0.06}Ga_{0.94}N$ is formed on an n-side contact layer at a thickness of 0.15 μm.

(N-Side Cladding Layer)

An n-side cladding layer of a superlattice structure having a total thickness of 1.2 μm is formed on a crack preventing layer.

Specifically, an n-side cladding layer is formed by alternately laminating an undoped $Al_{0.05}Ga_{0.95}N$ layer having a thickness of 25 Å and a GaN layer doped with Si at $1\times10^{19}/cm^3$ having a thickness of 25 Å.

(N-Side Light Guiding Layer)

An n-side light guiding layer composed of undoped GaN having a thickness of 0.15 μm is formed on an n-side cladding layer.

(Active Layer)

An active layer of a multiple quantum well structure having a total thickness of 550 Å is formed on an n-side light guiding layer.

Specifically, an active layer is formed by laminating a barrier layer (B) composed of Si-doped $In_{0.05}Ga_{0.95}N$ doped with Si at $5\times10^{18}/cm^3$ having a thickness of 140 Å and a well layer (W) composed of undoped $In_{0.13}Ga_{0.87}N$ having a thickness of 50 Å in an order of (B)—(W)—(B)—(W)—(B).

(P-Side Electron Confining Layer)

A p-side electron confining layer composed of p-type $Al_{0.3}Ga_{0.7}N$ doped with Mg at $1\times10^{20}/cm^3$ having a thickness of 100 Å is formed on an active layer.

(P-Side Light Guiding Layer)

A p-side light guiding layer composed of p-type GaN doped with Mg at $1\times10^{18}/cm^3$ having a thickness of 0.15 μm is formed on a p-side electron confining layer.

(P-Side Cladding Layer)

A p-side cladding layer of a superlattice structure having a total thickness of 0.45 μm is formed on a p-side light guiding layer.

Specifically, a p-side cladding layer is formed by alternately laminating undoped $Al_{0.05}Ga_{0.95}N$ having a thickness of 25 Å and p-type GaN doped with Mg at $1\times10^{20}/cm^3$ having a thickness of 25 Å.

(P-Side Contact Layer)

A p-side contact layer composed of p-type GaN doped with Mg at $2\times10^{20}/cm^3$ having a thickness of 150 Å is formed on a p-side cladding layer.

(Exposure of an n-Type Layer and Formation of a Stripe-Like Convex Part)

After a device structure from an n-side contact layer to a p-side contact layer is formed as described above, according to the same manner as that in the example 12, after an n-type contact layer is exposed, a stripe-like convex part (ridge) is formed by etching.

(Formation of a Second Side and a Non-Resonator Plane)

Then, a second side on which a second protective membrane is to be formed and a non-resonator plane are formed. A second side and a non-resonator plane are formed by forming a mask on parts other than an end in the vicinity of a resonator plane and performing etching. Here, since a second side is formed so as to be nearer an end of a device than a ridge side, as shown in FIG. 17, a width of an active layer is larger than a width of a ridge in an end in a direction vertical to a ridge.

(Second Protective Membrane)

Then, a second protective membrane is formed on the second side and the non-resonator plane formed as described above. A multi-layered membrane composed of $SiO_2$/Ti as a second protective membrane is formed by sputtering using the aforementioned mask as it is.

(First Insulating Membrane to Second Insulating Membrane)

Then, as in the example 12, a first insulating membrane composed of $ZrO_2$, an ohmic electrode, and a second insulating membrane composed of $SiO_2/TiO_2$ are formed.

(Pad Electrode)

Then, RhO—Pt—Au is formed as a p-side pad electrode and Ni—Ti—Au is formed as an n-side pad electrode.

(Peeling of a Heterogeneous Substrate)

Subsequently, only a thick layer is left (conversion into single body) by removing a sapphire substrate, a low temperature-grown buffer layer, a ground layer and a part of a thick layer to adjust a thickness of a GaN substrate to 80 μm. Here, although as a thick layer according to HVPE, other nitride semiconductors may be used besides GaN, in the present invention, it is preferable to use GaN or AlN which has the better crystallinity and on which a thick nitride semiconductor can be easily grown. In addition, in removal of a heterogeneous substrate and the like, a part of a thick layer may be removed prior to formation of the aforementioned device structure, or removal may be performed at any stage after formation of a waveguide, or after formation of an electrode. In addition, by removing a heterogeneous substrate and the like prior to cutting of a wafer into a bar and a chip, cutting and cleavage can be performed using a cleavage plane of a nitride semiconductor (hexagonal crystal system-approximated {11-00} M plane, {1010} A plane, (0001) C plane) upon cutting into a chip.

(Formation of a Resonator Plane)

Then, a eutectic crystal metal composed of Ti—Pt—Au is formed on a back, which is divided into a bar-like starting at a substrate side in a direction vertical to a stripe-like electrode to form a resonator plane according to the same manner as that in the example 1.

(Light Reflecting Side Mirror and First Protective Membrane)

Then, a mirror composed of six pairs of $ZrO_2$ and $(SiO_2/ZrO_2)$ is formed on a light reflecting side resonator plane, and a membrane of $Nb_2O_5$ as a first protective membrane is formed on a light emitting side. This $Nb_2O_5$ is provided on a light emitting side resonator plane and on a second protective membrane provided in the vicinity of a resonator plane. Further, the bar is cleaved on an A plane vertical to an M plane cleaved between respective devices parallel with a resonator direction to obtain a laser chip.

The thus obtained laser device has a threshold current density of 2.5 $kA/cm^2$, a threshold voltage of 4.5V, an oscillation wavelength of 405 nm and an aspect ratio of an emitted laser beam of 1.5 at room temperature. In addition, a high output laser device of 30 mW continuous oscillation having a long life of 1000 hours or longer can be obtained. In addition, the present laser device can oscillate continuously at an output region of 5 mW to 80 mW and, in the output region, has the beam properties suitable as a light source for an optical disc system.

Example 14

Figure 18:
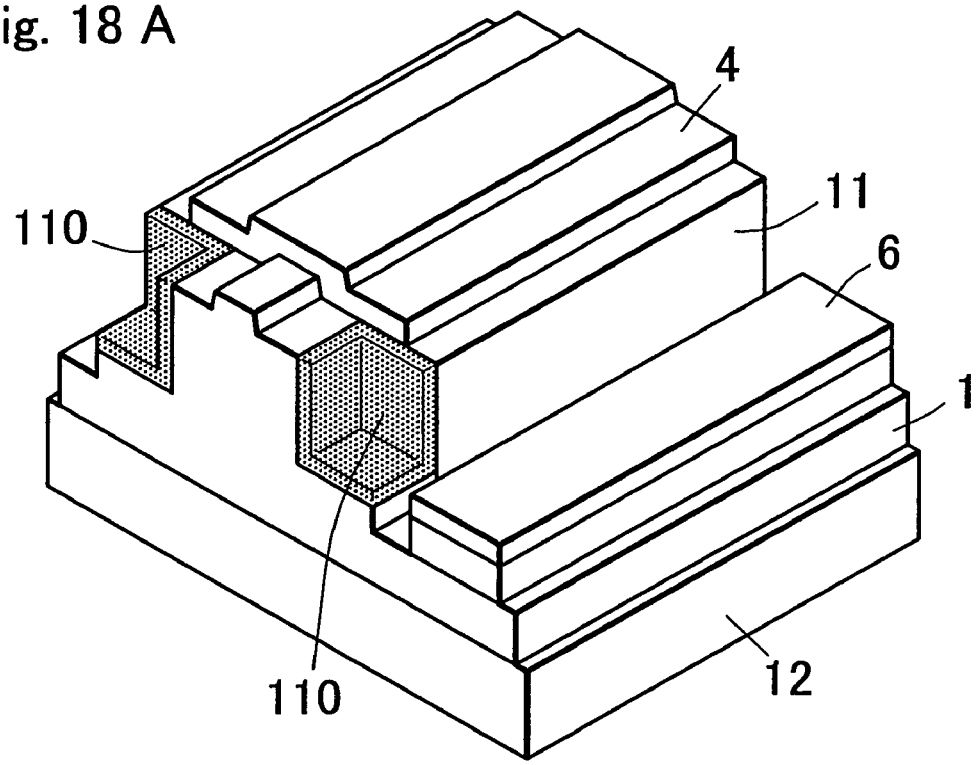
Figure 18:
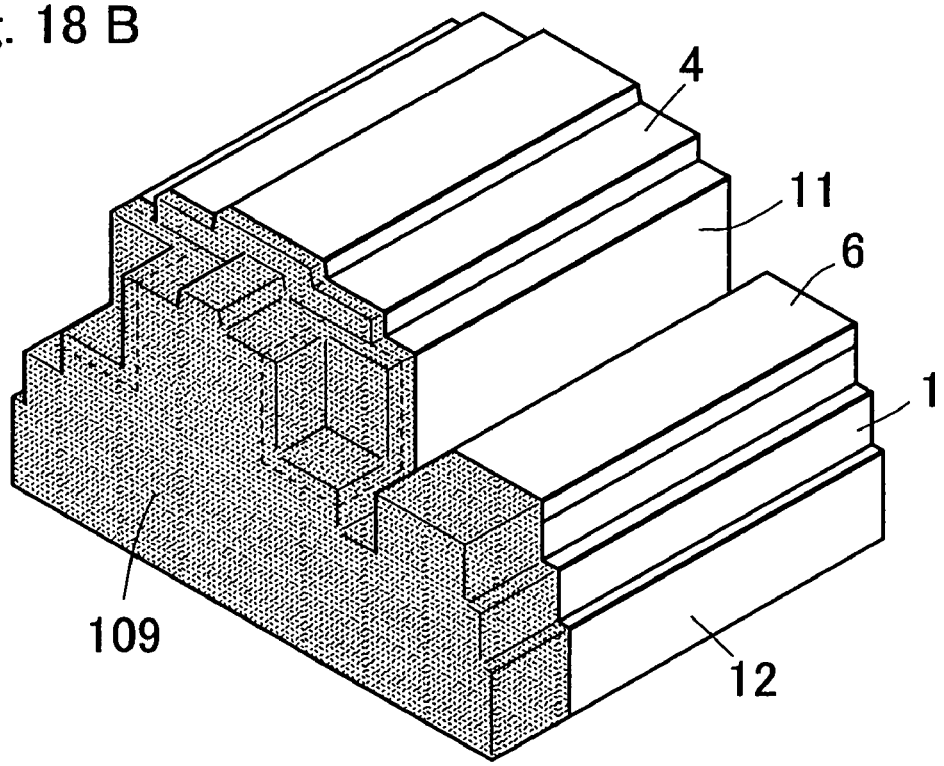

According to the same manner as that in the example 12 except that steps are changed as described below, a semiconductor emitting device as shown in FIG. 18 is obtained.

[Exposure of an n-Type Layer]

An n-type layer is exposed as in the example 12 and, upon this, a resonator plane is made not to be formed.

(Formation of a Stripe-Like Convex Part, and Formation of a Non-Resonator Plane and a Second Side)

After formation of a stripe-like convex part, a side of a stripe-like convex part in the vicinity of a device division plane is further etched until an active layer using the same mask to remove a corner part of a device as shown in FIG. 5, whereby, a non-resonator plane and a second side are formed. On this plane, a second protective membrane is formed. $ZrO_2$/RhO is used as a second protective membrane.

(Division and Formation of a Resonator Plane)

Prior to formation of an emitting side mirror, a sapphire substrate of a wafer is abraded to 70 μm, which is cleaved in a bar-like starting at a substrate side in a direction vertical to a stripe-like electrode, to obtain a cleavage plane (11-00 plane, plane corresponding to a side of a hexagonal pillar crystal=M plane), whereby, a resonator plane is formed. Then, a first protective membrane is provided on a resonator plane on an emitting side of a resonator plane. $Nb_2O_5$ is used as a first protective membrane.

In the thus obtained semiconductor laser device, continuous oscillation at an oscillation wavelength 405 nm is confirmed at room temperature and at a threshold 2.0 $kA/cm^2$ and a high output 30 mW, in addition, the better beam having a wider divergence angle than that in the example and free of ripple in FFP is obtained.

INDUSTRIAL APPLICABILITY

As explained above, a semiconductor laser device having better far field pattern (FFP) is provided and it can be utilized in various equipment such as an electronic equipment such as DVD, a medical equipment, a processing equipment and a light source for an optical fiber communication.

The invention claimed is:

1. A semiconductor laser device comprising a laminate structure comprising
    a first conductive type semiconductor layer,
    an active layer and
    a second conductive type semiconductor layer different from the first conductive type laminated in this order;
    the laminate structure having
    a ridge,
    a waveguide region to guide a light in one direction,
    rectangular grooves formed on a resonator face having a light emitting side so as to sandwich the ridge, each of the rectangular grooves having a side comprising a non-resonator plane parallel to and set back from the resonator face, and
    shading layers on the sides of the rectangular grooves comprising the non-resonator planes parallel to and set back from the resonator face.

2. The semiconductor laser device according to claim 1, further comprising light transmittable membranes between the laminate structure and the shading layers.

3. The semiconductor laser device according to claim 2, wherein the light transmittable membranes are made of a same element as that of the shading layers.

4. The semiconductor laser device according to claim 1, wherein the shading layers are formed on a side near to the waveguide region successively from the non-resonator plane.

5. The semiconductor laser device according to claim 1, wherein the shading layers are made of a material selected from the group consisting of Ni, Cr, Ti, Cu, Fe, Zr, Hf, Nb, W, Rh, Ru, Mg, Al, Sc, Y, Mo, Ta, Co, Pd, Ag, Au, Pt and Ga, an alloy of two or more of Ni, Cr, Ti, Cu, Fe, Zr, Hf, Nb, W, Rh, Ru, Mg, Al, Sc, Y, Mo, Ta, Co, Pd, Ag, Au, Pt and Ga, a multi-layered membrane of Ni, Cr, Ti, Cu, Fe, Zr, Hf, Nb, W, Rh, Ru, Mg, Al, Sc, Y, Mo, Ta, Co, Pd, Ag, Au, Pt and Ga, oxides of Ni, Cr, Ti, Cu, Fe, Zr, Hf, Nb, W, Rh, Ru, Mg, Al, Sc, Y, Mo, Ta, Co, Pd, Ag, Au, Pt and Ga and nitrides of Ni, Cr, Ti, Cu, Fe, Zr, Hf, Nb, W, Rh, Ru, Mg, Al, Sc, Y, Mo, Ta, Co, Pd, Ag, Au, Pt and Ga.

6. The semiconductor laser device according to claim 1, wherein the shading layers are made of a material selected from the group consisting of Ni, Cr, Ti, Ga, Rh and RhO.

7. The semiconductor laser device according to claim 1, further comprising a light transmittable membrane on the resonator face, the light transmittable membrane being made of a material selected from the group consisting of oxides of Si, Mg, Al, Hf, Nb, Zr, Sc, Ta, Ga, Zn, Y, B and Ti, nitrides of Si, Mg, Al, Hf, Nb, Zr, Sc, Ta, Ga, Zn, Y, B and Ti, fluorides of Si, Mg, Al, Hf, Nb, Zr, Sc, Ta, Ga, Zn, Y, B and Ti, and a multi-layered membrane composed of one of Si, Mg, Al, Hf, Nb, Zr, Sc, Ta, Ga, Zn, Y, B and Ti.

8. The semiconductor laser device according to claim 6, further comprising a light transmittable membrane on the resonator face, the light transmittable membrane made of a material selected from the group consisting of oxides of Si, Mg, Al, Hf, Nb, Zr, Sc, Ta, Ga, Zn, Y, B and Ti, nitrides of Si, Mg, Al, Hf, Nb, Zr, Sc, Ta, Ga, Zn, Y, B and Ti, fluorides of Si, Mg, Al, Hf, Nb, Zr, Sc, Ta, Ga, Zn, Y, B and Ti, and a multi-layered membrane composed of one of Si, Mg, Al, Hf, Nb, Zr, Sc, Ta, Ga, Zn, Y, B and Ti.

9. The semiconductor laser device according to claim 4, wherein the side is formed so that a width of the active layer is larger than that of the ridge.

* * * * *